United States Patent
Ulloa et al.

(10) Patent No.: US 12,081,332 B2
(45) Date of Patent: Sep. 3, 2024

(54) METHOD AND SYSTEM FOR REDUCING DATA STORED IN CAPTURE BUFFER

(71) Applicant: Keysight Technologies, Inc., Santa Rosa, CA (US)

(72) Inventors: Daniel Alejandro Garcia Ulloa, Atlanta, GA (US); Andrew Robert Lehane, Kinross (GB)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 18/237,818

(22) Filed: Aug. 24, 2023

(65) Prior Publication Data

US 2023/0421292 A1 Dec. 28, 2023

Related U.S. Application Data

(63) Continuation of application No. 18/090,311, filed on Dec. 28, 2022.

(Continued)

(51) Int. Cl.
*H04L 1/00* (2006.01)
*H03M 7/30* (2006.01)
*H04L 1/1607* (2023.01)

(52) U.S. Cl.
CPC ............ *H04L 1/0061* (2013.01); *H03M 7/55* (2013.01); *H04L 1/1607* (2013.01); *H03M 7/6023* (2013.01)

(58) Field of Classification Search
CPC ..... H04L 1/005; H04L 1/0041; H04L 1/0043; H04L 1/0045; H04L 1/1607;
(Continued)

(56) References Cited

U.S. PATENT DOCUMENTS 5,654,703 A * 8/1997 Clark, II ................ H04N 19/60
375/E7.231
7,369,065 B2 5/2008 Mitchell et al.
(Continued)

OTHER PUBLICATIONS

Express® Base Specification Revision 3.0 (Nov. 10, 2010) ("PCIe Gen3 protocol"), pp. 1-860.
(Continued)

*Primary Examiner* — Shelly A Chase

(57) ABSTRACT

A method is provided for reducing data stored in a capture buffer of an interposer circuit during communication of the data over a data link according to a high-speed, layered packet-based protocol for analysis. The method includes performing data integrity checks of the data in real time, and omitting data integrity bits corresponding to the data integrity checks from transaction layer packets (TLPs) and data link layer packets (DLLPs) of the data when the data integrity checks indicate the data is correct; performing acknowledge and negative acknowledge (ACK/NACK) matching in real time to confirm successful delivery of the TLPs of the data using ACK/NACK packets, where the ACK/NACK packets are omitted from being stored in the capture buffer; removing and/or reducing fields in real time from the TLPs and/or the DLLPs of the data; and compressing data payloads of the TLPs and/or the DLLPs of the data in parallel.

20 Claims, 27 Drawing Sheets

Related U.S. Application Data

(60) Provisional application No. 63/418,761, filed on Oct. 24, 2022, provisional application No. 63/399,118, filed on Aug. 18, 2022, provisional application No. 63/336,009, filed on Apr. 28, 2022, provisional application No. 63/431,100, filed on Dec. 8, 2022.

(58) Field of Classification Search
CPC .............. H04L 1/0061; H03M 7/3084; H03M 13/1105; H03M 13/1137
See application file for complete search history.

(56) References Cited

U.S. PATENT DOCUMENTS

| | | | |
|---|---|---|---|
| 7,916,750 | B2 | 3/2011 | Das Sharma et al. |
| 8,665,124 | B2 | 3/2014 | Pardo et al. |
| 8,725,933 | B2 | 5/2014 | Khan |
| 9,514,085 | B2 | 12/2016 | Pardo et al. |
| 9,710,166 | B2 | 7/2017 | Huang et al. |
| 10,360,183 | B2 | 7/2019 | Kataoka et al. |
| 10,534,839 | B2 | 1/2020 | Hsieh et al. |
| 2001/0054131 | A1* | 12/2001 | Alvarez, II ............. H03M 7/40 711/170 |
| 2002/0057213 | A1 | 5/2002 | Heath |
| 2004/0119615 | A1* | 6/2004 | Jones ................. H03M 7/3084 341/50 |
| 2014/0244604 | A1 | 8/2014 | Oltean et al. |
| 2017/0357609 | A1 | 12/2017 | Long et al. |
| 2018/0095923 | A1 | 4/2018 | Iyer et al. |
| 2018/0123936 | A1 | 5/2018 | Anderson et al. |
| 2020/0177348 | A1 | 6/2020 | Agarwal et al. |
| 2023/0229630 | A1 | 7/2023 | Soha et al. |

OTHER PUBLICATIONS

PCI Express® Base Specification Revision 4.0, Version 1.0 (Sep. 27, 2017) ("PCIe Gen4 protocol") (last modified Oct. 5, 2017), pp. 1-1293.

PCI Express® Base Specification Revision 5.0, Version 1.0 (May 22, 2019) (PCIe Gen5 protocol) (last modified May 28, 2019), pp. 1-1299.

PCI Express® Base Specification Revision 6.0, Version 1.0 (Dec. 16, 2021) ("PCIe Gen6 protocol") (last modified Jan. 11, 2022), pp. Jan. 1923.

Bharat Sukhwani et al., "High-Throughput, Lossless Data Compression on FPGAs," IEEE International Symposium on Field-Programmable Custom Computing Machines, 2011, pp. 113-116.

Youngjo Park et al., "zFTL: Power-Efficient Data Compression Support for NAND Flash-based Consumer Electronics Devices," IEEE Transactions on Consumer Electronics, vol. 57, No. 3, Aug. 2011, pp. 1148-1156.

Tinku Acharya et al., "Enhancing LZW Coding Using a Variable-Length Binary Encoding," Institute for Systems Research and Institute for Advanced Computer Studies University of Maryland, Jan. 1995, pp. 1-14.

Hu Yuanfu et al., "The Methods of Improving the compression Ratio of LZ77 Family Data Compression Algorithms," Proceedings of Third International Conference on Signal Processing (ICSP'96), vol. 1, IEEE 1996, pp. 698-701.

Md. Rubaiyat Hasan, "Data Compression using Huffman based LZW Encoding Technique," International Journal of Scientific & Engineering Research, vol. 2, Issue 11, Nov. 2011, pp. 1-7.

Gopal Lakhani, "Reducing coding redundancy in LZW," Information Sciences 176 (2006), pp. 1417-1434.

Ian H. Witten, et al., "Arithmetic Coding for Data Compression," Communications of the ACM, Jun. 1987, vol. 30, No. 6, pp. 520-540.

Notice of Allowance dated Mar. 13, 2024, for U.S. Appl. No. 18/090,311, 26 pgs.

Non-Final Office Action dated May 29, 2024, for U.S. Appl. No. 18/367,905, 30 pgs.

Notice of Allowance dated dated Jun. 13, 2024, for U.S. Appl. No. 18/374,900, 16 pgs.

* cited by examiner

| DESCRIPTION | LANE | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| TLP BYTES [0...223] | 0 | 1 | 2 | 3 | 4 | 5 | 6 | 7 | 8 | 9 | 10 | 11 | 12 | 13 | 14 | 15 |
| | 16 | 17 | 18 | 19 | 20 | 21 | 22 | 23 | 24 | 25 | 26 | 27 | 28 | 29 | 30 | 31 |
| | 32 | 33 | 34 | 35 | 36 | 37 | 38 | 39 | 40 | 41 | 42 | 43 | 44 | 45 | 46 | 47 |
| | 48 | 49 | 50 | 51 | 52 | 53 | 54 | 55 | 56 | 57 | 58 | 59 | 60 | 61 | 62 | 63 |
| | 64 | 65 | 66 | 67 | 68 | 69 | 70 | 71 | 72 | 73 | 74 | 75 | 76 | 77 | 78 | 79 |
| | 80 | 81 | 82 | 83 | 84 | 85 | 86 | 87 | 88 | 89 | 90 | 91 | 92 | 93 | 94 | 95 |
| | 96 | 97 | 98 | 99 | 100 | 101 | 102 | 103 | 104 | 105 | 106 | 107 | 108 | 109 | 110 | 111 |
| | 112 | 113 | 114 | 115 | 116 | 117 | 118 | 119 | 120 | 121 | 122 | 123 | 124 | 125 | 126 | 127 |
| | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 |
| | 160 | 161 | 162 | 163 | 164 | 165 | 166 | 167 | 168 | 169 | 170 | 171 | 172 | 173 | 174 | 175 |
| | 176 | 177 | 178 | 179 | 180 | 181 | 182 | 183 | 184 | 185 | 186 | 187 | 188 | 189 | 190 | 191 |
| | 192 | 193 | 194 | 195 | 196 | 197 | 198 | 199 | 200 | 201 | 202 | 203 | 204 | 205 | 206 | 207 |
| | 208 | 209 | 210 | 211 | 212 | 213 | 214 | 215 | 216 | 217 | 218 | 219 | 220 | 221 | 222 | 223 |
| TPP, DLP | 224 | 225 | 226 | 227 | 228 | 229 | 230 | 231 | 232 | 233 | 234 | 235 | DLP 0 | DLP 1 | DLP 2 | DLP 3 |
| DLP, CRC, ECC | DLP 4 | DLP 5 | CRC 0 | CRC 1 | CRC 2 | CRC 3 | CRC 4 | CRC 5 | CRC 6 | CRC 7 | ECC1 [0] | ECC2 [0] | ECC0 [0] | ECC1 [1] | ECC2 [1] | ECC0 [1] |

METHOD AND SYSTEM FOR REDUCING DATA STORED IN CAPTURE BUFFER

CROSS-REFERENCE TO RELATED APPLICATIONS

The present application is a continuation application of U.S. application Ser. No. 18/090,311, filed on Dec. 28, 2022, which claims priority under 35 U.S.C. § 119(e) to U.S. Provisional Application No. 63/336,009, filed on Apr. 28, 2022, U.S. Provisional Application No. 63/399,118, filed on Aug. 18, 2022, U.S. Provisional Application No. 63/418,761, filed on Oct. 24, 2022, and U.S. Provisional Application No. 63/431,100, filed on Dec. 8, 2022. The entire disclosures of U.S. Provisional Application No. 63/336,009, U.S. Provisional Application No. 63/399,118, U.S. Provisional Application No. 63/418,761, and U.S. Provisional Application No. 63/431,100 are specifically incorporated herein by reference in their entireties.

BACKGROUND

Peripheral Component Interconnect Express (PCIe) is the leading interconnect protocol between a host central processing unit (CPU) of a personal computer (PC) and various high-speed peripheral components, such as graphics cards, sound cards, solid state drives (SSDs), and workload accelerator cards used in data centers, for example. Accordingly, there is a push to launch new PCIe interconnect-based products quickly after development of the latest version of the specification to capture as much of the market as possible. To reduce time-to-market, various tools are used to support and accelerate development activities. One common tool is a PCIe Protocol Analyzer. Conventional PCIe Protocol Analyzers support various viewing and protocol search capabilities that aim to help users with deep analysis and debugging of PCIe interactions between various modules communicating over a PCIe bus.

Generally, PCIe is a layered packet-based protocol used as a high-speed hardware interface for connecting peripheral devices, where primarily data is transferred over the two higher layers, referred to as the data link layer and the transaction layer. The data link layer supports guaranteed delivery via acknowledgments, flow control, and power management features. The transaction layer, which is at a higher level than the data link layer, implements split transactions (transactions with requests and responses separated by time), allowing the communication link to carry other traffic while a target device gathers data for the response. The lowest layer of layered packet-based protocol is referred to as the physical layer.

The most recent version of PCIe being developed, PCIe Gen6 protocol from Peripheral Component Interconnect Special Interest Group (PCI-SIG®), contemplates multi-lane bandwidths that increase to up to 128 GB/second from previous multi-lane bandwidths of 64 GB/second at PCIe Gen5 protocol and 32 GB/second at PCIe Gen4 protocol. Due to its support for very high throughput, PCIe Gen 6 protocol is slated for use in the storage industry with Non-Volatile Memory Express (NVMe), Serial Advanced Technology Attachment (SATA), and Small Computer System Interface (SCSI) express protocols, as well as upcoming accelerator protocols, such as CXL, CCIX and Gen-Z, for example. In order to accommodate such high bit rates, when a PCIe Protocol Analyzer is capturing protocol exchanges on the PCIe bus, proposed conventional solutions rely on large memory buffers for storage, which may support up to four seconds of full 64 GB/s data capture at PCIe Gen5, for example. However, such an approach is costly regarding materials and potentially error prone due to the very large amounts of data that must be transported, stored, and ultimately processed, leading to challenges with signal integrity and data processing.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 shows an illustrative FLIT for a 16 lane Gen6 PCIe link.

DETAILED DESCRIPTION

Figure 1:
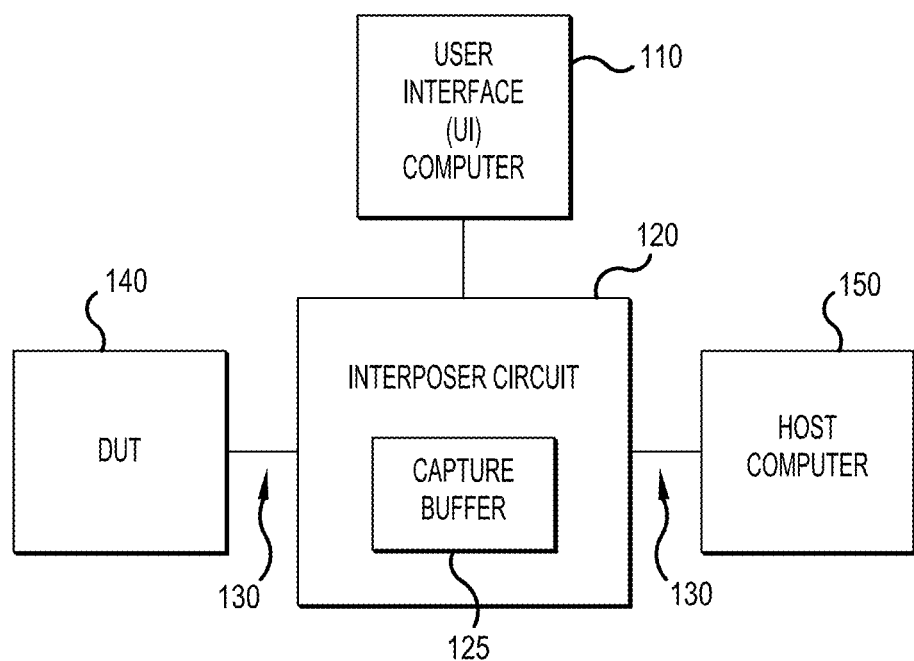
FIG. 1 is a simplified block diagram of a system for reducing an amount of stored data during capture of communication of the data over a high-speed data link, without loss of functionality and without loss of available information for the analysis, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to a representative embodiment, a method is provided for reducing an amount of data stored in a capture buffer of an interposer circuit during communication of the data over a data link according to a high-speed, layered packet-based protocol between a system under test and a protocol analyzer for analysis, without loss of functionality and without loss of available information for the analysis. The method includes performing data integrity checks of the data in real time, and omitting data integrity bits corresponding to the data integrity checks from transaction layer packets (TLPs) and data link layer packets (DLLPs) of the data from being stored in the capture buffer when the data integrity checks indicate the data is correct; performing acknowledge and negative acknowledge (ACK/NACK) matching in real time to confirm successful delivery of the TLPs of the data using ACK/NACK packets, and omitting the ACK/NACK packets from being stored in the capture buffer; removing and/or reducing fields in real time from the TLPs and/or the DLLPs of the data to be stored in the capture buffer, and/or compressing payloads of the TLPs and/or the DLLPs of the data in parallel to be stored in the capture buffer.

According to a representative embodiment, a system includes a user interface (UI) computer configured to run analyzer software for analyzing data in a high-speed, layered packet-based protocol from a device under test (DUT) to a host computer via a high-speed data link according to the high-speed, layered packet-based protocol; and an interposer circuit connected to the high-speed data link for monitoring the data transmitted between the DUT and the host computer, the interposer circuit including a capture buffer for storing the data transmitted between the DUT and the host computer, and accessible by the UI computer for analysis using the analyzer software. The interposer circuit is programmed to perform data integrity checks of the data in real time, and omit data integrity bits corresponding to the data integrity checks from TLPs and DLLPs of the data to be stored in the capture buffer when the data integrity checks indicate the data is correct; perform ACK/NACK matching in real time to confirm successful delivery of the TLPs of the data using ACK/NACK packets, and omit the ACK/NACK packets from being stored in the capture buffer; remove and/or reduce fields in real time from the TLPs and/or the DLLPs of the data to be stored in the capture buffer and/or compress payloads of the TLPs and/or the DLLPs of the data in parallel to be stored in the capture buffer.

According to a representative embodiment, a system includes UI computer configured to run analyzer software for analyzing data in a high-speed, layered packet-based protocol from a DUT to a host computer via a high-speed data link according to the high-speed, layered packet-based protocol; and an interposer circuit connected to the high-speed data link for monitoring the data transmitted between the DUT and the host computer, the interposer circuit including a capture buffer for storing the data transmitted between the DUT and the host computer, and accessible by the UI computer for analysis using the analyzer software. The interposer circuit is programmed to compress in parallel TLPs and/or DLLPs, and to store the compressed TLPs and/or DLLPs in the capture buffer, wherein each of the TLPs and/or DLLPs comprises a header and a payload. Compressing the TLPs and/or the DLLPs includes receiving symbols of the TLPs and/or the DLLPs at the interposer circuit in multiple serial high-speed lanes; de-skewing the symbols from the serial high-speed lanes into wide words arriving on each clock of a clock cycle of the TLPs and/or the DLLPs; arranging the wide words into input streams, where each input stream includes symbols from the same position of each wide word arriving on each clock of the clock cycle; compressing the symbols using a hash table for compressing the symbols, and storing the resultant compressed symbols in the capture buffer.

According to a representative embodiment, a method is provided for decompressing wide word data compressed in parallel. The method includes creating an instance of memory structure for a wide word in the wide word data, where the instance of memory structure is an inverse of a compression dictionary for the wide word; retrieving multiple compressed codes iteratively from a gap-free compressed output stream of the wide word data using the instance of memory structure, where each compressed code of the multiple compressed codes includes at least one character code and a reverse-pointer, and where at least one compressed code of the multiple compressed codes includes a multi-symbol string having multiple character codes; forming an intermediate decompressed stream by iteratively following the reverse-pointers for multiple compressed codes, respectively; and forming a decompressed stream by reversing an order of the multiple character codes in the multi-symbol string of at least one compressed code.

FIG. 1 is a simplified block diagram of a system for reducing an amount of stored data during communication of the data over a high-speed data link, without loss of functionality and without loss of available information for the analysis, according to a representative embodiment.

Referring to FIG. 1, system 100 includes a user interface (UI) computer 110 and an interposer circuit 120. The interposer circuit 120 is connected in a high-speed data link 130 between a device under test (DUT) 140 and a host computer 150 of a system under test and is configured to receive and process data communicated through the high-speed data link 130. The data is provided by the interposer circuit 120 to the UI computer 110, which hosts a protocol analyzer for analyzing the data in accordance with a high-speed data protocol.

The interposer circuit 120 thus acts as the "man in the middle" for testing of the system under test, which includes the DUT 140, the host computer 150, and the high-speed data link 130 between the DUT 140 and the host computer 150. That is, the interposer circuit 120 captures the high-speed data during the testing and stores a portion of the captured data in a capture buffer 125 according to the embodiments described herein, which is provided to the UI computer 110 for post capture analysis. The interposer circuit 120 may be connected to the UI computer 110 over a universal serial bus (USB) (e.g., USB 3.0) or ethernet connection, for example.

The UI computer 110 may be a personal computer (PC), for example, although any processing unit (e.g., processing unit 810 discussed below) capable of executing the protocol analyzer may be incorporated without departing from the scope of the present teachings. The host computer 150 likewise may be a PC, for example, although any processing unit (e.g., processing unit 810 discussed below) capable of executing interfacing with the DUT 140 via the high-speed data protocol may be incorporated without departing from the scope of the present teachings. For example, DUT 140 may be a high-speed peripheral device, such as an add-in card or a system board that is insertable into and interfaces with the host computer 150. Examples of high-speed peripheral devices include a graphics card, a sound card, an SSD, or a workload accelerator. Generally, a high-speed peripheral device is one that operates at data speeds in excess of 0.25 GB/second per lane, depending on the specification (e.g., in excess of 4 GB/second per lane for PCIe Gen6 protocol), and therefore requires data to be communicated using the high-speed protocol over the high-speed data link 130 for reliable data transport.

The high-speed data protocol may be the PCIe protocol, for example, as described in PCI Express® Base Specification Revision 3.0 (Nov. 10, 2010) ("PCIe Gen3 protocol"), PCI Express® Base Specification Revision 4.0, Version 1.0 (Oct. 5, 2017) ("PCIe Gen4 protocol"), PCI Express® Base Specification Revision 5.0, Version 1.0 (May 28, 2019) (PCIe Gen5 protocol), or PCI Express® Base Specification Revision 6.0, Version 1.0 (Jan. 11, 2022) ("PCIe Gen6 protocol"), for example, all of which are hereby incorporated by reference in their entireties. In this case, the protocol analyzer implemented by the UI computer 110 may be a U4301B PCIe Protocol Analyzer or a U4305B PCIe and LTSSM Exerciser, available from Keysight Technologies, Inc., for example.

In the depicted embodiment, the interposer circuit 120 includes the capture buffer 125 for temporarily storing the data transmitted between the DUT 140 and the host computer 150, as mentioned above. The interposer circuit 120 may include a field programmable gate array (FPGA) and/or an application specific integrated circuit (ASIC), although any processing unit (e.g., processing unit 810) capable of performing the functionality of the interposer circuit 120, discussed below with reference to FIG. 2, may be incorporated without departing from the scope of the present teachings. In an embodiment, the interposer circuit 120 is implemented by an FPGA that has internal high bandwidth memory (HBMP) dynamic random access memory (DRAM), available from Xilinx, Inc., for example, which is used as the capture buffer 125.

Figure 2:
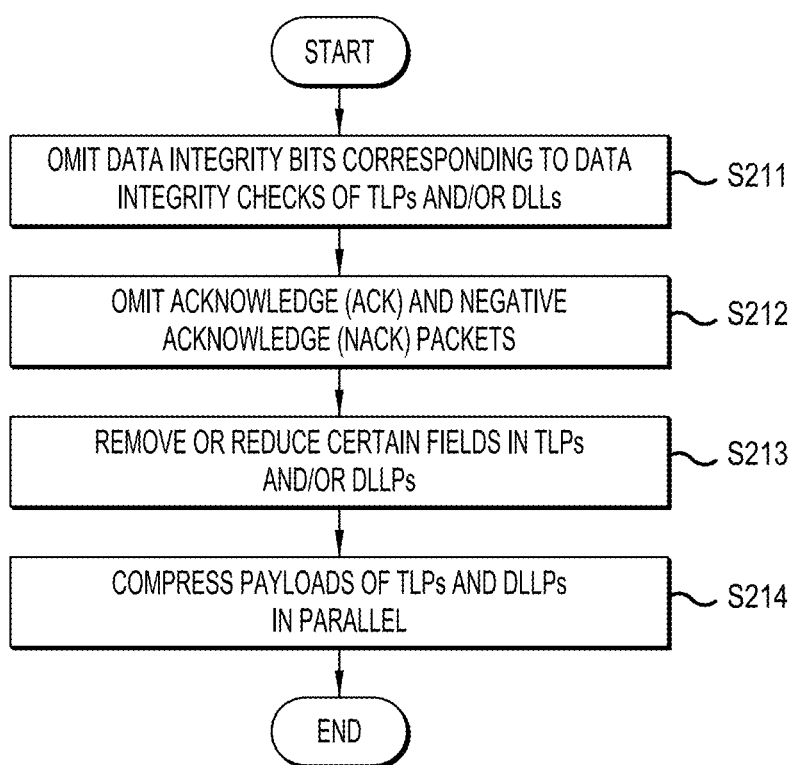
FIG. 2 is a simplified flow diagram illustrating a method of reducing an amount of data stored in a capture buffer of an interposer circuit during communication of the data over a data link according to a high-speed, layered packet-based protocol, without loss of functionality and without loss of available information for the analysis, according to a representative embodiment.

FIG. 2 is a simplified flow diagram illustrating a method of reducing an amount of data stored in a capture buffer of an interposer circuit during communication of the data over a data link according to a high-speed, layered packet-based protocol, without loss of functionality and without loss of available information for the analysis, according to a representative embodiment. The various steps in FIG. 2 may be performed by the interposer circuit 120, discussed above. The method provides the protocol analyzer on the UI computer 110 and the interposer circuit 120. This eliminates complex wiring and signal integrity issues associated with previous solutions, reduces overall costs, and supports faster upload times using high bandwidth interfaces (and less raw data), for example.

Referring to FIG. 2, the amount of data being stored in the capture buffer includes four basic steps, each of which is described in more detail below. In block S211, data integrity bits corresponding to data integrity checks of the data performed in real time are removed from transaction layer packets (TLPs) and data link layer packets (DLLPs) of the data which is to be stored in the capture buffer. The data integrity bits are removed when the data integrity checks indicate the data is correct. Otherwise, when the data integrity checks indicate the data is not correct, the data integrity bits are left in the TLPs and the DLLPs and stored in the capture buffer 125, in accordance with the standard protocol, for analysis by the UI computer 110.

In block S212, acknowledge (ACK) and negative acknowledge (NACK) packets, indicating the correct or incorrect arrival, respectively, of TLPs of the data at an intended destination, are not stored in the capture buffer 125. Instead, the ACK/NACK matching is performed in real time to confirm successful delivery of the TLPs using ACK packets and NACK packets, and then the ACK/NACK packets are discarded. The ACK/NACK status of the TLPs may be recorded as meta data in the capture buffer 125.

In block S213, certain fields are removed from the TLPs and/or the DLLPs of the data in real time or are reduced in size in real time. This includes removing known fields that have fixed or empty values, removing framing tokens that are used to indicate the start and end of packet flows of the TLPs and the DLLPs, reducing fields that are not needed in their entireties for testing a single active device as opposed to multiple active devices, and eliminating non-required fields that do not have any value for debugging a particular use-case.

In block S214, all or a portion of the TLPs and/or the DLLPs to be stored in the capture buffer 125 are compressed in parallel. For example, the data payloads of the packets may be compressed for storing in the capture buffer 125. Compressing the data payloads, for example, includes arranging the data in the payload such that each symbol of the wide word is positioned with the next symbol in the same position on the next clock of the clock cycle of the processing unit. Then, compression is performed on the arranged data using a hash table that provides pointers to previous symbols already stored in memory. Compressing complete packets (i.e., including headers) may be performed in substantially the same manner.

Data Integrity Checks

Referring to block S211, there are different types of data integrity checks that may be performed in real time, which provide data integrity bits that are omitted from being stored in the capture buffer 125. In various embodiments, the types of data integrity checks include checking cyclic redundancy checker (CRC) checks, frame parity checks, and Flow Control Unit (FLIT) checks, each of which is discussed below. The data integrity bits in TLPs and/or DLLPs corresponding to these checks are not stored when the checks indicate that the respective data is correct. Otherwise, when the data integrity bits indicate that the respective data is not correct, they may be left in the packets and stored in the capture buffer 125 to be analyzed by the UI computer 110.

CRC Checks

Regarding CRC checks, CRC fields containing checksums are included in TLPs and DLLPs of the data. Generally, the checksums are provided in the CRC fields at the transmitting device (e.g., the DUI 105), and retrieved at the receiving device the host PC), where they are compared to the original data's check sum. When the checksums match, it is determined that there are no errors in the data. When the checksum fails, corrective action may be taken, for example, requesting retransmission of the packet via HACK. In the present embodiment, checksums of CRCs indicating no errors are removed from the respective packets, while checksums of the CRCs indicating errors are not removed, and therefore stored in the capture buffer 125.

Figure 3A:
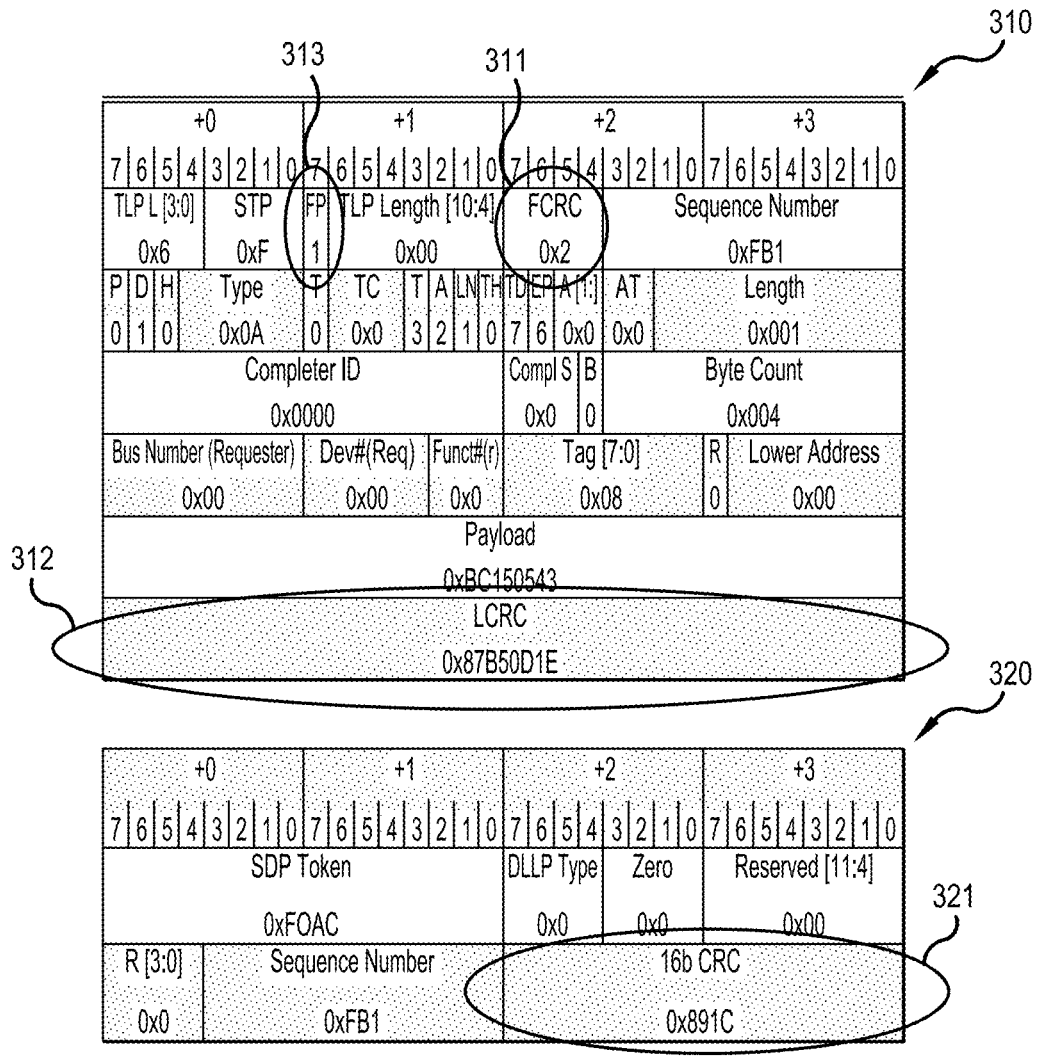
FIG. 3A shows CRC fields in an illustrative transaction layer packet (TLP) and an illustrative data link layer packet (DLLP) to be discarded without storing in a capture buffer, according to a representative embodiment.

FIG. 3A shows CRC fields in an illustrative TLP and an illustrative DLLP to be discarded without storing in a capture buffer, according to a representative embodiment. The CRC fields in the TLPs and DLLPS are provided in accordance with Section 2.7 of the PCIe Gen3 protocol, for example, although CRC fields in other protocols, including other PCIe protocols (e.g., PCIe Gen4 through Gen6 protocols), for example, may be incorporated without departing from the scope of the present teachings.

Referring to FIG. 3A, illustrative TLP 310 includes two CRC fields: FCRC field 311 which includes four bits and LCRC field 312 which includes 32 bits. Illustrative DLLP 320 includes CRC field 321 which includes 16 bits. As discussed above, rather than storing the FCRC field 311, LCRC field 312, and the CRC field 321 in the capture buffer 125, the checksums of the CRCs are first checked on the interposer circuit 120 itself. The checksums that indicate no errors are not stored in the capture buffer 125 and are removed from the respective packets, while the checksums of the CRCs that indicate errors are stored in the capture buffer 125 as would be normally done. For example, the checksums that indicate no errors may be removed from the respective packets. Typically, where CRC errors do not occur, the storage space saved in the capture buffer 125 on a per packet basis is known and fixed (e.g., 36 bits for the TLP 310 and 16 bits for the DLLP 320).

It may be assumed the data transport infrastructure from the capture buffer 125 to the UI computer 110 will preserve data integrity, so there is no loss in functionality by omitting the CRCs. Afterwards, in cases where there is no error, the CRCs can be silently reconstructed on the UI computer 110 using the reverse of the algorithm used by the transmit end of the PCIe link to calculate the CRCs in the first place. This way, the user is unaware that checksums have been omitted. For example, FIG. 2-38 in Section 2.7 of the Gen3 protocol provides an ECRC algorithm for calculating 32-bit ECRC for TLP End to End Data Integrity Protection. The UI computer 110 may use the reverse of this algorithm to reconstruct any ECRC that has been previously removed from the TLP 310. Of course, other known algorithms for calculating CRCs, including algorithms provided by other PCIe protocols (e.g., PCIe Gen4 through Gen6 protocols), for example, may be incorporated without departing from the scope of the present teachings. When CRC errors are present, the TLP 310 and/or the DLLP 320 having the CRC errors are stored in the capture buffer 125 without change, so that the CRCs can be analyzed fully by the protocol analyzer.

Frame Parity Bits

Frame parity bits are included in the TLPs and are also checked on the interposer circuit 120. Generally, the frame parity bits are checked to ensure the receiving device is observing corresponding framing tokens correctly. In an embodiment, the frame parity bits that indicate no errors are omitted from being stored in the capture buffer 125, while the frame parity bits that indicate errors are stored in the capture buffer 125. The values of the frame parity bits are determined pursuant to frame parity checks. An example of performing frame parity checks is described in Section 4.2.2.3.1 of the PCIe Gen3 protocol with regard to framing tokens. Of course, other known processes for performing frame parity checks, including those provided by other PCIe protocols (e.g., PCIe Gen4 through Gen6 protocols), for example, may be incorporated without departing from the scope of the present teachings. Generally, a framing token specifies or implies the associated number of symbols, and therefore the location of the next framing token. For example, framing tokens may be special symbols that indicate the start of a packet and allow the different types of packets to be quickly and easily distinguished.

Referring again to the example in FIG. 3A, the TLP 310 also includes a frame parity (FP) field 313 including one bit as the frame parity bit. Again, rather than storing the FP field 313, the frame parity bit is first checked on the interposer circuit 120. When the frame parity bit indicates no error, it is removed from the respective TLP 310 before storing the TLP 310 in the capture buffer 125. When the frame party bit indicates an error, the frame parity bit remains in the TLP 310 and is stored in the capture buffer 125 as would be normally done, to enable analysis by the UI computer 110.

Removing frame parity bits that indicate no errors results in a small saving of only one bit per TLP 310. However, packet decoders usually need to check the frame parity bit to ensure that the start TLP (STP) token (a framing token) in the TLP 310, for example, is correct and that they are observing a properly formed TLP 310 in the data stream. For example, the interposer circuit 120 checks the frame parity bit and the STP token so that it can mark the beginning of the corresponding packets and insert timestamps accordingly. The interposer circuit 120 needs to decode the header and recover the packet boundary so that filtering can be applied, and meta data inserted. Since the packet boundaries on the interposer circuit 120 need to be calculated regardless of compression techniques that may be applied, it is worthwhile to remove the frame parity bits even for mere one-bit savings.

FLIT Checks

Certain high-speed data protocols incorporate use of forward error correction (FEC) (e.g., PCIe Gen6), in which case the packets must have fixed length, such as 256 bytes, for example. The fixed length packet is referred to as the Flow Control Unit (FLIT). Each FLIT may include one or more TLPs, which are typically variable in length, in a predetermined number of bytes. For TLPs that are longer than the FLIT, the TLPs are divided into multiple FLITs. Generally, when a FLIT is received, the receiving device (e.g., the host computer 150) performs FEC decoding, which corrects any correctable errors within each FEC group in the FLIT. After the FEC decoding, a CRC check is performed. If the CRC check fails, the receiving device indicates that the FLIT has not been successfully received. This may be done by sending a negative acknowledge back to the transmitting device (e.g., the DUT 140).

FIG. 4 shows an illustrative FLIT 400 for a 16 lane PCIe link. In the depicted example, the FLIT 400 includes 256 bytes, which are allocated as follows: the first 236 bytes are allocated to one or more TLPs (bytes 0-235), the next six bytes are allocated to the Data Link Layer Payload (DLP) (bytes 236-241, shown as DLP0-DLP5), the next eight bytes are allocated to the CRC 411 (bytes 242-249, shown as CRC0-CRC7), and the last six bytes are allocated to the FEC 412 indicated as error correction code (ECC) (bytes 250-255, shown as three groups ECC0[0:1]-ECC2[0:1], for example). The FEC is performed and the CRC is then checked for the FLIT 400. When the CRC check passes, both the CRC information in the CRC 411 and the FEC information in the FEC 412 are discarded on the interposer circuit 120. The CRC 411 is in eight bytes and the FEC 412 (or ECC) is in three blocks of two bytes each at the end of the 256-byte FLIT. So, by discarding the CRC 411 and the FEC 412, 14 out of the 256 bytes of the FLIT 400 are not stored in the capture buffer 125. Notably, the CRC check for the FLIT may be performed in place of CRC checks for the TLPs, discussed above with reference to FIG. 3A, since TLPs that are encapsulated in FLITs do not have their own CRCs.

ACK/NACK

Referring to block S212, ACK and NACK matching is performed in real time to confirm successful delivery of the TLPs of the associated data using ACK packets and NACK packets in real time. The ACK packets and the NACK packets are then discarded, that is, they are not stored in the capture buffer 125. Generally, the data link layer provides support for packets of the transaction layer guaranteed delivery using an acknowledge and negative acknowledge mechanism. Generally, the correct arrival or incorrect arrival of each TLP from a source (e.g., DUT 105) at the destination (e.g., host computer 150) is reported by the destination back to the source using a matching sequence number in a subsequent DLLP. The sequence numbers are used to track between the TLP and both the ACK packets and the NACK packets (which are DLLPs), thereby tying together matching sequence numbers across the TLPs and DLLPs to indicate successful delivery. A timer may be used to time the receipt of a TLP and its corresponding acknowledgement. If the timer expires (timeout) before the acknowledgement (ACK packet) is received by the destination, then a retransmission of the original data occurs in a new TLP. The sequence numbers in the TLPs and the DLLPs may be re-used (wrap around), but in that case, no live packets should be "in-flight" when the sequence numbers are re-used.

As mentioned above, the interposer circuit 120 omits the ACK and NACK packets from being stored in the capture buffer 125. Of course, if the system is specifically debugging a problem with acknowledgements themselves, then this feature may be disabled. In an embodiment, the TLP may have meta data attached to it in the capture buffer 125 that indicates the acknowledgement status of that TLP, even though the ACK and NACK packets themselves are not stored. The meta data is logically attached to the TLP by the interposer circuit 120 before the TLP is stored in the capture buffer 125. Therefore, performing ACK and NACK matching on the interposer circuit 120 without storing ACK and NACK packets and indicating ACK and NACK results using meta data provides substantially "lossless" compression of data.

There is some cost to this approach. The exact time of arrival of ACK and NACK packets will be lost, unless timestamps of the ACK and NACK packets are added to create richer data, discussed above. Adding the timestamps to the meta data increases the amount of data to be stored in the packet buffer, although the increase is less than the amount of data that would otherwise be stored for the entire ACK and NACK packets. Given the sequence number from the TLP 310 and (optionally) the timestamp associated with the ACK or NACK packet, the DLLP 320 could be completely reconstructed provided there is no underlying protocol error. Of course, when there is an underlying protocol error, the DLLP 320 would be stored whole. Also, the timestamp the DLLP 320 may be kept as a delta to the original timestamp of the corresponding TLP 310. This reduces the number of bits required for storage, while the position of the DLLP 320 in the packet stream may still also be restored.

Figure 3B:
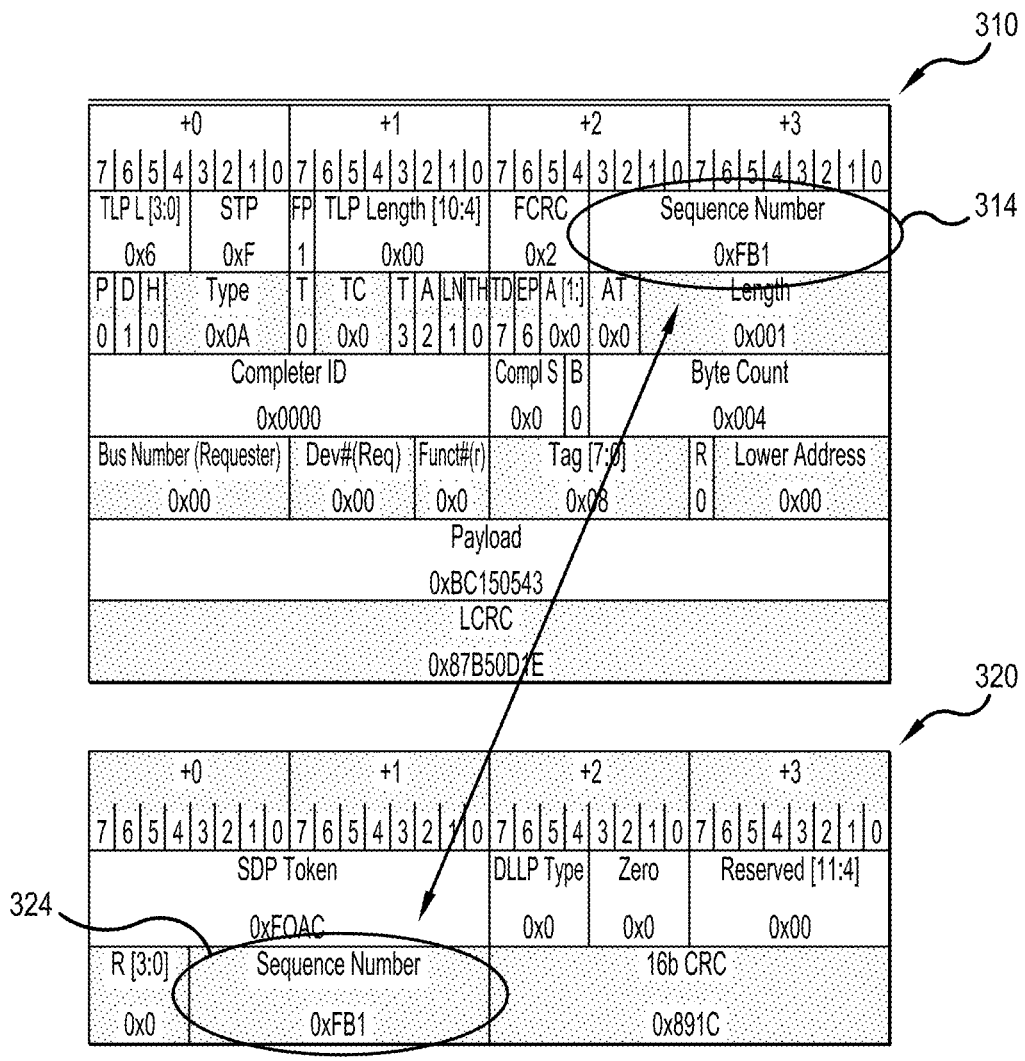
FIG. 3B shows sequence number fields in the TLP and the DLLP enabling ACK/NACK packets to be discarded without storing in a capture buffer, according to a representative embodiment.

FIG. 3B shows sequence number fields in the same TLP 310 and the same DLLP 320 shown in FIG. 3A, discussed above, enabling ACK/NACK packets to be discarded without storing in the capture buffer 125, according to a representative embodiment. Referring to FIG. 3B, TLP 310 includes sequence number field 314 and DLLP 320 includes DLLP sequence number field 324. The sequence numbers match, thereby indicating successful delivery, which would result in an ACK of the TLP packet. For example, if there is a matching pair of sequence numbers, one in the TLP 310 and one in the DLLP 320, it means that the TLP 310 has been acknowledged (ACKed). In this case, the sequence numbers in the sequence number fields 314 and 324 are not stored, although a 3-bit symbol indicating whether the TLP 310, and/or an ACK and/or NACK have arrived is stored. Since the sequence numbers go in order in each direction (e.g., up or down), it may be determined later what sequence number each 3-bit symbol refers to. In the depicted example, the size of the ACK and NACK packets, and thus the space saved on a per TLP basis, is known and fixed. For example, in Section 3.4.1 of the PCIe Gen3 protocol, each ACK or NACK packet is 64 bits per TLP 310 in non-FLIT mode, so a savings of 61 bits is realized if an additional 3 bits of meta data indicating ACK/NACK status are stored in the capture buffer 125 in association with the TLP 310, as discussed above. In the Section 3.5.1 of the PCIe Gen 6 protocol, for example, also addresses the handling of ACK and NACK packets. Further, with FLIT-mode enabled in the PCIe Gen 6 protocol, a savings of 6 bytes per FLIT is realized. ACK and NACK packets in other known protocols, including other PCIe protocols (e.g., PCIe Gen4 through Gen5 protocols), for example, may be incorporated without departing from the scope of the present teachings.

Removing/Reducing Fields

Referring again to FIG. 2, in block S213, certain fields of the TLPs and/or the DLLPs are removed or the data in the fields are reduced in real time. There are several different types of fields that may be included in this compression technique. For example, known fields having known fixed or empty values, framing token fields indicating start and end of packet flows, and non-required fields having no values for a given use-case may be eliminated. Also, fields that are wider than necessary for testing conditions may be reduced in size.

Eliminate Known Fields

Some TLPs include known fields that have known values, including fixed values and empty values. Protocols are typically designed to be regular in nature, especially with regard to common header fields that precede payload data, for example. This is also a deliberate part of layered protocol design since it eases the amount of work required when constructing state machines used to decode the protocol. Consequently, many packet types have fields that are used in certain packets but have fixed known, or even empty values when the packet is of another type. For example, in various packets there are Reserved fields that must be 0, Traffic Class indicators that are not used and therefore must be 0, and Length fields that must be 1 (since there is always a single data word (e.g., 4 bytes) in the payload).

Some packets also have known filter settings (e.g., known as triggers in the PCIe Gen3 protocol software). For example, when searching for a few talkers on the Bus or testing a single endpoint device, device address fields are known a priori and only matching packets are stored, assuming the filter is working correctly. For example, a filter that includes only two talkers does not require a large address space and the data in the address field can be reduced since only the two known talkers need be identified. In certain cases, it might be feasible to reduce a 16-bit address to just one, two or three bits.

While known fields having known (fixed or empty) values may vary by packet type, it is relatively simple to define these fields and omit them when the packet is stored. Since the fields' values are known, they can be reinstated by the user interface, as long as the known values are checked on the interposer circuit 120 for correctness before they are omitted from the capture buffer 125. Of course, when the values differ from the expected known values, then the entire packet, including the known fields, must be stored for later debugging.

Figure 5A:
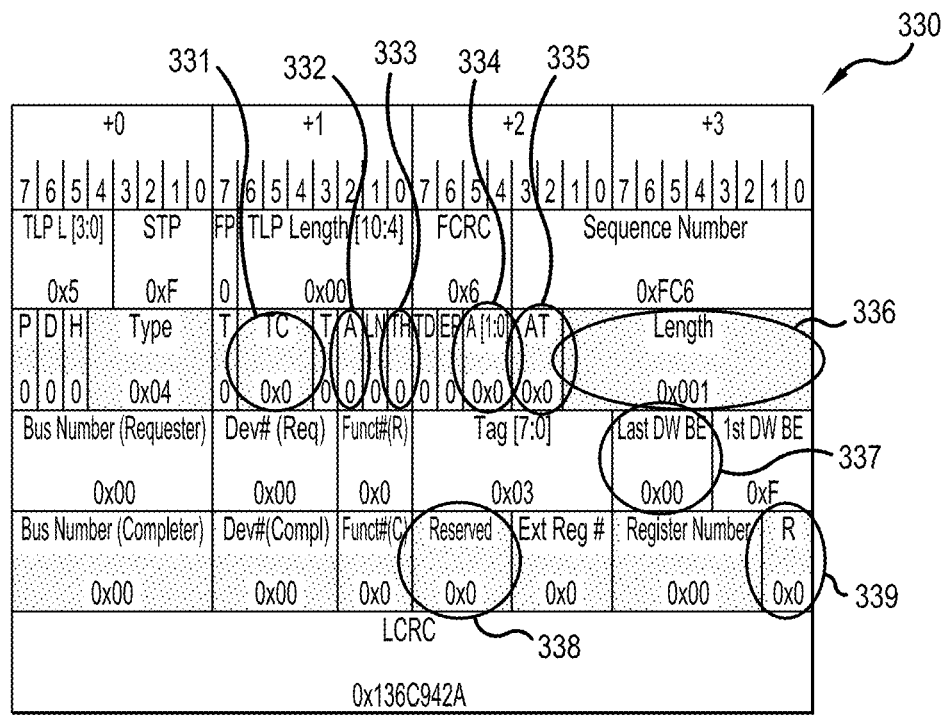
FIG. 5A shows known fields in an illustrative Config Read TLP to be discarded without storing in a capture buffer, according to a representative embodiment.

FIG. 5A shows known fields in an illustrative Config Read TLP to be discarded without storing in a capture buffer, according to a representative embodiment. The known fields in the Config Read TLP are provided according to the PCIe Gen3 protocol, such as Section 2.2.6.3 regarding attributes fields (Attr), for example, which provides additional information that allows modification of default handling of transactions. Referring to FIG. 5A, the following rules apply to the Config Read TLP 330: TC field 331 must be 000b, TH field 333 is not applicable to configuration requests and the bit is Reserved (probably 0), Attr[2] field is Reserved (probably A[1:0] field 334 must be 00b, AT field 335 must be 00b, Length field 336 must be 00 0000 0001b (one), and Last DW BE field 337 must be 0000b. Fields 332, 338 and 339 are marked as reserved and must be zero. Other known fields in the PCIe Gen3 protocol, as well as known fields in other protocols, including other PCIe protocols (e.g., PCIe Gen4 through Gen6 protocols), for example, may be incorporated without departing from the scope of the present teachings.

Eliminate Framing Tokens

Various tokens are symbols used to indicate the start and end of packet flows of the TLPs and the DLLPs. The framing tokens may be replaced, after checking their values, with shorter symbols. In an embodiment, the framing tokens are checked for respective values, and exceptions are raised when an error is found in the value, which is replaced by a much smaller but unique bit sequence. Again, when data is extracted from the capture buffer 125 and sent to the UI computer 110, its integrity and spacing should be preserved by the transport system carrying the packets.

Figure 3C:
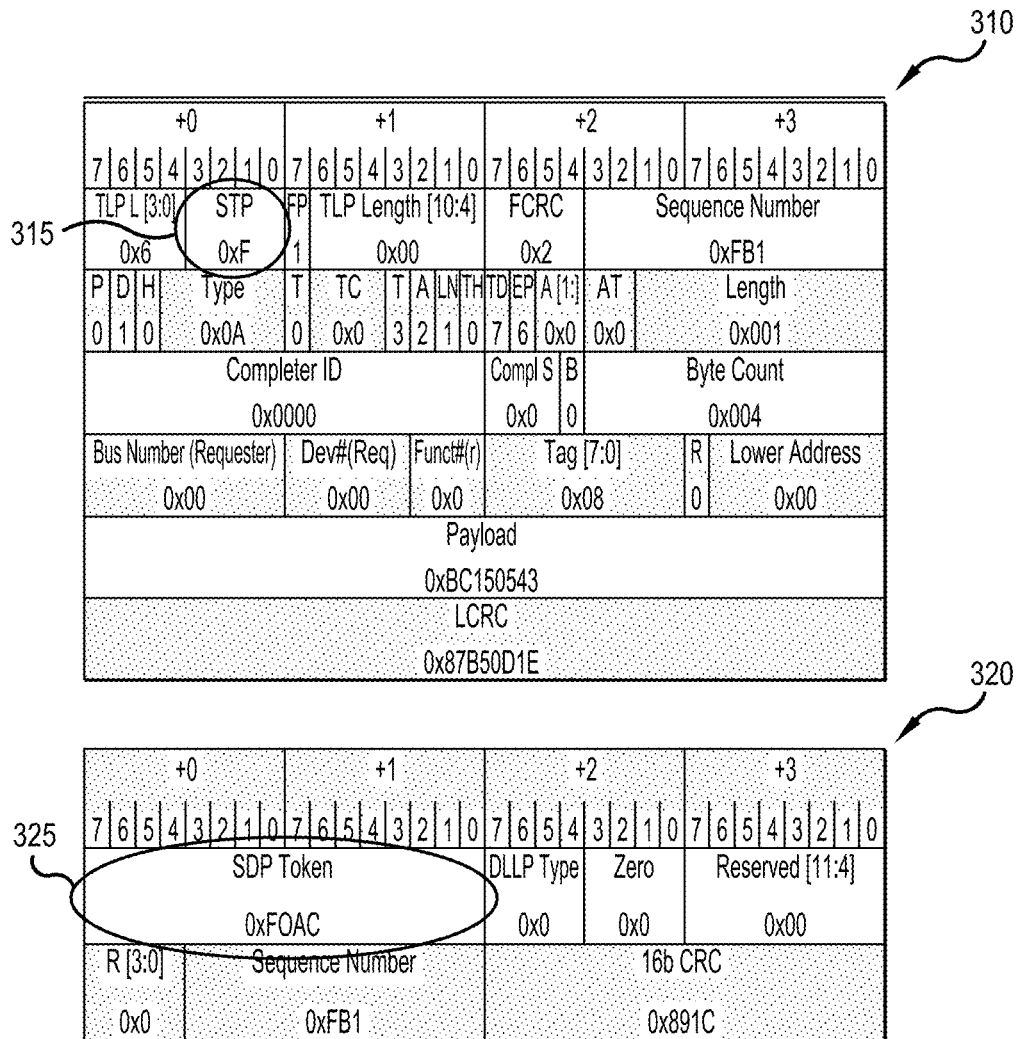
FIG. 3C shows framing token fields in the TLP and the DLLP to be discarded without storing in a capture buffer, according to a representative embodiment.

FIG. 3C shows framing token fields in the TLP and the DLLP to be discarded without storing in the capture buffer, according to a representative embodiment. FIG. 3C shows the same illustrative TLP 310 and DLLP 320 shown in FIG. 3A, discussed above. Referring to FIG. 3C, the TLP 310 includes STP field 315 and the DLLP 320 includes SDP token number field 325. The STP field 315 contains the start packet flow token for the TLP 310 (the field containing the end packet flow token is not shown), and the SDP token number field 325 contains the framing token for the DLLP 320. Each of the STP field 315 and the SDP token number field 325 may be removed or replaced with shorter symbols, for example.

Reduce Fields

As discussed above, some packet fields inside the protocol are wider (use more bits) than is likely required for the DUT 140. For example, it is often the case that a minimal setup (a single device) is being tested in a system. Therefore, there may be only one active PCIe device communicating with the host computer 150, as compared to a live system in which multiple PCIe devices (cards), such as a sound card, a graphics card, multiple accelerators and the like, are in use. Therefore, an address space capable of accommodating multiple PCIe devices is not needed when only one or two PCIe devices (e.g., DUT 140) are active.

In an embodiment, when there are fewer active DUTs in the system under test (including the DUT 140) than in a live system, the size of the address field may be reduced, according to the number of active DUTs required, and a lookup table may be deployed in its place. For example, when there are only two or three active DUTs, the address field may be reduced from 16-bits to just 1-bit, 2-bits or 3-bits, respectively. The size of the lookup table may be parameterized at startup of the interposer circuit 120, so that the user may configure the memory compression at the UI computer 110 to make the most of the available memory compared to the number of DUTs.

In addition, the address of a Requester (sender) and a Completer (receiver) are a mirrored pair of values. When only two parties are in the conversation (e.g., one DUT 140 and one host computer 150), there is only one unique pair. Moreover, since the interposer circuit 120 is directionally aware, by reason of being physically connected to both the down and up link channels as "man-in-the-middle," then an addressing scheme may not be required at all. In this case the entire address field may be eliminated.

Figure 5B:
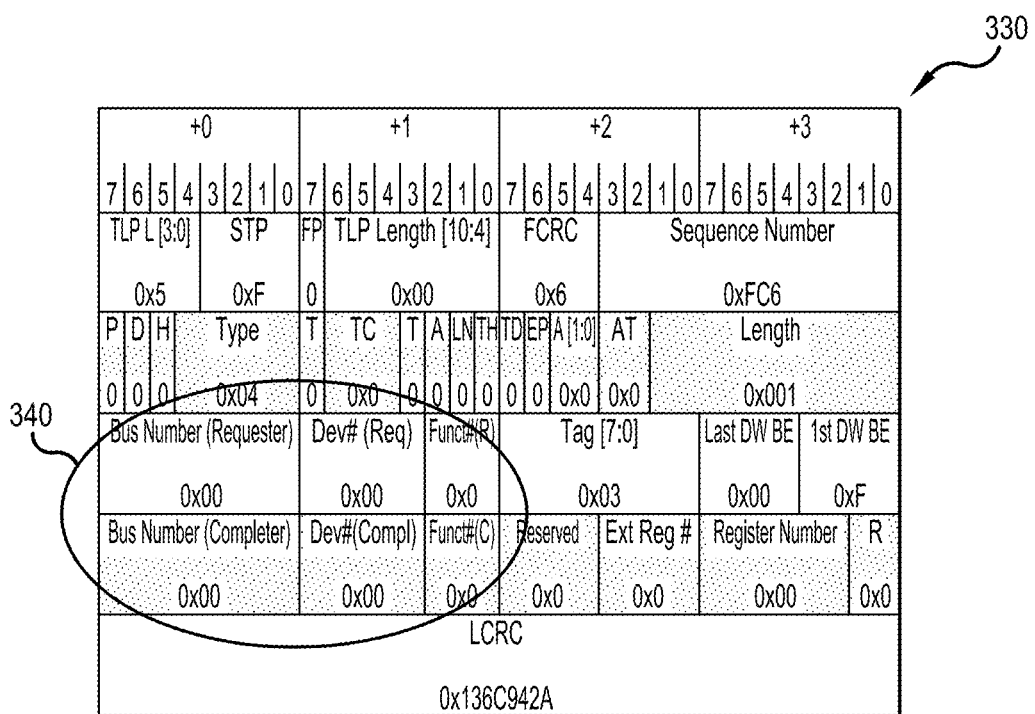
FIG. 5B shows reducible fields in the Config Read TLP to be reduced in size before storing in a capture buffer, according to a representative embodiment.

FIG. 5B shows reducible fields in the Config Read TLP to be reduced in size before storing in a capture buffer, according to a representative embodiment. FIG. 5B shows the same illustrative Config Read TLP 330 shown in FIG. 5A, discussed above. Again, the reducible fields in the Config Read TLP are provided according to the PCIe Gen3 protocol, for example. Reducible fields in other known fields in other protocols, including other PCIe protocols (e.g., PCIe Gen4 through Gen6 protocols), for example, may be incorporated without departing from the scope of the present teachings.

Referring to FIG. 5B, reducible fields 340 include Bus Number (Requester), Dev #(Req) (i.e., Device Number (Requester)) and Funct #(R) (i.e., Function Number (Requester)), which are address data associated with the sender of the TLP 330; and Bus Number (Completer), Dev #(Compl) (i.e., Device Number (Completer)) and Funct #(C) (i.e., Function Number (Completer)), which are address data associated with the receiver of the TLP 330. In an embodiment, all but two or three bits may be eliminated from the reducible fields 340. The number of bits is system specific, whereas only as many bits are needed as there are active combinations of the above-named fields. Meanwhile, a lookup table is created that stores a minimal length alias for the real PCIe addresses of the Requester and Completer in the original packet. The size of the lookup table may be parameterized at start-up of the interposer circuit 120, so that the user may configure the memory compression at the UI computer 110 to make the most of the available memory compared to the number of addressable entities (e.g., DUTs).

Eliminate Non-Required Fields/Packets

Entire fields that do not have any value for a given use-case may be removed from the TLPs and the DLLPs. Entire packets that do not have any value may be removed, as well. Also, TLPs and DLLPs containing larger/longer payloads may be truncated. That is, many packet types have individual fields that do not have significance when debugging a particular use-case. Such packets and/or the individual fields within the packets can be omitted based upon the user's configuration. For example, a list of packets and/or fields per packet may be provided that may be eliminated from the capture stream, based upon a UI setting. This would result in "lossy" compression since the removed packets and/or fields could not be reconstituted at the UI computer 110. Also, the storage schema must specify which fields are present at run time. Therefore, rather than being a fixed storage schema, a flexible storage schema is implemented that maximizes the storage space when the fields are removed. Notably, when entire fields are removed or packets are truncated, then data integrity check values discussed above may not be recovered losslessly at the UI computer 110.

Parallel Compression

Referring to block S214, payloads of the TLPs and/or the DLLPs of wide word data to be stored in the capture buffer are compressed in real time. The compression is performed in parallel, rather than serially as in conventional compression techniques. In an embodiment, headers also may be compressed in real time along with the payloads of the TLPs and/or the DLLPs. The discussion below focuses on data payload compression for the sake of explanation, although it may be applied to complete packet compression without departing from the scope of the present teachings.

By way of background, it is generally understood that compressed output and necessary dictionaries for compression in known compression algorithms, such as those based upon LZW, LZ77 and LZ78, for example, are created by reading one symbol of input data at a time, and the contents of such dictionaries are dependent on knowing the position of previously seen patterns in the stream. Therefore, given this dependency such compression algorithms are difficult to parallelize.

Parallel processing generally promotes efficiency, such as parallelizing the compression algorithms using a single processing unit that processes multiple symbols concurrently, in a single step. Such a strategy may be referred to as single instruction multiple data (SIMD) processing or "wide word" processing, where the wide word may consist of multiple symbols (e.g., 4, 8, 16 or more symbols) and a single circuit, and where each symbol is usually equal to a byte of data in every operation comprising multiple bytes per operation. As applied to PCIe, the data on each single PCIe lane already carries multiple bytes per clock cycle. However, the PCIe analyzer deals with combined de-skewed lane data rather than multiple, single PCIe lanes, the resultant de-skewed data bus may be as much as 128, 256 or more bytes wide. In this case, a symbol may be considered as consisting of multiple bytes of data, as conventional data compression does not require that each symbol be 8-bits wide. However, compression algorithms generally compress less efficiently when the bit width of the input symbols (bytes) is large (e.g., much larger than 8-bits, where for example $2^{16}$ (two bytes) is much larger than $2^8$), and the compression algorithms overall will consume much more memory as the dictionary will increase in size by $2n$ where "n" is the bit width.

For example, wide word designs require word size changes to the dictionary (e.g., 256 bytes of changes) so that the dictionary can keep up with the data rates on each clock input in real time. Given that one clock cycle is required in hardware to write a single change to a single ported memory, and that word-size (e.g., 256 byte) changes are being made, then 256 memory blocks are needed in this example to obtain the required number of memory ports to keep pace with the data in order to avoid data loss. Further, conventional FPGAs include block random access memory (BRAM), where each BRAM is only 36 Kbits in size and multiple BRAM would be required for each of the 256 dictionaries. Even the largest contemporary FPGA do not support enough BRAM to effectively implement so many dictionaries. In a wide word (e.g., SIMD) implementation that processes data at line rate, one change for each new multi-symbol compressed code calculated when reading the wide word is required because each addition to the dictionary requires one memory write operation and one memory read operation, each of which requires one clock cycle and uses one memory port (so two memory ports in total).

BRAM has twin ports, so only one write operation and one read operation can be performed per clock of each clock cycle. Therefore, multiple BRAMs (or more generally, multiple ports) are needed for the compression algorithms. Having multiple BRAMs reduces so-called "memory latency," so that each update may be written via a separate memory port in a single clock cycle. However, with as many memories, such as BRAM, as the width of the wide word, there will be at least 256 memories and each memory will only contain 1/word size of new dictionary entries. Therefore, the multiple memories are inherently non-coherent. In other words, each overall memory block becomes fragmented with the compression dictionary spread across the multiple word size memories. It may be possible to keep the memories coherent, if more clock cycles were available, but given the real-time constraints of the compression algorithm, having another algorithm responsible for synchronizing the memories is challenging.

Figure 6:
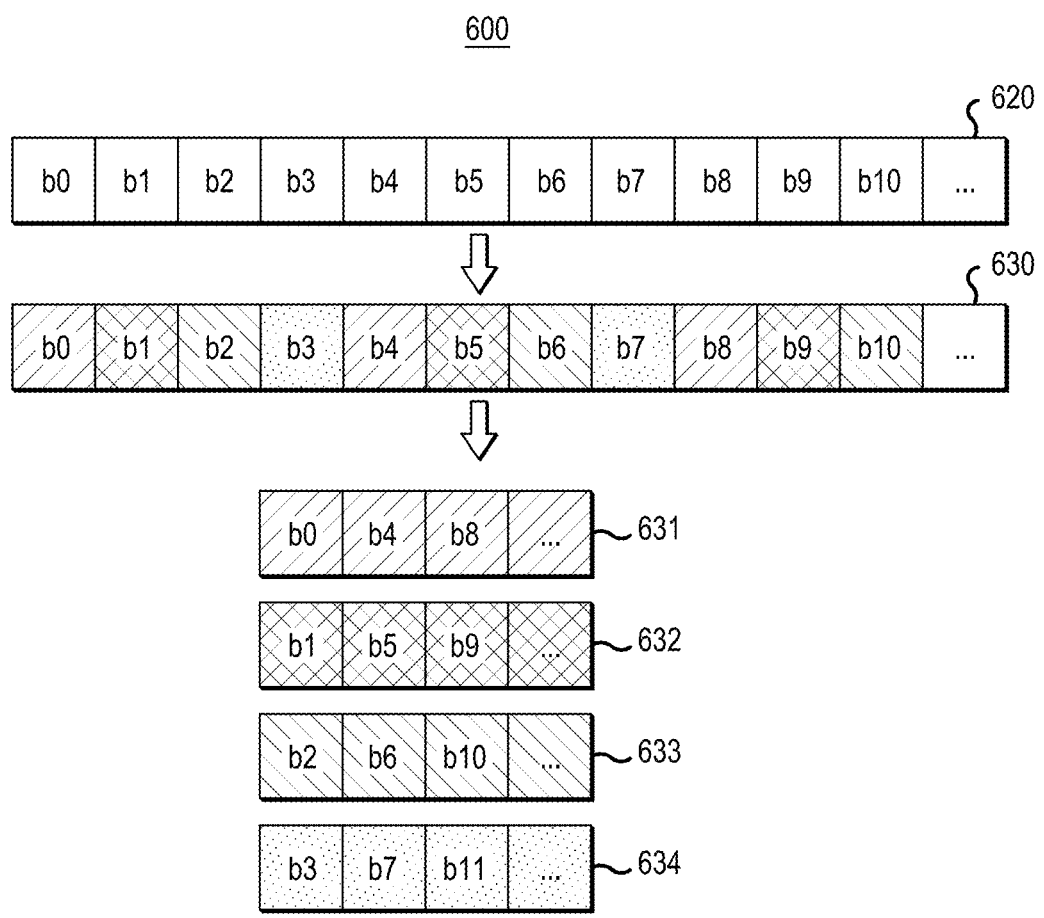
FIG. 6 shows an example of symbols of wide word data organized to enable parallel data compression by a single circuit, according to a representative embodiment.

To address these issues, various embodiments provide a compression algorithm where fragmentation of the memory on a per symbol wide word (SIMD) implementation is a non-issue. FIG. 6 shows an example of symbols of wide word data organized to enable parallel data compression by a single circuit, according to a representative embodiment.

Referring to FIG. 6, a serial stream 620 includes symbols (bytes) b0-b10 in respective wide words. It is understood that the serial stream 620 is received over multiple lanes according to the high-speed protocol (e.g., up to 16 lanes in the PCIe Gen6 protocol). To simplify explanation, each wide word consists of four symbols in the depicted example, as opposed to 256 symbols, which would be a more typical implementation. For example, a $1^{st}$ wide word includes bytes b0, b1, b2 and b3 and a 2 nd wide word includes bytes b4, b5, b6 and b7. Each symbol is assumed to be a byte having 8-bits, for example. Conventional compression algorithms compress the serial stream "as is," meaning that each symbol is followed by the next symbol in the serial stream.

However, in the depicted embodiment, instead of using the next symbol in the serial stream, as in conventional compression algorithms, the data stream is arranged to provide input streams in which each symbol is followed by a next symbol from the same position in the next four-symbol wide word of the data stream on the next clock of the clock cycle. In other words, when there are four symbols per wide word, every fourth symbol is grouped together in terms of the compression, as shown by different shading in the serial stream of symbols indicated by reference number 630. Accordingly, bytes b0, b4, b8, . . . form a first input stream 631 for a first dictionary (D1), bytes b1, b5, b9, . . . form a second input stream 632 for a second dictionary (D2), bytes b2, b6, b10, . . . form a third input stream 633 for a third dictionary (D3), and bytes b3, b7, b11, . . . form a fourth input stream 634 for a fourth dictionary (D4) in this example, where each wide word has four symbols. Compression is then performed on the set of bytes in the same position within the first through fourth dictionaries (i.e., each column in the arrangement shown in FIG. 6) for each clock cycle. More generally, the compression is performed for first through nth dictionaries, where n is the number of symbols per wide word. This effectively results in parallel compression.

Stated differently, assume a stream of data is provided as bits represented as "abcd efgh ijkl mnop." Given the above input, a conventional LZW compression algorithm, for example, would create new dictionary entries for sequential unique pairs "ab," "bc" and "cd" for one wide word, then "ef," "fg" and "gh" for the next wide word, and so on. The conventional LZW compression algorithm would then output "a," "b," "c," "d" . . . and so on, in the same order as the input. If, at any step in the process, a multi-symbol string can be compressed by combining two or more symbols into a single new output symbol (code), the compression algorithm will do so. When this happens, there is a corresponding gap in the output before the new compressed code is output.

However, according to various embodiments, again assuming the wide word size to be four symbols for ease of explanation, every $(4n+i)^{th}$ symbol (i=0, 1, 2, or 3) is considered for each compression step, for n≥0, as discussed below. In this case, the new dictionary entries are paired as follows in the separate memories on each clock cycle, which comprises consecutive clocks and four arranged inputs (1-4), each input addressing a different dictionary, thus:

1) ae, ei, im, . . .
2) bf, fj, jn, . . .
3) cg, gk, ko, . . .
4) dh, hl, lp, . . .

In other words, to support fragmented memories for the dictionaries, the symbols are effectively presented to the compression algorithm at each clock cycle "n" as every "(word_size*n+input_stream−1)" value. Each sequence then creates a new multi-byte symbol, if that symbol has not been observed before. When the wide word size is four, as in this example, the compression algorithm operates on every $(4n+i)^{th}$ value (i=0,1,2,3) with four separate fragmented dictionaries, one for each value of i. Therefore, four blocks of four symbols are encoded into four memories, e.g., "aeim," "bfjn," "cgko" and "dhlp," as shown in Table 1. The data is processed as multiple streams with one memory "unit" and therefore one dictionary (hash table) per stream (each dictionary may include one or more FPGA memories, for example).

TABLE 1

| Clock Cycle | $1^{st}$ Input Stream 631 | $2^{nd}$ Input Stream 632 | $3^{rd}$ Input Stream 633 | $4^{th}$ Input Stream 634 | |
|---|---|---|---|---|---|
| 1 | a | b | c | d | ... |
| 2 | e | f | g | h | ... |
| 3 | i | j | k | l | ... |
| 4 | m | n | o | p | ... |

Reading the columns in the arrangement shown in Table 1, bytes pairs "ae," "ei" and "im" are the inputs to the first dictionary on consecutive clock cycles. In what would be the last clock cycle, character "m" does not add a new dictionary entry to the first dictionary as it is the last symbol in that column and there is no subsequent symbol with which to form a new pair used for later compression. Likewise, bytes "bf," "fj" and "jn" are the inputs to the second dictionary on consecutive clock cycles, and so on, bytes "cg," "gk" and "ko" are the inputs to the third dictionary on consecutive clock cycles and so on, and bytes "dh," "hl" and "lp" are the inputs to the fourth dictionary on consecutive clock cycles, and so on, after four clock cycles.

A straight-forward implementation of a dictionary D may use an array such that the $i^{th}$ (i=0, 1, . . . , word size−1) element stores D[i]. However, since the lengths of strings in dictionary D are variable, the straight-forward implementation would not be efficient, nor trivial, on the fixed memory provided by an FPGA. A straightforward software implementation of dictionary D may use an associative array with a variable length string as the keys and compressed codes as values, for example, which may be implemented as a balanced binary tree. However, each memory lookup to see if a code is already known using a binary tree would take O(log(n)) operations, where n is the number of string/integer pairs being stored. Operations, in real time on an FPGA require O(1) behavior, meaning that an FPGA has only one clock cycle to compress the data in real time into a dictionary, or dictionaries, D. In addition, storing variable length strings as keys on an FPGA where memory sizes must be defined and fixed when the FPGA is programmed is non-trivial. In reverse, for decoding, each compressed code word (key) can point to a string of bytes (values) of unknown and variable lengths, also non-trivial on a FPGA. On decompression, the reverse (or inverse) of dictionary D is stored on the FPGA so as to emit one uncompressed (clear code) byte per clock cycle.

According to various embodiments, the sequence of bytes to be compressed, the variable length string, is stored as if it were a string in the "C" programming language. That is, each sequence of bytes is stored as null in a terminated list of characters with pointers to allow traversal across the list. Thus, the challenge of storing the variable length string on the FPGA is solved. The sequence of bytes (the string) is not strictly an array, as it would be in standard "C" programming language but is more akin to a singly linked list data structure in which the links, stored with each character, point to the previous characters in the string, respectively. Such a linked list data structure may be referred to as a "reverse-pointer table." The design allows compressed codes to point to variable length patterns in the FPGA memory without loss or error. The hash table is accessed via a hash function in hardware rather than the straight-forward binary tree. The hash function in combination with the reverse-pointer table supports real time memory access with the required one read, and one write operation per clock cycle.

The reverse-pointer table may be implemented using at least one FPGA having high-density, single-clocked, two port, synchronous memory, such as UltraRAM in UltraScale+™ FPGAs, available from Xilinx, Inc., for example. It is understood, however, that any FPGA and associated RAM with substantially the same capabilities as UltraRAM, discussed below, may be incorporated without departing from the scope of the present teachings. Generally, UltraRAM has eight times the storage capacity of conventional BRAM used in FPGAs, so such conventional FPGA does not contain enough BRAM for a 256 wide word design, as discussed herein, for example.

UltraRAM is compatible with FPGA columnar architecture, and therefore multiple UltraRAMs of the FPGA may be instantiated and directly cascaded in a column for the entire height of the FPGA. UltraRAM includes 288 Kb, single-clock, synchronous memory blocks arranged in one or more columns in the FPGA, where each memory block is configured as a 4K×72-bit memory block capable of storing up to 288K bits of data. A column in a single clock region of the FPGA contains 16 memory blocks.

Each UltraRAM has two ports, both of which address all 4K×72 bits of each memory block. A single URAM has eight times the capacity of a single BRAM, as mentioned above. Each of the two ports may independently perform either one read operation, or one write operation per clock cycle. However, internally the static random-access memory (SRAM) array of the FPGA uses single port memory cells. Dual port operation is achieved by executing first port operation followed by second port operation in a single clock cycle, where the first and second ports share a single clock input.

A hash table or dictionary, which provides the prerequisite O(1) behavior on the FPGA, may be used to implement the reverse-pointer table. Generally, the dictionary is implemented using a hash table in hardware, but may be implemented using a binary tree in software. The hash table (dictionary) contains two separate sub-tables, a number table and a data table, as shown in Table 2, below. Each element of the number table stores how many entries have been used in the data table, which has two entries per row. On the FPGA, it is determined whether an encoded symbol (a string) is already known, or whether a new code must be created. To do this, each hash entry requires up to a 12-bit compressed code, which can be up to 14-bits if required, an 8-bit character (the last symbol in the string) and a similar sized reverse-pointer to the previous symbol in the string, using up to 36-bits of the memory's available cell storage in total.

Each data table is implemented by one (or two) Ultra-RAM, for example, for performing a hash function on the wide word data stored in parallel, and each number table is implemented by two (or four) BRAM for each dictionary instance. The hash size matches the address space of the UltraRAM (4K×72 bits), so that the 72 bits of data may be used at each memory location to form two times 36-bit entries, as shown in Table 2. The data layout of the UltraRAM therefore has the same overall memory footprint as eight BRAM, for example, but is "narrower" and "deeper" than the eight times 36-bit entries, that would be required in BRAM, for example.

TABLE 2

| h(j, x) | Up to 36-bits data | Up to 36-bits data |
|---|---|---|
| \|0\| | $e_{0,0}$ | $e_{0,1}$ |
| \|1\| | $e_{1,0}$ | $e_{1,1}$ |
| \|2\| | $e_{2,0}$ | $e_{2,1}$ |
| ... | ... | ... |
| ... | ... | ... |
| ... | ... | ... |
| \|4095\| | $e_{4095,0}$ | $e_{4095,1}$ |
| number table | | data table |

The number table indicates how much of the capacity of the data table has been used. Therefore, using UltraRAM for the data table gives word-size*UltraRAM (likely 256 UltraRAM, which is approximately 20 percent of a large-scale conventional FPGA) and word-size*2*BRAM (likely 512 BRAM). In Table 2, each of the entries $e_{h,i}$ (e.g., $e_{0,0}$, $e_{1,0}$, $e_{2,0}$, ... and $e_{0,1}$, $e_{1,1}$, $e_{2,1}$, ...) in both columns is the structure that contains three values: the pointer (j), the last byte, or character, of the symbol string being compressed (x), and the reverse-pointer, calculated from j and x. For example, assuming a string to be compressed is the word "cat," the entry $e_{00}$ may be "t" and a reverse-pointer to another entry. That reverse-pointer may have "a" and a reverse-pointer to yet another entry, and that reverse-pointer may have "c" and a reverse-pointer to NULL. NULL indicates that there is no reverse-pointer and that is the start of the multi-symbol string. This arrangement solves the problem of having variable length of strings in the dictionary. Notably, each column in Table 1 is equivalent to a string of input symbols in FIG. 6. For example, the first column in Table 1 may be equivalent to the first input stream 631 for the first dictionary in FIG. 6. Likewise, there is one Table 2 for each column in Table 1, and thus each input stream in FIG. 6. So, for example, a 256 wide word design (as opposed to the four wide word design in FIG. 6) would effectively provide 256 different instances of Table 2.

As another example of compression, it may be assumed that the string to be compressed on one input stream (e.g., first input stream 631), thus addressing one dictionary (e.g., first dictionary), is "a b ab aba b" (without spaces, although spaces are included here for clarity), where the compressed string according to the LZW compression algorithm would be 97 98 256 258 98, for example. The first "a" and the first "b" are the first instances of these characters, so they cannot be compressed, but when the characters "a" and "b" are first observed, a new multi-symbol string "ab" is added to the first dictionary that uses the code 256, then, when the second instance of "ab" is seen in the stream, this new code can be assigned to the second instance of "ab" and thus the multi-symbol string is compressed into a single code. Likewise, when the first "ab" is observed, there is the opportunity to create a new multi character code "aba", which has the value 258 into the dictionary. Note that the character code "ba" was assigned value 257, but the algorithm automatically maximizes compression, so "aba" with value 258 is preferred. When the second instance of "aba" is observed, this new code can be used for the multi-symbol string. Note that the outputs for "a" and "b" are simply the respective (illustrative) numeric representations 97 and 98 of characters "a" and "b" in the ASCII table.

For "ab," which includes characters that have been previously seen, there will be an entry in the dictionary with reverse-pointer: 256, x:98, j:97. The temporary output is the character x:98 (i.e., character "b"), and then the pointer j:97 (i.e., character "a"). In this case, the pointer j is simply pointing to the character "a." The "a" and "b" are reversed, so the compressed value 256 becomes "ab" when decompressed. The entry would appear in row h(j=256, x=97)=512 of the dictionary, which would most likely be $e_{512,0}$, unless another hash function had previously provided 512, in which case the entry would be in $e_{512,1}$. If it happens again, a conflict arises and addition of this this new multi-symbol string to the dictionary would not occur (since the compression needs to be done in one clock-cycle, otherwise there are ways to handle conflicts), making compression slightly less efficient. Therefore, the hash function h(j,x) needs to be efficient, and allow for all 4096 addresses, in the example, to be accessed uniformly to minimize the possibility of conflicts.

Continuing the example, for "aba," which also includes characters that have been previously seen, there will be an entry in the dictionary (calculated with h(j,x)) with reverse pointer:258, x:97, j:256. The temporary output is the character x:97 (i.e., character "a"), and then the pointer j:256. The pointer j:256 goes to the previous location, where the reverse-pointer is 256. In this case, the same procedure described above is followed, again providing the output of "ab," which is appended to the previous character, resulting in "aba." The "aba" here is actually reversed, although in the present example, it does not matter. If the order of the character did matter, e.g., in the "cat" string example above, the order would be reversed when decompressing. The output for "aba" is 258. The final character is simply "b," and since there is no further string to concatenate it with, the output is simply 98 (i.e., character "b").

Notably, UltraRAM is not as flexible or as high performance as BRAM, which may add latency whenever the data arrives at a clock/line rate with one compression operation on every clock cycle and there is a delay between read and write operations. To mitigate this risk, the compression algorithm may be run with up to "n" additional clock cycles added between the insertion of a new code word (write operation) and the possible use of that code word (read operation) to compress data. This results in the encoding and the decoding algorithm operating correctly, even with additional latency, although there may be a slight reduction in compression due to the new code words being unavailable up to "n" clock cycles later as compared to a classic LZ77 or LZ78 compression algorithm, for example.

The hash function h(j,x) implemented using Table 2 is provided by Equation (1),where ">>" and "<<" mean bitwise shift to the right and the left, respectively, "^" stands for a bitwise exclusive OR (XOR) logic operation, and "&" stands for a bitwise AND logic operation:

$$h(j,x)=((j>>4)\char`\^(j<<2)\char`\^(x<<4))\&"0xFFF"$$  Equation (1)

The hash function h(j,x) has two input parameters, reverse-pointer (j), which is 12-bits, and character (x), which is 8-bits. The hash function h(j,x) calculates a new row on every clock cycle where a row is shown in Table. 2, for example. So, for h(j=0, x=1)=16, for example, row 16 of the number table in Table 2 would be accessed. The number sub-table for Row 16 is going to contain either a 0, 1, or 2, depending on how many entries are full in the data sub-table in Table 2. If row 16 is 0 or 1, then at either $e_{16,0}$ or $e_{16,1}$ the character x is written. If row 16 is 2 (i.e., this row is full), then this is a conflict, and we cannot add an entry for this newly hashed string, this will result in the potential for slightly less than optimal compression if this newly hashed string were encountered later in the data stream. The character is each symbol, and the reverse-pointer associates this symbol with a previous symbol in the arrangement shown in Table 1. The hash function h(j,x) has 12-bit output addresses (e.g., 4096 different addresses), as opposed to 10-bit output addresses if BRAM were used, and is able to access all of the output addresses uniformly. In other words, one address should not be accessed many more times than any other address. The hash function h(j,x) uses only bitwise operations, so that it is easier to implement in hardware, e.g., on an FPGA, and consistently generates different hash values for similar strings in real time.

As with any hash function, collisions are possible. A collision is a situation in which dissimilar strings have the same hash value. If both locations at a row have been used, there is a conflict (discussed above), meaning that new compressed code for the string cannot be added to the dictionary and the existing smaller code must be used. This results in some loss of potential compression but enables real time operation as a second look-up that attempts to resolve the hash conflict cannot be achieved in a single clock cycle.

Figure 7:
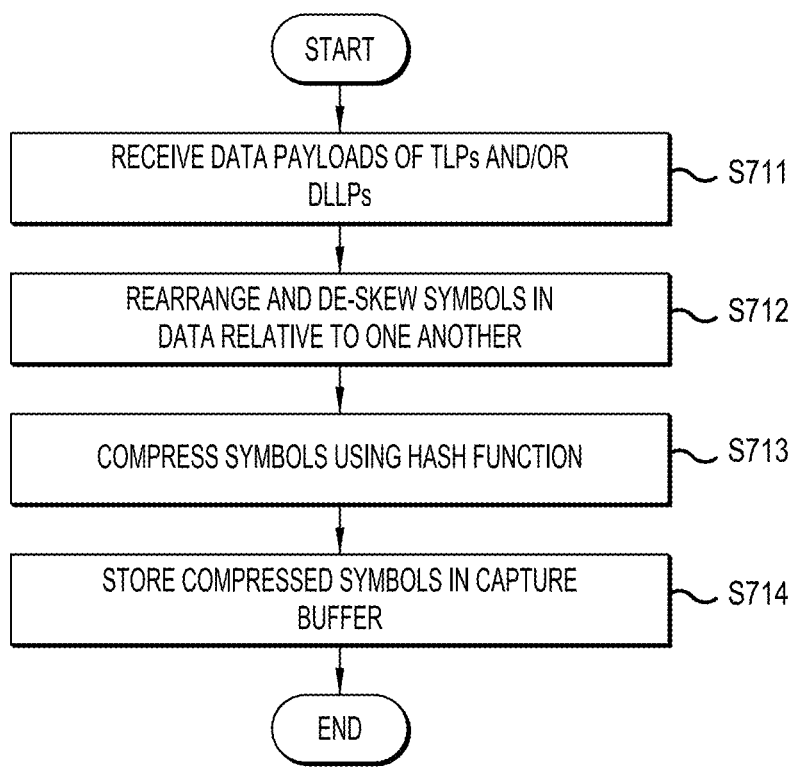
FIG. 7 is a simplified flow diagram illustrating a method of performing parallel data compression of data payloads to be stored in a capture buffer of an interposer circuit during communication of the data over a data link according to a high-speed, layered packet-based protocol, according to a representative embodiment.

FIG. 7 is a simplified flow diagram illustrating a method of performing parallel data compression of data payloads to be stored in a capture buffer of an interposer circuit during communication of the data over a data link according to a high-speed, layered packet-based protocol, according to a representative embodiment.

Referring to FIG. 7, performing parallel data compression includes receiving symbols of the TLPs and/or the DLLPs, including respective data payloads, at the interposer circuit 120 in multiple serial high-speed data lanes, such as PCIe lanes, of the high-speed data link 130 in block S711. In block S712, the symbols of the TLPs and/or the DLLPs are de-skewed into a serial stream of wide words (e.g., serial stream 620) that arrive each clock of a clock cycle. In block S713, the wide words are arranged into input streams (e.g., first to fourth input streams 631-634). Each input stream includes symbols from the same position of each wide word arriving on each clock of the clock cycle, such that each symbol is positioned with the next symbol in the correct position to form the input stream, up to 256, or more, bytes wide. That is, the interposer circuit 120 may grab and de-skew 256, or more, data symbols (bytes) to compress at a time from the (up to) 16 lanes as provided by the high-speed protocol to form a wide word to be compressed on each clock of a clock cycle. In the above discussion, bytes and symbols are assumed to have 8-bits each, so the terms are used interchangeably with regard to the wide words and the compression.

In block S714, the arranged symbols are compressed using the hash table, which implements a hash function indicated by Equation (1) and provides pointers to previous symbols. In block S715, the compressed symbols are stored in the capture buffer 125. The compressed symbols may be decompressed by the interposer circuit 120 and/or the UI computer 110 running the protocol analyzer in order to analyze the data payload in accordance with the high-speed data protocol.

The processes discussed above with reference to blocks S711-S715 of FIG. 7 may be referred to as protocol domain specific compression techniques. This is because each of the processes exploits the design of the protocol in order to compress or reduce the amount of data needed to be stored in the capture buffer 125 without loss of information. In addition, because the interposer circuit 120 is operating as the "man-in-the-middle" regarding the DUT 140 and the host computer 150, certain assumptions may be made about how the protocol traffic is captured and processed. Also, the host computer 150 and the use-case of the test itself may have further bearing on how the data may be reduced without loss of fidelity As mentioned above, compression may be performed on the data payload of the TLPs and/or the DLLPs or on both the data payload and the header. When the compression is performed on both the data payload and the header, the complete wide word is passed to the compressor, in its entirety. When the compression is performed only on the data payload, other techniques for reducing the amount of data stored with regard to the header of the wide word are performed, as discussed above, such as removing data integrity fields and removing known fields, and then the compression is performed on the remainder. In an embodiment, gaps first may be removed to reorganize the data payload into a new 256 byte wide word prior to compression to increase efficiency.

Decompression

In various embodiments, the compressed data may be decompressed when needed. Decompression does not require access to a copy of the dictionaries from the compression stage, although the dictionaries may be used. Rather, decompression of a compressed wide word data input generally requires only a copy of the combined compressed output stream that represents the wide word compressed data as a single stream of properly ordered compressed codes. This is especially useful on the UI computer 110, since only the compressed data is sent to the UI computer 110 over the USB or ethernet link, and not both the compressed data and a complete set of the dictionaries.

Storing the compressed data as a single uninterrupted gap-free sequence (stream) provides the optimal data storage mechanism. However, to decode the symbols correctly, the ordering of the data in the output stream of data produced by the compression is important. The decompression must be able to identify which compressed symbols belong to which individual original wide word input stream (e.g., first input stream 631 to fourth input stream 634), so that the compressed symbols may be addressed to the correct dictionary, Di, where i=0, 1, 2, . . . , wide word−1.

The conventional LZW compression algorithm, for example, writes compressed symbols to the output stream as they are created. Therefore, without adaption for a wide word system, the LZW compression algorithm (and other conventional compression algorithms) will result in the loss of ordering information when the multiple output streams, respectively corresponding to the input streams, are merged into an ideal single gap-free output stream.

Figure 8:
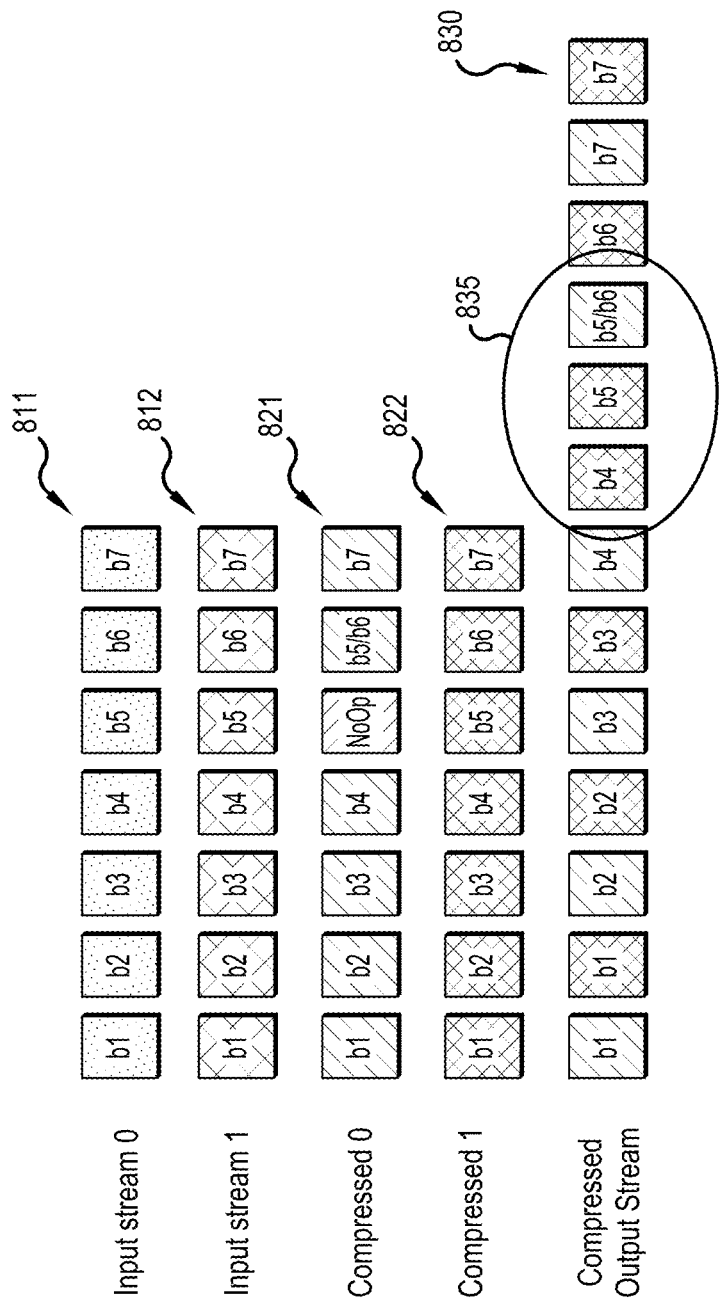
FIG. 8 shows symbols of wide word data input for decompression using a conventional decompression technique.

The creation of a compressed symbol representing one or more uncompressed symbols will result in a reordering of the wide word compressed output stream in a capture buffer. FIG. 8 shows an example of symbols of wide word data input for decompression produced using a compression technique described above, for purposes of illustration.

Referring to FIG. 8, first input stream 811 (Input stream 0) and second input stream 812 (Input stream 1) of wide word data are input for compression. The first and second input streams 811 and 812 essentially correspond to the first and second input streams 631 and 632, discussed above with reference to FIG. 6, for example, although the symbols numbered differently for the sake of convenience. First compressed (intermediate) stream 821 (Compressed 0) is calculated for the first input stream 811, and represents the ordering of operations in an intermediate step as the data is compressed and just before the data is written to the capture buffer during the compression process. Likewise, the second compressed (intermediate) stream 822 (Compressed 1) is calculated for the second input stream 812, and represents the corresponding ordering of operations in the intermediate step as the data is compressed and just before the data is written to the capture buffer during the compression process. A single, gap-free final compressed output stream 830 represents data as it would be stored in order, however the capture buffer has been ordered such that the subsequent ordering of output symbols for purposes of decompression would be unrecoverable due to the presence of a no-operation ("NoOp") entry in first compressed stream 821, as discussed below.

In FIG. 8, "bn" indicates a symbol at the nth position in a stream "i", and "Di" indicates the corresponding dictionary for stream "i", i.e., the ith dictionary. Similar to the compression process discussed above, each input of a set of wide word symbols is treated separately for decompression because each input stream of wide word symbols (e.g., first input stream 631 to fourth input stream 634) was originally compressed using its own fragmented part of the larger dictionary (D). Therefore, the same matching information must be used during decompression. In the example of FIG. 8, the rule is that the symbols of the first input stream 811 must address first dictionary D1, the symbols of the second input stream 812 must address second dictionary D2, and so on.

Generally, the input and output of the compression algorithm processes data in terms of operations. During the compression stage, one operation takes one single clock cycle (which is a hard constraint), and processing the input data has to occur in real time. During the decompression stage, however, there is no such hard constraint, meaning that a single operation may take more than one clock cycle, if necessary. For ease of explanation, the decompression process will first be discussed in terms of operations, then an example will be provided of mapping the operations to clock cycles on the hardware (e.g., FPGA or ASIC).

With regard to ordering of symbols in the gap-free compressed output stream 830, the illustrative compression process shown in FIG. 8 would normally cause an output to be skipped at position b5 (operation no. 5) in the first input stream 811, which uses first dictionary D1, when symbols b5 and b6 are compressed into a single code during the compression process. This skip is indicated by the NoOp entry in the first compressed stream 821 calculated for the first input stream 811. Generally, NoOps occurs when a new compressed code that represents two or more original input symbols is about to be emitted, but have not yet been emitted. This happens when multiple input symbols are compressed into a single code. For example, compression of two original input symbols results in one NoOp, and compression of three input symbols results in two NoOps. Therefore, every time an input symbol is consumed, the compression algorithm tests to see if that input symbol can be compressed. When a longer multi-symbol string that matches the input symbol is already known, the input symbol can be compressed with the longer multi-symbol string. Whenever this occurs, the NoOp entry is introduced since there is no longer a symbol at that location. A new compressed code, representing the new combined and compressed symbols b5 and b6, is therefore not emitted until symbol b6 in the output for the first input stream 811 (operation no. 6).

In non-wide word compression, which has a single output stream, NoOp is not an issue since the new multi-symbol string b5/b6 would still be the next symbol in-line following symbol b4 in the gap-free compressed output stream. That is, with one input stream to compress, there is no opportunity for reordering to occur. However, in wide word compression, one or more NoOps may result in reordering of the input symbols when the various input streams are combined into the ideal single gap-free output stream. Notably, a single gap-free compressed output stream is required for an optimal space efficient layout in the capture buffer.

In the depicted example, the single compressed output stream 830 represents the data in the capture buffer that has not been ordered correctly due to the presence of NoOp in the first compressed stream 821. As shown, the compressed output stream 830 receives the symbols alternately between the first compressed stream 821 and the second compressed stream 822. That is, the compressed output stream 830 receives symbol b1 from the first compressed stream 821, symbol b1 from the second compressed stream 822, symbol b2 from the first compressed stream 821, symbol b2 from the second compressed stream 822, and so on. However, the NoOp entry in the first compressed stream 821 is skipped, such that symbol b4 in the second compressed stream 822 is followed immediately by symbol b5 also from the second compressed stream 822, which is then followed by multi-symbol string b5/b6 from the first compressed stream 821. If the compressed output stream 830 were to be used as input for decompression, data for each dictionary would become unrecoverable in the original order because the ordering that ensures that the first input stream 811 is addressed to the first dictionary D1 and the second input stream 812 is addresses to the second dictionary D2 is lost and cannot be recovered. For example, the two adjacent symbols b4 and b5 originating from the second input stream 812 appear at consecutive positions in the compressed output stream 830 (indicated by circle 835), so it would be incorrectly assumed, if alternating symbols were directed at alternating streams in a round robin fashion, that they originated from different input streams. Also, the multi-symbol string b5/b6 come from symbols b5 and b6 originating in the first input stream 811 should appear after symbol b5 originating from the second input stream 812. Therefore, a more predictable ordering is needed to support recovering the data from multiple input streams in the wide words.

One solution is to include additional information that indicates the original input stream (e.g., first input stream 811 or second input stream 812) and associated dictionary of each symbol bn. The additional information would allow the correct dictionary Di to be addressed. However, including the additional information is counter-productive to the goal of maximizing available data storage, since the amount of stored data would be increased by the amount of additional information required to identify the separate input streams once the data has been interleaved during compression into a single gap-free output stream in the capture buffer. Alternatively, data from the dictionaries may be placed in separate locations, respectively, effectively creating multiple stripes (rows) of compressed data, one stripe for each dictionary. However, this technique is also sub-optimal because exhausting the available space on one stripe halts the capture process. That is, once one stripe is full, further data cannot be written to the other stripes in the capture buffer even though some still may have available space.

In comparison, according to embodiments herein, compressed data are written to the capture buffer in the order that the first symbol in a multi symbol string would have originally appeared (prior to compression), thereby avoiding reordering. This is done by using the positions of the symbols in the gap-free compressed output stream as if the gap-free compressed output stream were a multi-symbol string that has not been compressed, and not the positions of the symbols when the gap-free compressed output stream was created during compression.

Figure 9:
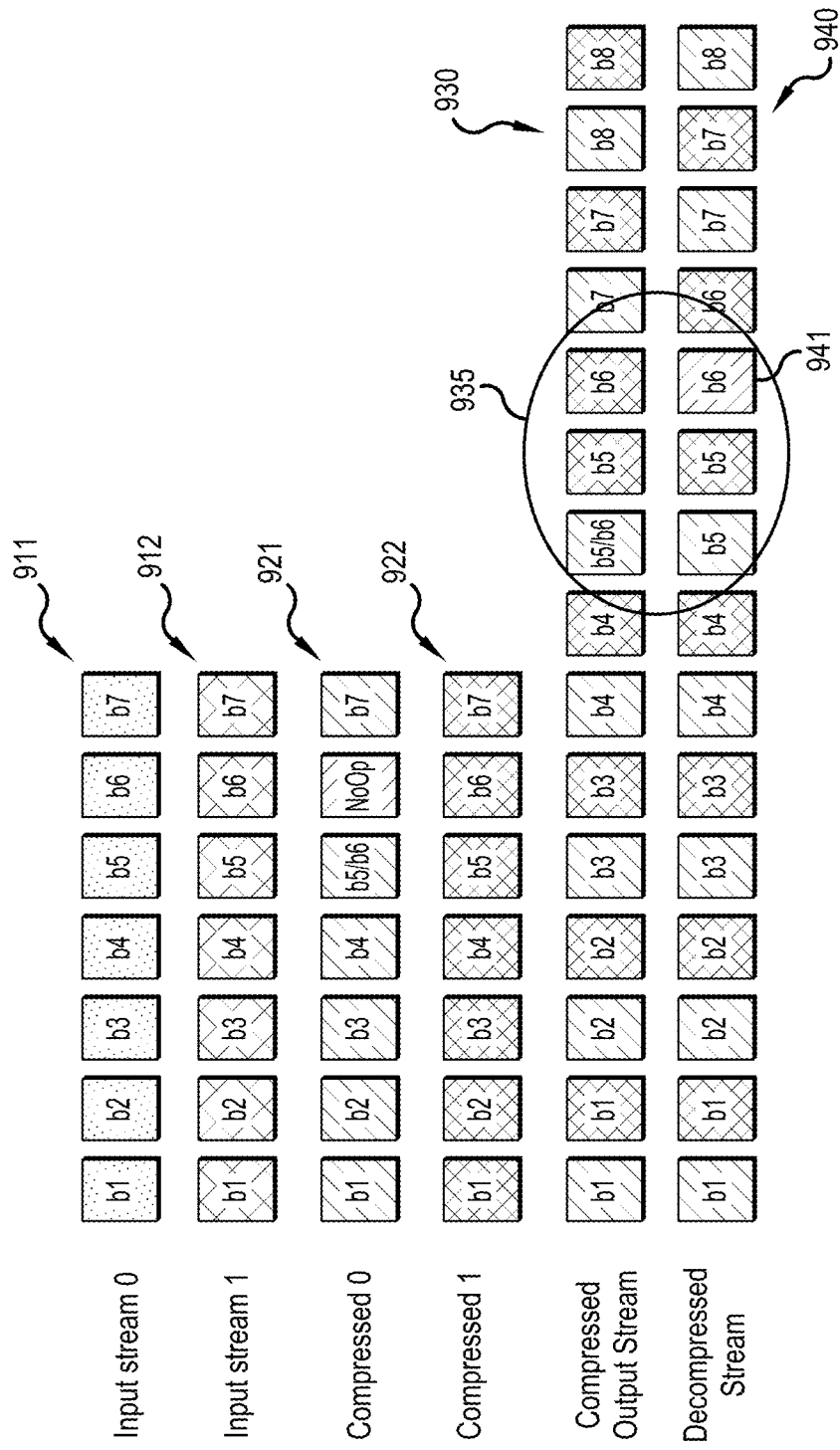
FIG. 9 shows symbols of wide word data reordered for input for decompression, according to a representative embodiment.

FIG. 9 shows an example of ordering symbols of wide word data input for decompression, according to a representative embodiment. Referring to FIG. 9, a compressed multi-symbol string representing two original incoming symbols b5 and b6 from first input stream 811 is written at the position of the first incoming symbol b5, and not at the position of next incoming symbol b6. That is, the multi-symbol string b5/b6 is written in operation no. 5, and not operation no. 6, as shown in FIG. 8. By doing this "first incoming symbol" reordering, enough information is preserved to recover the original order of the symbols b5 and b6 from the compressed output stream 930 stored in the capture buffer. When the combined multi-symbol string b5/b6 is decoded, the retrieved data code may be interrogated to see that the multi-symbol b5/b6 represents two the original uncompressed symbols b5 and b6 for the first input stream 911, which is also known to belong to the first dictionary D1. The ordering therefore has been preserved. Also, the symbol cannot be written early, the rest of the other streams' symbols may be delayed in a temporary buffer to buy time for reordering the outputs.

More particularly, FIG. 9 shows first input stream 911 (input stream 0) and second input stream 912 (input stream 1) of wide word data that are provided following for compression. The first and second input streams 911 and 912 may respectively correspond to the first and second input streams 631 and 632, discussed above with reference to FIG. 6, although the symbols numbered differently for the sake of convenience. FIG. 9 further shows first compressed stream 921 (compressed 0) calculated for the first input stream 911 and reordered according to the present embodiment, and second compressed stream 922 (compressed 1) calculated for the second input stream 912, which represent the ordering of operations in an intermediate step before the data is written to the capture buffer as gap-free compressed output stream 930 during the compression process. Subsequent decompression is performed on the compressed output stream 930 according to a known decompression algorithm. The resulting decompressed stream 940 shows data following the decompression that has been ordered correctly, despite the presence of the NoOp entry in the first compressed stream 921.

According to the depicted embodiment, the compressed output stream 930 for the wide words is written during compression so that consecutive compressed symbols from alternating first and second input streams 911 and 912 follow each other based on the first symbol in the uncompressed strings' original position. When the original incoming symbol cannot be compressed, it is emitted at the correct location during the correct operation, regardless. When one or more symbols are compressed into a multi-symbol string, the compressed codes are temporarily buffered and then emitted in the first incoming symbol order so that the compressed code appears as if it were created on the first operation corresponding to the first symbol of the multi-symbol string, and not on the last operation for the multi-symbol string when the compression algorithm is finally created. This interleaving requires adding an appropriate delay when emitting the symbols for all input streams whenever input symbols in any one of the input streams are compressed into a new multi-symbol string.

For example, in the illustrative dual wide word system described herein (for simplicity of explanation), the compressed output is always emitted pair-wise first input stream 911 and then second input stream 912. In addition, whenever multiple symbols are compressed into one new multi-symbol string, the new compressed symbol code is written at the position of the initial/first pre-compressed symbol in the new code. For example, compressed multi-symbol string b5/b6 is written at the position symbol b5 in operation no. 5, and not at the position of symbol b6 in operation no. 6. Therefore, in the depicted example, the compressed output stream 930 represents the data in the capture buffer that has been ordered correctly, according to the representative embodiment, due to the presence of NoOp in the calculated compressed stream 921 in the position of the symbol b6 instead of the positon of symbol b5.

As shown, the compressed output stream 930 receives the symbols alternately between the first compressed stream 921 and the second compressed stream 922. That is, the compressed output stream 930 receives symbol b1 from the first compressed stream 921, symbol b1 from the second compressed stream 922, symbol b2 from the first compressed stream 921, symbol b2 from the second compressed stream 922, and so on. This interleaved process goes on to include receiving the multi-symbol string b5/b6 from the first compressed stream 921 after receiving the symbol b4 from the second compressed stream 922, and receiving the symbol b5 from the second compressed stream 922. Then the switched NoOp entry is still considered, but is not written in the compressed output stream 930, therefore the next symbol is symbol b6 from the second stream 922, then symbol b7 in the first compressed stream 921 is received followed by the symbol b7 from the second compressed stream 922. Accordingly, in the depicted order, data for each dictionary is recoverable in the original order as shown in the decompressed stream 940 (also indicated by circle 935), enabling the recovery of the data from the multiple input streams in the wide words. In particular, the symbol b6 (indicated by reference no. 941) from the first compressed stream 921 is correctly positioned immediately following the symbol b5 from the second compressed stream 922.

By performing the "first incoming symbol" reordering (de-interleaving), the two prerequisite pieces of information required to reconstruct the data in the correct order are preserved. First, in the depicted example, the multi-symbol string b5/b6 is known to have arrived at the position of the symbol b5 in the first input stream 911 instead of at the position of the symbol b5 in the second input stream 912, and is therefore addressed in the first dictionary D1. Second, upon examining the retrieved data for the multi-symbol string b5/b6, it is known that the length of the eventual uncompressed string will be more than one symbol in length. Therefore, when decoding the compressed multi-symbol string b5/b6, e.g., to obtain the decompressed stream 940, the symbol b5 is written out first and the symbol b6 is written out second when the correct time comes. Both of the symbols b5 and b6 are thus written in their correct positions in the final decompressed stream 940. In addition, since the eventual length of the multi-symbol string b5/b6 is known to be two uncompressed symbols, the dictionaries to which the next codes in the compressed output stream 930 belong may be calculated. Notably, in a hardware implementation using an FPGA (or ASIC), the symbols are reversed due to the reverse-pointer technique, discussed below.

In other words, when a single compressed code represents multiple input symbols, the length and position of decompressed symbol can be calculated according to embodiment herein. In the depicted example, two bytes are shown at the position of the byte b5 in the compressed output stream 930. This information may be used to calculate how to correctly read the decompressed symbols for all the other interleaved input streams to provide the decompressed stream 940.

Figure 10:
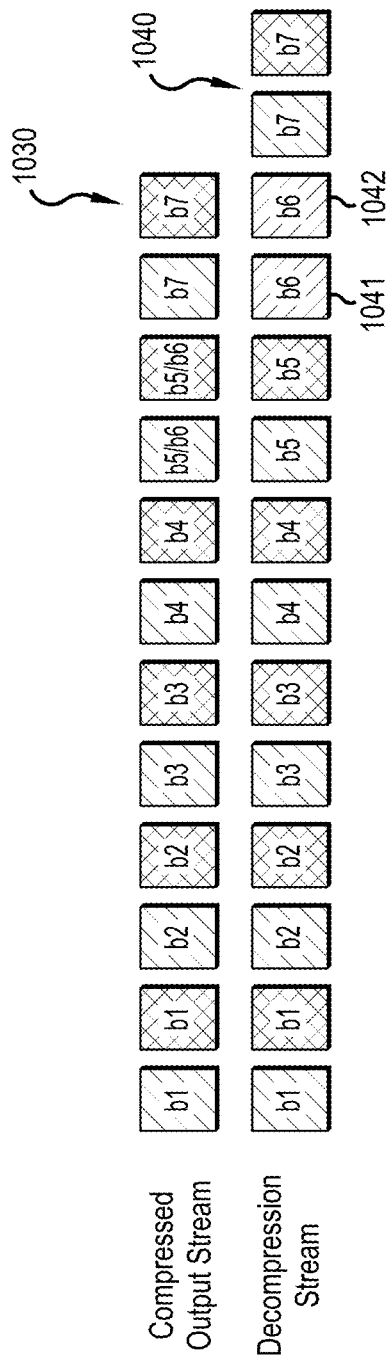
FIG. 10 shows an additional example of reordering symbols of wide word data input for decompression, according to a representative embodiment.
Figure 11:
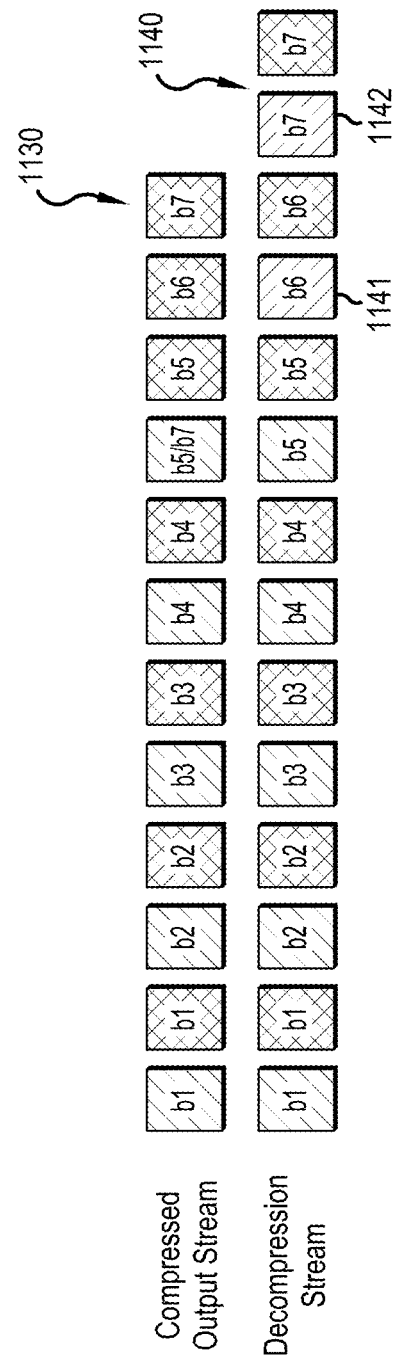
FIG. 11 shows an additional example of reordering symbols of wide word data input for decompression, according to a representative embodiment.

FIGS. 10 and 11 show additional examples of ordering symbols of wide word data input for decompression, according to representative embodiments. Referring to FIG. 10, it is assumed that the multi-symbol string b5/b6 is in the position of the symbol b5 in each of the first and second compressed stream (not shown). Therefore, the compressed output stream 1030 receives multi-symbol string b5/b6 from the first compressed stream following the symbol b4 from the second compressed stream, and receives multi-symbol string b5/b6 from the second compressed stream following the multi-symbol string b5/b6 from the first compressed stream. The subsequent decompressed stream 1040 therefore has the correct order, indicated by the symbol b6 (indicated by reference no. 1041) from the first compressed stream and the symbol b6 (indicated by reference no. 1042) from the second compressed stream being correctly positioned immediately following the symbol b5 from the second compressed stream.

Referring to FIG. 11, it is assumed that the multi-symbol string b5-b7, indicating combined and compressed symbols b5, b6 and b7, is in the position of the symbol b5 in the first compressed stream (not shown). Therefore, the compressed output stream 1130 receives multi-symbol string b5-b7 from the first compressed stream following the symbol b4 from the second compressed stream, and then consecutively receives symbols b5, b6 and b7 from the second compressed stream following the multi-symbol string b5-b7. The subsequent decompressed stream 1140 therefore has the correct order, indicated by the symbol b6 (indicated by reference no. 1141) from the first compressed stream being correctly positioned immediately following the symbol b5 from the second compressed stream, and the symbol b7 (indicated by reference no. 1142) from the first compressed stream being correctly positioned immediately following the symbol b6 from the second compressed stream.

The hardware implementation using an FPGA (or ASIC) has limited memory available, so the reverse-pointer technique is used to efficiently store multi-length strings (multi-symbol strings). Therefore, to perform successful decompression, an inverse structure must be created for the multiple dictionaries during the compression phase, discussed above with reference to Table 2, for example.

Figure 12:
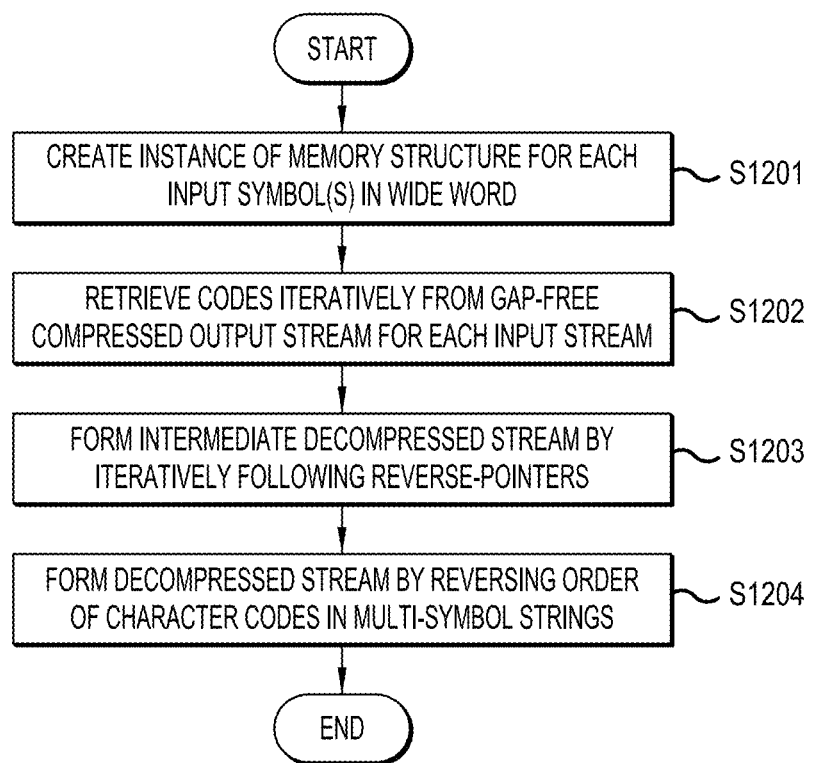
FIG. 12 is a flow diagram showing a method of creating inverse structure for decompression, according to a representative embodiment.

FIG. 12 is a flow diagram showing a method of creating inverse structure for decompression, according to a representative embodiment. Creating the inverse structure generally requires four decoding steps, where each decoding step for each decoded output symbol (byte) may be considered one operation. Each operation includes either (i) reading a compressed code for the gap-free compressed output stream and emitting an uncompressed symbol represented by the compressed code, or (ii) when the compressed code is represented by a multi-symbol string, emitting the individual symbols in the multi-symbol string one-by-one, in the correct order, until the complete string has been written out.

Referring to FIG. 12, in step S1201, an instance of a memory structure is created for each of the incoming input symbols in the wide word. An example of an instance of the memory structure is shown in Table 3A, below. Table 3A is the inverse of the compression dictionary for each input dictionary Di, and associates the base values for a byte (e.g., values 0-255) with the appropriate character code values and reverse-pointers. Notably, for the bytes 0-255, the reverse-pointers are NULL entries, indicating that these bytes are always the first possible bytes (or characters) in any multi-symbol string. Therefore, Table 3A shows only the first possible characters of any possible multi-symbol strings that can be formed when decompressing the compressed output stream.

TABLE 3A

| Addr | reverse-pointer | character code |
|---|---|---|
| 0 | NULL | ˆ@ |
| ... | ... | ... |
| 97 | NULL | a |
| 98 | NULL | b |
| 99 | NULL | c |
| ... | ... | ... |
| 116 | NULL | t |
| ... | ... | ... |
| 255 | NULL | ÿ |

In step S1202, using the first incoming symbol reordering process described above, character codes for each separate input stream for each dictionary are iteratively read rom the gap-free compressed output stream, creating Table 3B.

TABLE 3B

| Addr | reverse-pointer | character code |
|---|---|---|
| 256 | 99 | c |
| 257 | 97 | a |
| 258 | 256 | c |
| 259 | 116 | t |

Referring to the example in FIG. 9, compressed codes are provided in the gap-free compressed output stream 930 for both the first and second input streams 911 and 912. For this stream of codes, the compressed codes are added to a separate copy of Table 3B for each of the first and second input streams 911 and 912 (and therefore each of the first and second dictionaries D1 and D2, respectively). For efficiency, as many operations may be performed in parallel as there are input streams. In FIG. 9, there are two input streams, so two operations may be performed concurrently and in parallel.

A more detailed example for a single input stream (first input stream) is described below, showing how to read the gap-free final compressed stream and how to decompress the compressed codes. The first input stream's portion of the combined and interleaved gap-free final compressed stream contains compressed codes for the original input stream using the first dictionary (D1). By way of example, the first input stream may contain the symbols (bytes) "cacatcat," which in this example compresses into the compressed codes "99, 97, 256, 116, 258." As previously noted, Table 3A is not required in memory, since the known ASCII table may be used to translate the characters from single byte values. Thus, for example, according to the ASCII table, "c"=99, "a"=97 and "t"=116. The compressed codes 256 and 258 represent multi-symbol strings since they are greater than 255 in value, and are stored in Table 3B. The compressed codes may be iteratively retrieved from the gap-free compressed output stream for the first input stream, while the same operation is performed in parallel for a separate instance of Table 3B (not shown) for a corresponding compressed second input stream, and so on. This process also creates the required data for decoding the second input stream using a second dictionary (D2).

With regard to the first input stream in the example, the iterative retrieval process of step 1202 includes first reading compressed code 99 of the output compressed codes, and adding the reverse-pointer value 99 to Table 3B at the next available location (addr) after 255, which is location addr=256 in the depicted example. The character code for the compressed code 99 at addr=99, which is "c," is then looked up and stored at addr=256 of the compressed code 256.

This process continues for the other compressed codes. That is, the iterative retrieval process further includes reading compressed code 97, adding the reverse-pointer value 97 to Table 3B at the next available location addr=257 (next location after addr=256), and looking up and storing the character code for addr=97, which is "a," at addr=257. The process then includes reading compressed code 256, adding the reverse-pointer value 256 to Table 3B at the next available location addr=258, and looking up and storing the character code for addr=256, which is "c," at addr=258. Notably, the addr=258 thus has a reverse-pointer value greater than 255, in which case the next operation will not read a new compressed code for the first input stream, but will follow the reverse-pointer to determine what action should be taken on the subsequent operation for the first input stream, as discussed below. The process then includes reading compressed code 116, adding the reverse-pointer value 116 to Table 3B at the next available location addr=259, and looking up and storing the character code for addr=116, which is "t," at addr=259.

In step 1203, an intermediate decompressed output stream is formed by iteratively following the reverse-pointers for each compressed code in the gap-free compressed output stream for the first input stream and the first dictionary. The intermediate decompressed output stream may be stored in a temporary buffer. For purposes of illustration, Table 3B may be considered a two single addressed dual ported memory structure stored in BRAM or DRAM memory on an FPGA or stored in dual port SRAM on an ASIC. The output of each operation should be one character.

As a result of the iterative process performed on the first input stream, an uncompressed output for each symbol string may be determined by following the chain of reverse-pointers until reaching a NULL entry as the reverse-pointer, where the NULL entry indicates the beginning of the multi-symbol string. While traversing the reverse-pointers, the length of each decoded multi-symbol string is record in a separate memory array L, which may be a third BRAM or FPGA "distributed memory," where memory array L[0] stores the length of a first string, L[1] stores the length of a second string, and so on. One character code is emitted on every operation. By following the reverse-pointers in this manner, the multi-symbol strings are written out back-to-front into a temporary queue and reversed in step S1204, discussed below.

In the present example, the first compressed code to decompress of the compressed codes "99, 97, 256, 116, 258" is the compressed code 99. Reading Table 3A, location addr=99 indicates that the reverse-pointer is NULL and that the character code is "c." Since it is a single character code, the length of the string is L[0]=1. The character code "c" is output, so that the temporary output stream for first input stream and the first dictionary therefore contains "c."

The next compressed code to decompress is compressed code 97. Reading Table 3A, location addr=97 indicates that the reverse-pointer is NULL and that the character code is "a." The length of the string is L[1]=1. The character code "a" is output, so the temporary output stream for first input stream and the first dictionary now contains "ca."

The next compressed code to decompress is compressed code 256. Since addr=256 is larger than the last address in Table 3A (addr=255), Table 3B is used. Reading Table 3B, location addr=256 indicates that the reverse-pointer is non-NULL, having a value of 99. Therefore, the first character code at the address value i+1 (i.e., 256+1=257) is read and output. The location addr=257 indicates that the first character code is "a." The reverse-pointer value of 99 of location addr=256 is followed to addr=99, which indicates that the reverse-pointer is NULL and the second character code is "c." Therefore, by following the reverse-pointer for compressed code 256 until reaching a NULL entry, the first and second character codes "a" and "c" are output as multi-symbol string "ac." Since there are two character codes, the length of this string is L[2]=2. Notably, the next compressed code for the first input is not read from the gap-free compressed output stream on the next iteration until both of the two character codes of the compressed code 256 have been output. The temporary output stream for the first input stream and the first dictionary now contains "caac."

The next compressed code to decompress is compressed code 116. Reading Table 3A, location addr=116 indicates that the reverse-pointer is NULL and that the character code is "t." The length of the string is L[3]=1. The character code "t" is output, so that the temporary output stream for first input stream and the first dictionary D1 now contains "caact."

The next compressed code to decompress is compressed code 258. Again, since addr=258 is larger than the last address in Table 3A, Table 3B is used. Reading Table 3B at location addr=258 indicates that the reverse-pointer is non-NULL, having a value of 256. Therefore, the first character code at the address value i+1 (i.e., 258+1=259) is read and output. The location addr=259 indicates that the first character code "t." The reverse-pointer value of 256 of location address 258 is followed to addr=256, which is also non-NULL (as discussed above). Therefore, the second character code at the address value i+1 (i.e., 256+1=257) is read and output. The location addr=257 indicates that the second character code "a." The reverse-pointer value of 99 for addr=256 is followed to addr=99, for which the reverse-pointer is NULL and the character code is "c," which is the third character code. Therefore, by following the reverse-pointer for compressed code 258 until reaching a NULL entry, the first, second and third character codes "t," "a" and "c" are output as multi-symbol string "tac." Since there are three character codes, the length of this string is L[4]=3. The temporary output stream for the first input stream and the first dictionary now contains "caacttac." Also, the respective sub-lengths are L[0]=1, L[1]=1, L[2]=2, L[3]=1 and L[4]=3. This information enables the strings for "c," "a," "ac," "t" and "tac" to be reversed to provide the correct order.

In step S1204, a decompressed stream for the first input stream and the first dictionary is formed by reversing the order of the character codes of the multi-symbol strings in the intermediate decompressed output stream from the temporary buffer. For example, "ac" becomes "ca" for the compressed code 256 and "tac" becomes "cat" for the compressed code 258. This is necessary because the structures in hardware hold reverse-pointers, and therefore the reversed strings must be reordered for any compressed symbol that encodes multiple bytes. In this example, a symbol that encodes three original characters, like "tac" will be emitted over three operation cycles in reverse as the correct string "c" then "a" then "t," to obtain "cat." Therefore, in step 1204, the multi-symbol strings of the temporary buffer are iteratively reversed to arrive at "c," "a," "ca," "t" and "cat" to form the output uncompressed stream. The multi-symbol strings are reversed according to their respective lengths, L[n], having a value greater than one.

In hardware (e.g., FPGA or ASIC), one character is emitted per operation. Therefore, in terms of operations, step S1201 may be performed one operation ahead the equivalent operation for step S1203. That is, the operation of step S1201 must be completed before attempting the equivalent operation for step S1203. Noting that every time the reverse-pointer is followed in step S1203, the stored length for this multi-symbol string will be incremented. This length information is applied in step S1204.

Updating and storing the length value takes one operation, but can be updated concurrently with other operations in the overall calculations performed in step S1203. In any event, the information in the length array cannot be utilized to emit the first unreversed character of a multi-symbol string until the last character of the reversed multi-symbol string has been computed by step S1203. Therefore, step S1204 occurs at least "Llongest" operations after the equivalent operation in step S1203, where "Llongest" is the string having the longest length L.

Step S1202 is executed in a pipeline just ahead of but overlapping with Step 1203. That is, step 1203 is computing input stream [n−1] while step 1202 is computing input stream [n]. In other words, the complete compressed code for step 1202 is computed before moving onto the same compressed code for step 1203. Step 1204 is overlapped but delayed by some number of operations that are dictated by the length of the longest multi-symbol string.

In hardware, the use model for decompressing data is scanning the capture buffer and searching the data for points of interest. Search time is less time critical compared to capture time so, if necessary, each decompression operation may take one-or-more clock cycles. Constraints on the time taken for decompression may therefore be more relaxed than for compression.

When dealing with multiple input streams in parallel, for compressed codes greater than 255, the length of the compressed string must be greater than one, as the compressed string is a multi-symbol string. Similarly, when following a reverse-pointer, a value greater than 255 means at least one more character must be read. Knowing that the compressed code represents a multi-symbol string, even though the string is not yet fully decoded, provides enough information to determine that the next compressed code for the input stream on the next operation should not be read. Instead, on the next operation that reads the next wide word input, instead of reading the next compressed code of the same wide word input, the reverse-pointer is followed to obtain the next character to be output during the next operation. In other words, when the multi-symbol string was created, there will have been one-or-more NoOp(s), which need to be accounted for when reading the interleaved gap-free compressed output stream of compressed codes created from multiple inputs and addressing multiple dictionaries Di.

In summary, in Table 3B, a reverse-pointer with a value between 0-255 indicates that the next symbol is the last in the multi-symbol string, and the process should move on to the next input compressed code for current input stream and dictionary. However, a reverse-pointer with a value greater than 255 indicates that there is at least one more reverse pointer to follow. After the next iteration, when the reverse-pointer for the previous step for the input stream is not NULL, the next compressed code in the gap-free compressed output stream for the input stream should not be read since, during compression, there will have been another NoOp produced. Therefore, instead of reading the next compressed code, the reverse-pointer is again followed to extract the character code to be output. Similarly, when the reverse-pointer that was followed is also non-NULL, this indicates that there is yet another character in the multi-symbol string to be output. When the reverse-pointer is a NULL, however, all of the combined symbols in the multi-symbol string have been extracted, and the process should move on to the next input compressed code for current input stream and dictionary.

For word size operations in parallel, on each operation "i," the next character code is read for the next input stream as long as the previous compressed code for that input stream is represented by a single character code. Otherwise, when the previous character code for the input steam is a multi-symbol string, reading the character code will also be skipped in favor of either the next character code from the next alternate input stream or skipping to the next input stream and so on, until arrival back at that the same input stream in the wide word, which marks the end of single iteration "i," where again either a character code is read for each input or a multi-symbol string is output for each input and dictionary, as appropriate. Notably, the first character code in each input stream/dictionary combination i=0 always represents a single character. In this way, the character codes in the compressed output stream are read in round robin fashion.

Figure 13A:
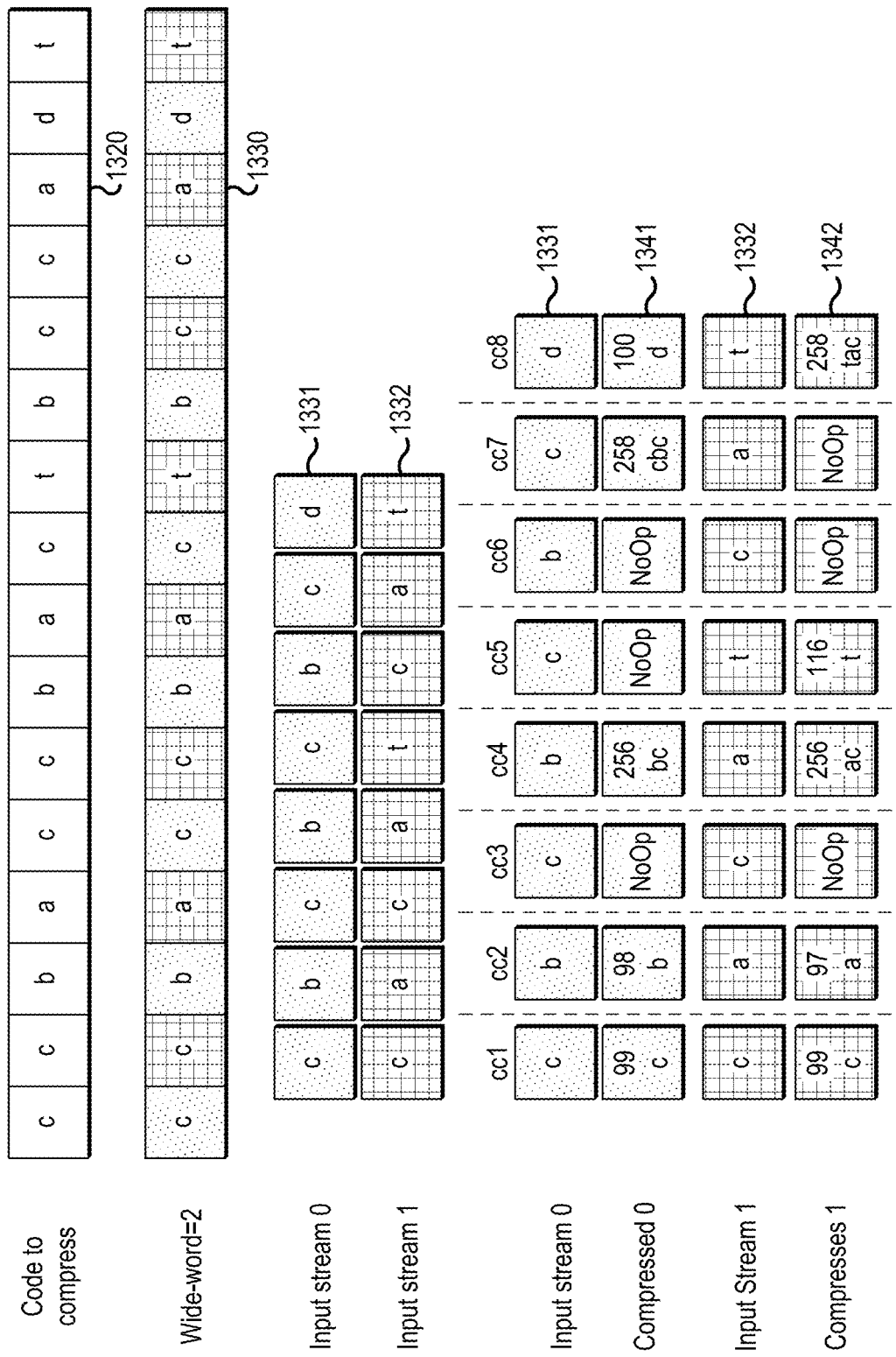
FIG. 13A shows parallel compression of wide word data for reordering symbols of the wide word data input for decompression, according to a representative embodiment.
Figure 13B:
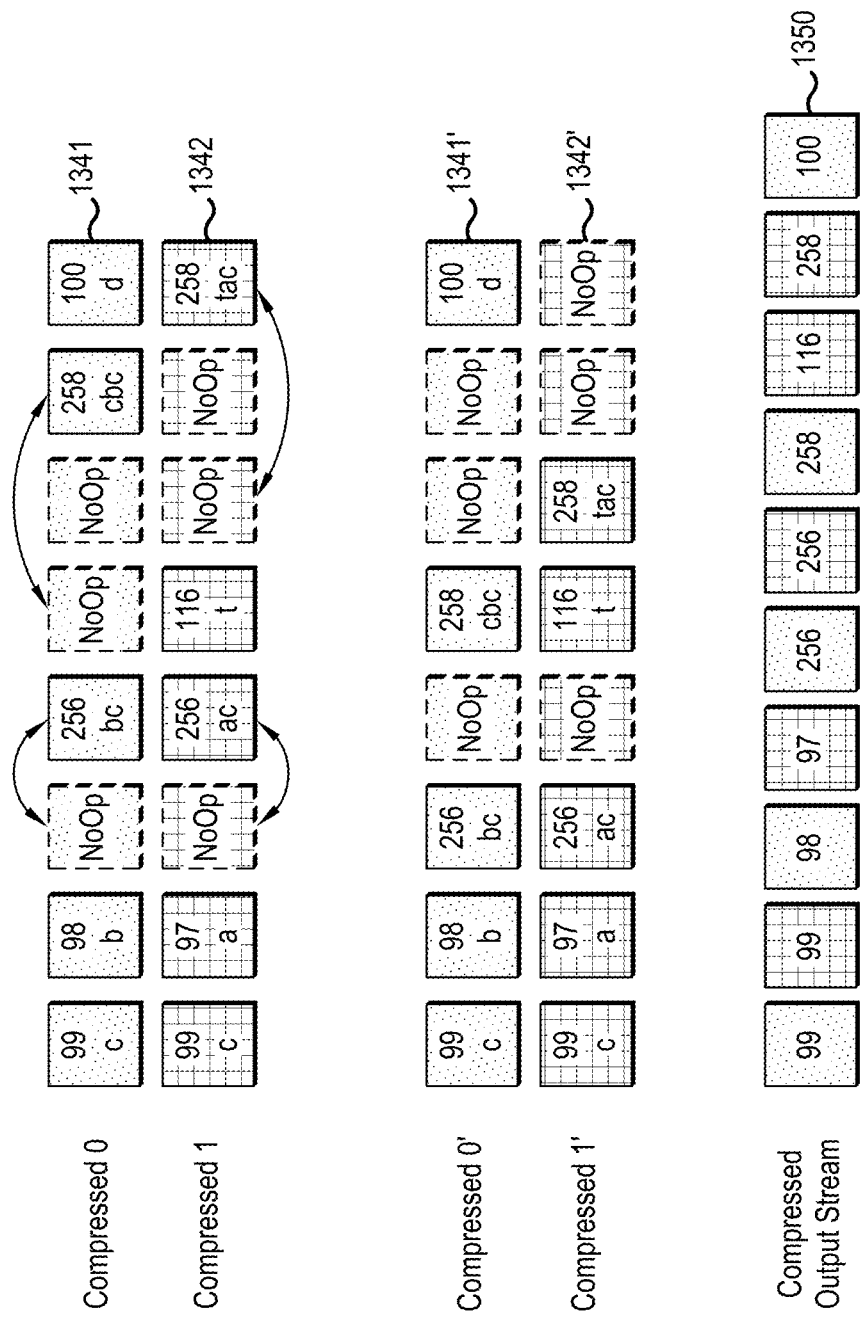
FIG. 13B shows reordering symbols of the wide word data input for decompression, according to a representative embodiment.
Figure 13C:
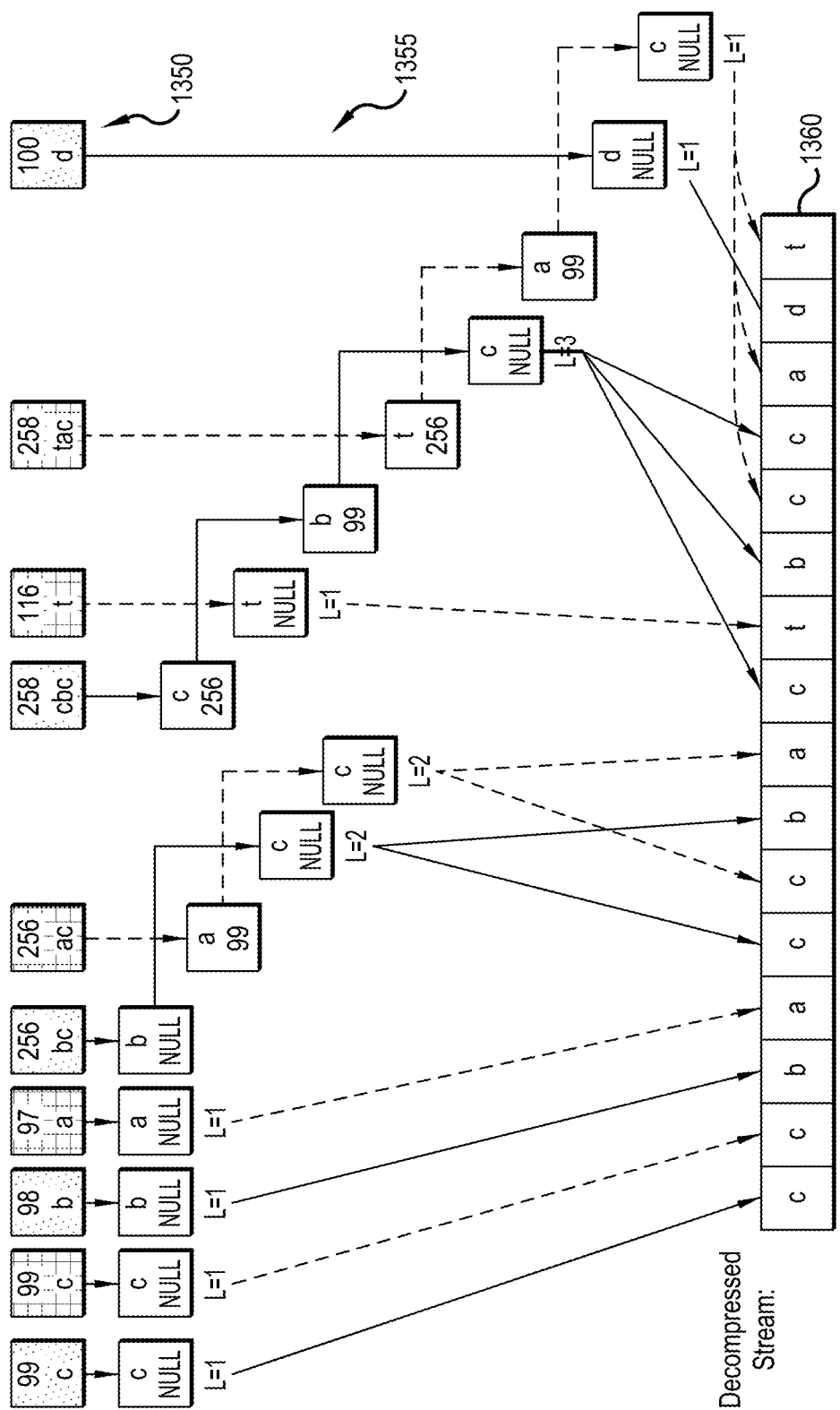
FIG. 13C shows decompression of reordered symbols of the wide word data, according to a representative embodiment.

In the examples in FIGS. 10 and 11, an iteration is performed in a pair-wise fashion since word size of the wide words is two. FIGS. 13A-13C similarly show an example of ordering symbols of multiple wide words input for decompression, according to a representative embodiment, where the wide word size is two.

Referring to FIG. 13A, a serial stream 1320 to be compressed includes 16 symbols (bytes) in two wide words, including symbols "ccbaccbactbccadt." The serial stream 1320 is arranged such that every other symbol is assigned to one of the two wide words, as shown by different shading in the serial stream of symbols indicated by reference number 1330. Accordingly, every other symbol is grouped together in terms of the compression into separate input streams, including a first input stream 1331 having symbols "cbcbcbcd" for first dictionary (D1) and a second input stream 1332 having symbols "cacatcat" for second dictionary (D2). Notably, second input stream 1332 is the same as the illustrative first input stream discussed above with reference to Tables 3A and 3B.

Parallel compression is performed on first and second input streams 1331 and 1332 in eight clock cycles, indicated by cc1-cc8, in accordance with the compression embodiments described above. The first and second input streams 1331 and 1332 may be compressed using a known ASCII table, for example. The compression of the first input stream 1331 provides first compressed stream 1341 (compressed 0) and the compression of the second input stream 1332 provides second compressed stream 1342 (compressed 1). In the depicted example, the first compressed stream 1341 includes compress codes "99, 98, NoOp, 256, NoOp, NoOp, 258, 100" and the second compressed stream 1342 includes compress codes "99, 97, NoOp, 256, 116, NoOp, NoOp, 258" (discussed above).

Referring to FIG. 13B, the first and second compressed streams 1341 and 1342 are reordered according to first incoming symbol reordering and stored in a temporary buffer, so that any multi-symbol strings are relocated to the position of the first symbol in the group of multiple symbols, as discussed above. In particular, in the first compressed stream 1341, the multi-symbol string represented by the compressed code 256 is moved from the fourth position to the third position and the NoOp entry is shifted one position to the right, and the compressed code 258 is moved from the seventh position to the fifth position and the NoOp entries are shifted one position to the right, thereby providing reordered first compressed stream 1341' (Compressed 0'). In the second compressed stream 1342, the multi-symbol string represented by the compressed code 256 is moved from the fourth position to the third position and the NoOp entry is shifted one position to the right, and the compressed code 258 is moved from the eighth position to the sixth position and the NoOp entries are shifted one position to the right, thereby providing reordered second compressed stream 1342' (Compressed 1'). Notably, the compressed codes 256 and 258 in the second compressed stream 1342 comprise different character codes than the compressed codes 256 and 258 of the first compressed stream 1341.

A final compressed output stream 1350 is formed by inputting symbols alternately from the reordered first and second compressed streams 1341' and 1342' in order. The NoOp entries are excluded from this process, so the compressed output stream 1350 is gap-free. Accordingly, the compressed code 258 from the reordered first compressed stream 1341' immediately follows the compressed code 256 from the reordered second compressed stream 1342', the compressed code 258 from the reordered second compressed stream 1342' immediately follows the compressed code 116 from the reordered second compressed stream 1342', and the compressed code 100 from the reordered first compressed stream 1341' immediately follows the compressed code 258 from the reordered second compressed stream 1342'.

Referring to FIG. 13C, decompression is performed on the compressed output stream 1350 to provide decompressed stream 1360, according to the representative embodiment, where the decompressed stream 1360 matches the original serial stream 1320 shown in FIG. 13A. The decompression is performed in operations iteratively from left to right in the depicted configuration. The compressed output stream 1350 is shown at the top of FIG. 13C, where the blocks showing the symbols and multi-symbol strings with corresponding addresses are separated for the sake of convenience. The decompression is performed in a series of iterative decoding operations using the respective reverse-pointers to determine the corresponding character code(s), as discussed above, forming an intermediate decompressed stream 1355, which may be stored in a temporary buffer. The final decompressed stream 1360 is formed by reversing an order of the character codes in each of the multi-symbol strings of the compressed output stream 1350.

For the sake of convenience, the intermediate decompressed stream 1355 in FIG. 13C is shown in its entirety, indicating the overall decoding process and the order of decoded character codes. However, the entire intermediate decompressed stream 1355 is not necessarily formed before proceeding to the next step of inputting the decoded character codes to the final decompressed stream 1360. That is, in some embodiments, the decoded character codes of the intermediate decompressed stream 1355 may be presented to the final decompressed stream 1360 in a piecewise fashion as the intermediate decompressed stream 1355 is being built, thereby reducing the size of the temporary buffer needed for the intermediate decompression. For example, each decoded character code may be input from the intermediate decompressed stream 1355 to the final decompressed stream 1360 when the corresponding reverse-pointer is NULL. Reaching the reverse-pointer of null requires multiple decoding steps for the multi-symbol strings (and order reversal when inputting to the final decompressed stream 1360), as mentioned above.

In the depicted example, the compressed code 99 from the reordered first compressed stream 1341' has a reverse-pointer to NULL, so the character code "c" is output to the first position of the intermediate decompressed stream 1355. The compressed code 99 from the reordered second compressed stream 1342' has a reverse-pointer to NULL, so the character code "c" is output to the next position of the intermediate decompressed stream 1355. The compressed code 98 from the reordered first compressed stream 1341' has a reverse-pointer to NULL, so the character code "b" is output to the next position of the intermediate decompressed stream 1355. The compressed code 97 from the reordered second compressed stream 1342' has a reverse-pointer to NULL, so the character code "a" is output to the next position of the intermediate decompressed stream 1355. The length of each of these strings is indicated as L=1.

The compressed code 256 from the reordered first compressed stream 1341' provides a multi-symbol string "bc," where the compressed code 256 has character code "b" and a reverse-pointer to 99, which has character code "c" and a reverse-pointer to NULL. Therefore, over the next two operations involving the reordered first compressed stream 1341', the character code "b" is output to the next position of the intermediate decompressed stream 1360 and the character code "c" is output to a position immediately after skipping the next position. (The order of the character codes "b" and "c" is switched when subsequently forming the decompressed stream 1360, as discussed below.) Similarly, the compressed code 256 from the reordered second compressed stream 1342' provides a multi-symbol string "ac," where the compressed code 256 has character code "a" and a reverse-pointer to 99, which has character code "c" and a reverse-pointer to NULL. Therefore, over the next two operations involving the reordered second compressed stream 1342', the character code "a" is output to the next position of the intermediate decompressed stream 1355 following the character code "b" from the compressed code 256 from the reordered first compressed stream 1341' and the character code "c" is output to a position immediately after skipping the next position. The length of each of these strings is indicated as L=2. Notably, the value of the string length L may be used to determine when the decoded compressed code may be input to the final decompressed stream 1360.

Next, the compressed code 258 from the reordered first compressed stream 1341' provides a multi-symbol string "cbc," where the compressed code 258 has character code "c" and a reverse-pointer to 256, which has character code "b" and a reverse-pointer to 99, which has character code "c" and a reverse-pointer to NULL. Therefore, over the next three operations involving the reordered first compressed stream 1341', the character code "c" is output to the next position of the intermediate decompressed stream 1355, the character code "b" is output to a position immediately after skipping the next position, and the character code "c" is output to a position immediately after skipping the next position. Meanwhile, the compressed code 116 from the reordered second compressed stream 1342' has a reverse-pointer to NULL, so the character code "t" is output to the next position of the intermediate decompressed stream 1355 following the first instance of the character code "c" from the compressed code 258. The length of the string for the compressed code 258 is indicated as L=3, and the length of the string for the compressed code 116 is indicated as L=1.

Finally, the compressed code 258 from the reordered second compressed stream 1342' provides a multi-symbol string "tac," where the compressed code 258 has character code "t" and a reverse-pointer to 256, which has character code "a" and a reverse-pointer to 99, which has character code "c" and a reverse-pointer to NULL. Therefore, over the next three operations involving the reordered second compressed stream 1342', the character code "t" is output to the next position of the intermediate decompressed stream 1355 following the character code "b" from the compressed code 258 in the reordered first compressed stream 1341', the character code "a" is output to a position immediately after skipping the next position, and the character code "c" is output to a position immediately after skipping the next position. Meanwhile, the compressed code 100 from the reordered first compressed stream 1341' has a reverse-pointer to NULL, so the character code "d" is output to the next position of the intermediate decompressed stream 1355 following the character code "a" from the compressed code 258. The length of the string for the compressed code 258 is indicated as L=3, and the length of the string for the compressed code 100 is indicated as L=1.

The decompressed stream 1360 is formed from the intermediate decompressed stream 1355 by reversing the order of the character codes order in each of the multi-symbol strings. In the depicted example, the multi-symbol strings in the reordered first compressed stream 1341' include the compressed code 256 with character codes "bc" and the compressed code 258 with character codes "cbc," and the multi-symbol strings in the reordered second compressed stream 1342' include the compressed code 256 with character codes "ac" and the compressed code 258 with character codes "tac." As shown in FIG. 13C, the order of the character codes "bc" from the compressed code 256 of the reordered first compressed stream 1341' are received in the decompressed stream 1360 in reverse order, "c" followed by "b." The order of the character codes "ac" from the compressed code 256 of the reordered second compressed stream 1342' are received in the decompressed stream 1360 in reverse order, "c" followed by "a." The order of the character codes "cbc" from the compressed code 258 of the reordered first compressed stream 1341' are received in the decompressed stream 1360 in reverse order, "c" followed by "b" followed by "c." The order of the character codes "tac" from the compressed code 258 of the reordered second compressed stream 1342' are received in the decompressed stream 1360 in reverse order, "c" followed by "a" followed by "t."

Upon completion, the resulting decompressed stream 1360 is the same as the original serial stream 1320 shown in FIG. 13A. In an alternative embodiment, the compressed codes originating from the reordered first compressed stream 1341' are decompressed as a first temporary output stream (with or without the character codes in multi-symbol strings in reverse order) stored in a first temporary buffer, and the compressed codes originating from the reordered second compressed stream 1342' are decompressed as a second temporary output stream (with or without the character codes in multi-symbol strings in reverse order) stored in a second temporary buffer. Then, the decompressed stream 1360 may be formed by inputting symbols alternately from the first and second temporary output streams in order.

In an alternative embodiment, instead of the buffering step in which each NoOp entry is switched with the next available multi-symbol string, the buffering step includes a process in which each NoOp entry is simply removed and the multi-symbol string is shifted into the place of the NoOp entry so that that all of the NoOp entries are removed before putting together the compressed stream. That is, the multi-symbol values are moved to the first appearance of the respective NoOp operations. Advantageously, this translates into one write operation to account for each NoOp entry instead of multiple write operations.

Figure 14:
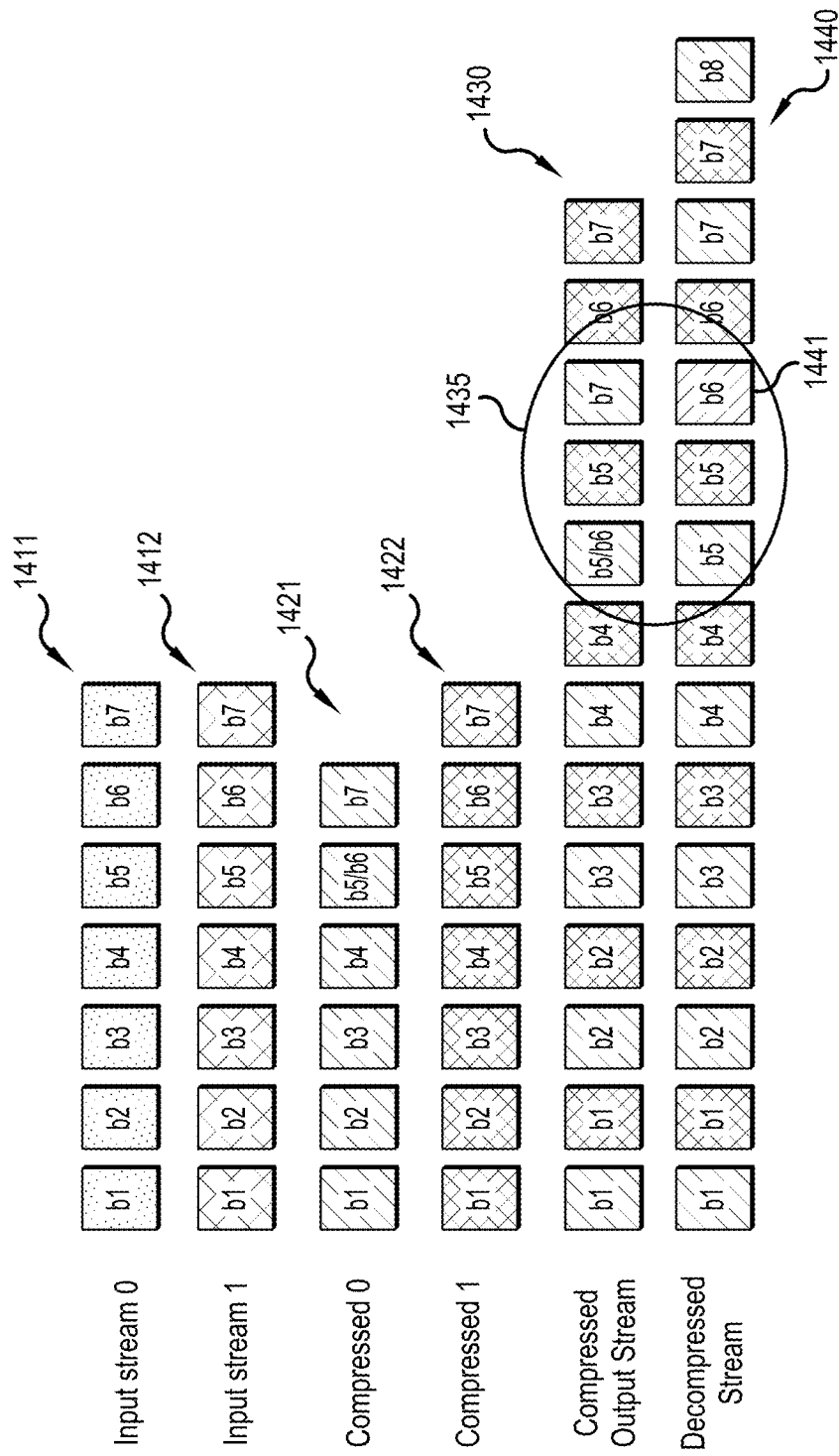
FIG. 14 shows symbols of wide word data shifted for input for decompression, according to a representative embodiment.

FIG. 14 shows symbols of wide word data reordered for input for decompression, according to a representative embodiment. Referring to FIG. 14, it is assumed that compression of the first input stream 1411 results in a compressed multi-symbol string representing the two original incoming symbols b5 and b6. Conventionally, this compression would result in a NoOp entry in the original position of the symbol b5 and a multi-symbol string b5/b6 in the original position of the symbol b6 in the corresponding first compressed stream, as shown in the first compressed stream 821 of FIG. 8, for example. However, in the embodiment depicted in FIG. 14, the compression operation removes the NoOp entry from the first compressed stream 1421 corresponding to the first input stream 1411, and shifts the multi-symbol string b5/b6 to the position of the removed NoOp entry (the original position of the symbol b5). By doing this "shifted symbol" reordering, and storing the original size of the input streams, enough information is preserved to recover the original order of the symbols b5 and b6 from the compressed output stream 1430 stored in the capture buffer. When the combined multi-symbol string b5/b6 is decoded, the retrieved data code may be interrogated to see that the multi-symbol string b5/b6 represents the two original uncompressed symbols b5 and b6 for the first input stream 1411, which is also known to belong to the first dictionary D1. The ordering therefore has been preserved.

More particularly, FIG. 14 shows first input stream 1411 (input stream 0) and second input stream 1412 (input stream 1) of wide word data that are provided following for compression. The first and second input streams 1411 and 1412 may respectively correspond to the first and second input streams 631 and 632, discussed above with reference to FIG. 6, although the symbols numbered differently for the sake of convenience. FIG. 14 further shows first compressed stream 1421 (compressed 0) calculated for the first input stream 1411 and reordered (shifted) according to the present embodiment, and second compressed stream 1422 (compressed 1) calculated for the second input stream 1412. The first and second compressed streams 1421 and 1422 represent the ordering of operations in an intermediate step before the data is written to the capture buffer as gap-free compressed output stream 1430 during the compression process. Subsequent decompression is performed on the compressed output stream 1430 according to a known decompression algorithm. The resulting decompressed stream 1440 shows data following the decompression that has been ordered correctly, despite the NoOp entry generated during compression of the first input stream 1411.

According to the depicted embodiment, the gap-free compressed output stream 1430 for the wide words is written during compression so that consecutive compressed symbols from alternating first and second compressed streams 1421 and 1422 follow each other without the NoOp entries. When one or more symbols are compressed into a multi-symbol string, the compressed symbol is temporarily buffered and then emitted in the preceding NoOp entry position so that the compressed symbol appears as if it were created at the original position of the NoOp entry. When the original incoming symbols cannot be compressed, they are respectively emitted at the correct locations during the correct operation, or shifted by the same number of entries as any preceding multi-symbol strings have been shifted.

In the illustrative dual wide word system described herein (for simplicity of explanation), the compressed output is always emitted pairwise first input stream 1411 and then second input stream 1412. The first compressed stream 1421 corresponding to the first input stream 1411 includes compressed multi-symbol string b5/b6 written at that the position of symbol b5, where the NoOp entry (e.g., shown in the first compressed stream 821 of FIG. 8) has been removed, and the compressed multi-symbol string b5/b6 has been shifted to the position of the symbol b5. The second compressed stream 1422 includes all of the symbols of the second input stream 1412.

The compressed output stream 1430 receives the symbols alternately between the first compressed stream 1421 and the second compressed stream 1422. Notably, compression may be better for some input streams than others, which results in shorter compressed streams. For example, compression of the first input stream 1411 is better than compression of the second input stream 1412, resulting in the first compressed stream 1421 being shorter than the second compressed stream 1422. In this case, towards the end of the compressed stream, compressed symbols from the longer stream will be placed together, such as the symbols b6 and b7 from the second compressed stream 1422 being adjacent one another at the end of the compressed output stream 1430. Therefore, the number of compressed symbols for each compressed stream is tracked during decompression, and once the number reaches the original size of the corresponding decompressed input stream for the compressed stream, that compressed stream is skipped for the remainder of the decompression of that wide word.

In the depicted example, the original size of each of the first input stream 1411 corresponding to the first compressed stream 1421 and second input stream 1412 corresponding to the second stream 1422 is seven. This value is the same for all compressed streams because the size of the original input streams is chosen so that they fit exactly in wide word streams. In the depicted example, the original input stream was chosen to be 14, so first and second input streams 1411 and 1412 (each of size 7) add up to 14. In general, the size n of the page is chosen so that n % wide_word=0 (i.e., the size of the page is divisible by wide word). When decompressing, discussed below, as soon as the first compressed stream 1421 and/or the second compressed stream and 1422 reaches seven decompressed values, it is known that that compressed stream has been fully decompressed.

With regard to alternately receiving the symbols from the first and second compressed streams 1421 and 1422, the compressed output stream 1430 receives symbol b1 from the first compressed stream 1421, symbol b1 from the second compressed stream 1422, symbol b2 from the first compressed stream 1421, symbol b2 from the second compressed stream 1422, and so on. This interleaved process goes on to include receiving the multi-symbol string b5/b6 from the first compressed stream 1421 after receiving the symbol b4 from the second compressed stream 1422, receiving the symbol b5 from the second compressed stream 1422, receiving the symbol b7 from the first compressed stream 1421, and receive the symbol b7 from the second compressed stream 1422. In the depicted order, data for each dictionary is recoverable in the original order as shown in the decompressed stream 1440 (also indicated by circle 1435), enabling the recovery of the data from the multiple input streams in the wide words. In particular, the symbol b6 (indicated by reference no. 1441) from the first compressed stream 1421 is correctly positioned immediately following the symbol b5 from the second compressed stream 1422.

By performing the "shifted symbol" reordering (de-interleaving), the two prerequisite pieces of information required to reconstruct the data in the correct order are preserved. First, in the depicted example, the multi-symbol string b5/b6 is known to have arrived at the position of the symbol b5 in the first input stream 1411 instead of at the position of the symbol b6, and is therefore addressed in the first dictionary D1. Second, upon examining the retrieved data for the multi-symbol string b5/b6, it is known that the length of the eventual uncompressed string will be more than one symbol in length. Therefore, when decoding the compressed multi-symbol string b5/b6, e.g., to obtain the decompressed stream 1440, the symbol b5 is written out first and the symbol b6 is written out second when the correct time for that write operate comes. Both of the symbols b5 and b6 are thus written in their correct positions in the final decompressed stream 1440. In addition, since the eventual length of the multi-symbol string b5/b6 is known to be two uncompressed symbols, the dictionaries to which the next codes in the compressed output stream 1430 belong may be calculated. Notably, in a hardware implementation using an FPGA (or ASIC), the symbols are reversed due to the reverse-pointer technique, discussed below.

Figure 15A:
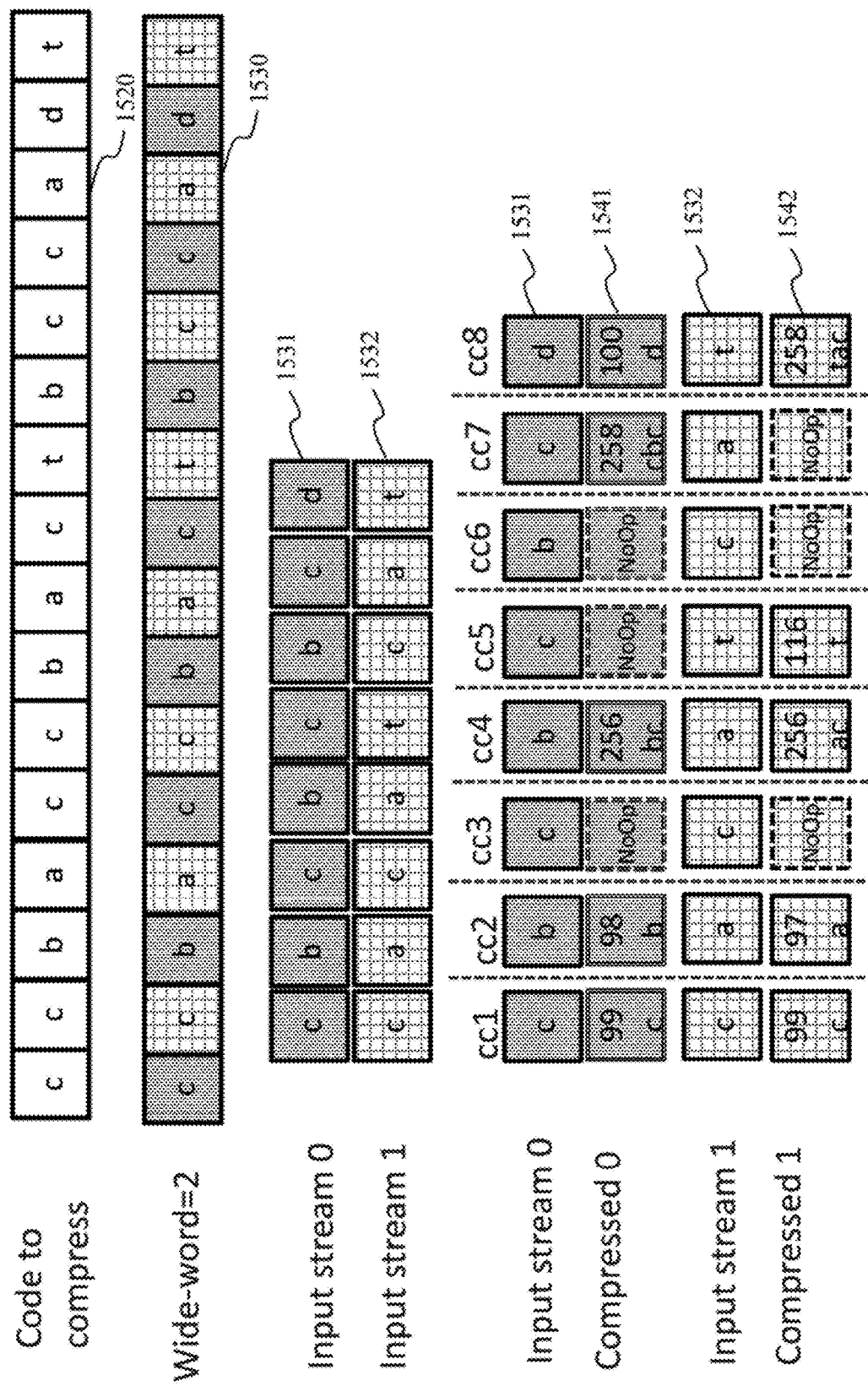
FIG. 15A shows parallel compression of wide word data for shifting symbols of the wide word data input for decompression, according to a representative embodiment.
Figure 15B:
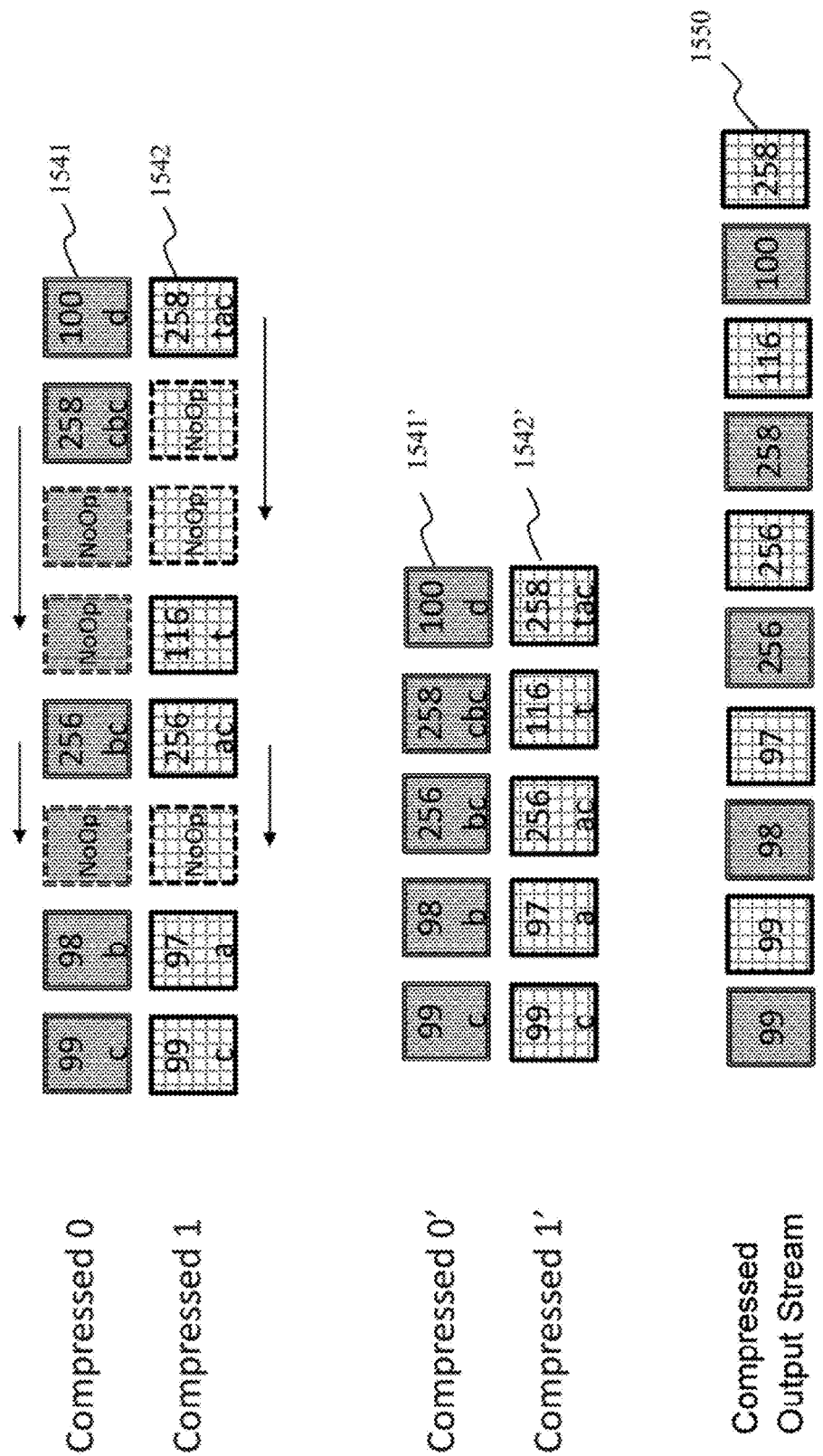
FIG. 15B shows shifting symbols of the wide word data input for decompression, according to a representative embodiment.
Figure 15C:
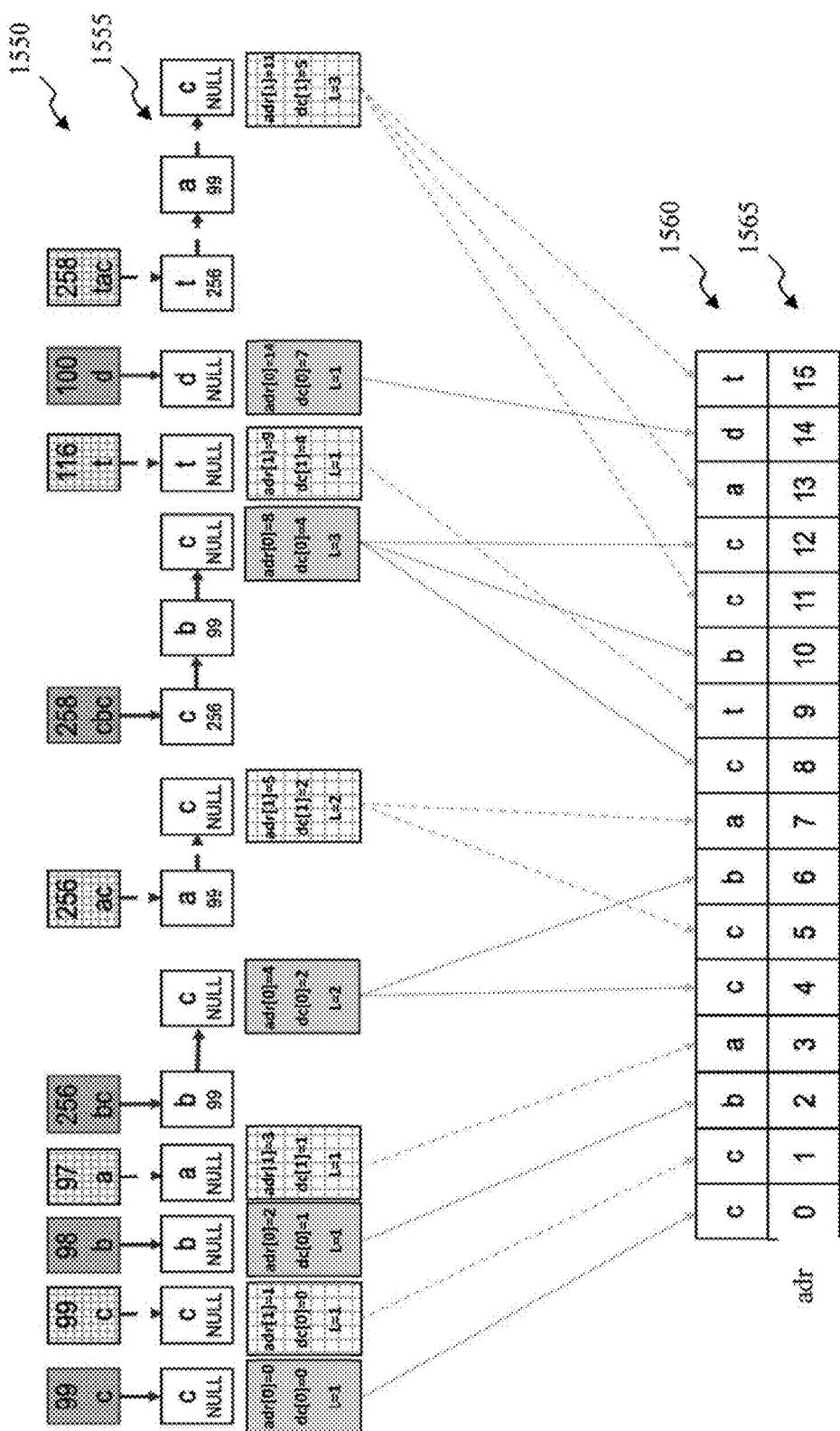
FIG. 15C shows decompression of shifted symbols of the wide word data, according to a representative embodiment.

FIGS. 15A-15C similarly show an example of ordering symbols of multiple wide words input for decompression, according to a representative embodiment, where the wide word size is two. In particular, FIGS. 15A-15C show in more detail the steps of removing the NoOp entries and shifting the subsequent multi-symbol strings to the positions of the removed NoOp entries, respectively.

Referring to FIG. 15A, a serial stream 1520 to be compressed includes 16 symbols (bytes) in two wide words, including symbols "ccbaccbactbccadt." The serial stream 1520 is arranged such that every other symbol is assigned to one of the two wide words, as shown by different shading in the serial stream of symbols indicated by reference number 1530. Accordingly, every other symbol is grouped together in terms of the compression into separate input streams, including a first input stream 1531 having symbols "cbcbcbcd" for first dictionary (D1) and a second input stream 1532 having symbols "cacatcat" for second dictionary (D2). Notably, second input stream 1532 is the same as the illustrative first input stream discussed above with reference to Tables 3A and 3B, discussed above.

Parallel compression is performed on first and second input streams 1531 and 1532 in eight clock cycles, indicated by cc1-cc8, in accordance with the compression embodiments described above. The first and second input streams 1531 and 1532 may be compressed using a known ASCII table, for example. The compression of the first input stream 1531 provides first compressed stream 1541 (compressed 0) and the compression of the second input stream 1532 provides second compressed stream 1542 (compressed 1). In the depicted example, the first compressed stream 1541 includes compressed codes "99, 98, NoOp, 256, NoOp, NoOp, 258, 100" and the second compressed stream 1542 includes compress codes "99, 97, NoOp, 256, 116, NoOp, NoOp, 258" (discussed above).

Referring to FIG. 15B, the first and second compressed streams 1541 and 1542 are shifted according to shifted symbol reordering, and may or may not be stored in a temporary buffer, so that any compressed codes representing multi-symbol strings are shifted to the corresponding NoOp entries created during compression, as discussed above. In particular, in the first compressed stream 1541, the NoOp entry in the third position is removed and the multi-symbol string represented by the compressed code 256 is shifted from the fourth position to the third position. Also, the NoOp entries in the fifth and sixth positions are removed and the compressed code 258 is shifted from the seventh position to the fifth position (i.e., the first NoOp entry of the two adjacent NoOp entries preceding the compressed code 258). The result is reordered (shifted) first compressed stream 1541' (Compressed 0'). In the second compressed stream 1542, the NoOp entry is removed from the third position and the multi-symbol string represented by the compressed code 256 is shifted from the fourth position to the third position, and NoOp entries in the sixth and seventh positions are removed and the compressed code 258 is shifted from the eighth position to the sixth position, thereby providing reordered (shifted) second compressed stream 1542' (Compressed 1'). This may be referred to as a buffering step, regardless of whether the reordered first and second compressed streams 1541' and 1542' are stored in a buffer. Notably, the compressed codes 256 and 258 in the second compressed stream 1542 comprise different character codes than the compressed codes 256 and 258 of the first compressed stream 1541, which is the key reason to keep track of the input streams these compressed streams come from.

A final compressed output stream 1550 is formed by inputting symbols alternately from the reordered (shifted) first and second compressed streams 1541' and 1542' in order. Since the NoOp entries have been previously removed, the compressed output stream 1550 is gap-free. Accordingly, the compressed code 256 from the reordered first compressed stream 1541' immediately follows the compressed code 97 from the reordered second compressed stream 1542', the compressed code 256 from the reordered second compressed stream 1542' immediately follows the compressed code 256 from the reordered first compressed stream 1541', the compressed code 258 from the reordered first compressed stream 1541' immediately follows the compressed code 256 from the reordered second compressed stream 1542', and the compressed code 258 from the reordered second compressed stream 1542' immediately follows the compressed code 100 from the reordered first compressed stream 1541'. Due to the different buffering step, the final compressed output stream 1550 is different from the final compressed output stream 1350 of the embodiment shown in FIG. 13B, discussed above.

Referring to FIG. 15C, decompression is performed on the compressed output stream 1550 to provide decompressed stream 1560, according to the representative embodiment, where the decompressed stream 1560 matches the original serial stream 1520 shown in FIG. 15A. The decompression is performed in operations iteratively from left to right in the depicted configuration. The compressed output stream 1550 is shown at the top of FIG. 15C, where the blocks showing the symbols and multi-symbol strings, and corresponding addresses and parameters, are separated for the sake of convenience. The decompression is performed in a series of iterative decoding operations using the respective reverse-pointers to determine the corresponding character code(s), as discussed above, forming an intermediate decompressed stream 1555, which may be fully or partially stored in a temporary buffer. The final decompressed stream 1560 is formed by reversing an order of the character codes in each of the multi-symbol strings of the compressed output stream 1550.

The address information and parameters are updated in association with each of the compressed codes when determining the intermediate decompressed stream 1555. The address information includes the address (adr) of the current compressed code in the decompressed stream 1560. The parameters include the length (L) of the compressed code which is determined by the number of compressed symbols in that compressed code, wide word (w) which is the number of input streams in the wide word, and decompressed value (dc) which indicates the cumulative number of decompressed symbols from the same input stream at the point in the decompression process at which the current compressed code is being decompressed. The next address for the next compressed code originating from the same input stream is calculated by adding the product of the length (L) and the wide word (w) to the current address (adr+Lw). The next decompressed value for the same input stream is calculated by adding the length (L) to the current decompressed value (dc+L).

For the sake of convenience, the intermediate decompressed stream 1555 in FIG. 15C is shown in its entirety, indicating the overall decoding process and the order of decoded character codes. However, the entire intermediate decompressed stream 1555 is not necessarily formed before proceeding to the next step of inputting the decoded character codes to the final decompressed stream 1560. That is, in some embodiments, the decoded character codes of the intermediate decompressed stream 1555 may be presented to the final decompressed stream 1560 in a piecewise fashion as the intermediate decompressed stream 1555 is being built, thereby reducing the size of the temporary buffer needed for the intermediate decompression. For example, each decoded character code may be input from the intermediate decompressed stream 1555 to the final decompressed stream 1560 when the corresponding reverse-pointer is NULL. Reaching the reverse-pointer of null requires multiple decoding steps for the multi-symbol strings (and order reversal when inputting to the final decompressed stream 1560), as mentioned above.

Also, the decompression does not require a partial output for each of the reordered first and second compressed streams 1541' and 1542'. The decompression uses the addresses to keep track of the positions in which the decompressed strings will be in the final output decompressed stream 1560, which may reduce the amount of buffer memory needed and effectively removes the intermediate decompressed stream 1555 as a separately formed interleaving step. The addresses are tracked in an array of size wide word (e.g., two in the present example), and each stream is effectively decompressed independently, so the decompression process may be implemented in parallel. Since the final positions of the reordered first and second compressed streams 1541' and 1542' are known as they are decoded, the first several decoded characters of the final decompressed stream 1560 may be output even when the compressed output stream 1550 has not yet been completely decoded. Multi-symbol strings need to be stored temporarily during decompression to reverse the order of the decoded character codes to be provided to the decompressed stream 1560, after which the multi-symbol strings may be removed from storage if so desired.

In particular, referring to the depicted example, the compressed code 99 from the reordered first compressed stream 1541' has a reverse-pointer to NULL, so the character code "c" is output to the first position of the intermediate decompressed stream 1555, along with the corresponding address information and parameters. As shown, the address of the compressed code 99 is 0 (adr[0]=0) since it is the first decompressed symbol of the decompressed stream 1560, the length of the compressed code 99 is 1 (L=1) since it corresponds to one compressed symbol, and the decompressed value of the compressed code 99 is 0 (dc[0]=0) since there have been no symbols decompressed so far. The next address of the next decompressed symbol originating from the first input stream 1531 is 2, which is determined by the product of the length (L) of the compressed code 99 and the size (w) of the wide word, added to the current address of the compressed code 99 (adr[0]+L*w=0+(1*2)=2) The next decompressed value (dc) indicating the cumulative number of decompressed symbols from the first input stream 1531 so far is 1, which is determined by adding the value of the length (L) to the current decompressed value of the code 99 (dc[0]+L=0+1=1). The next decompressed value is compared to the total number of symbols in the original first input stream 1511 (which is 8) to determine whether the reordered first compressed stream 1541' has been fully decompressed. In this case, since the next decompressed value is 1, and since 1 is less than 8, the decompression of the first compressed stream 1541' does not stop here.

The compressed code 99 from the reordered second compressed stream 1542' has a reverse-pointer to NULL, so the character code "c" is output to the next position of the intermediate decompressed stream 1555, along with the corresponding address information and parameters. That is, the address of the compressed code 99 is 1 (adr[1]=1) since it is the second decompressed symbol of the decompressed stream 1560, the length of the compressed code 99 is 1 (L=1) since it corresponds to one compressed symbol, and the decompressed value of the compressed code 99 is 0 (dc[1]=0) since there have been no symbols decompressed so far for the reordered second compressed stream 1542'. The next address of the next decompressed symbol originating from the second input stream 1532 is 3, which is determined by the product of the length (L) of the compressed code 99 and the size (w) of the wide word, added to the current address of the compressed code 99 (adr[1]+L*w=1+(1*2)=3). The decompressed value indicating the cumulative number of decompressed symbols from the second input stream 1532 is 1, which is determined by adding the value of the length (L) to the current decompressed value of the code 99 (dc[1]+L=0+1=1). The next decompressed value is compared the total number of symbols in the original second input stream 1512 (which also is 8) to determine whether the reordered second compressed stream 1542' has been fully decompressed. In this case, since the next decompressed value is 1, and since 1 is less than 8, the decompression of the second compressed stream 1542' does not stop here.

The compressed code 98 from the reordered first compressed stream 1541' has a reverse-pointer to NULL, so the character code "b" is output to the next position of the intermediate decompressed stream 1555. The corresponding address information includes adr[0]=2 (which was previously updated with the preceding compressed code 99 from the reordered first compressed stream 1541'), and the corresponding parameters are L=1 and dc[0]=1 (which was previously updated with the preceding compressed code 99 from the reordered first compressed stream 1541'). The address adr[0] is then updated with its next value as adr[0]+Lw=2+(1*2)=4. The decompressed value dc[0] is also updated with its next value as dc[0]+L=1+1=2, which is less than 8 so the decompression of the first compressed stream 1541' does not stop. Likewise, the compressed code 97 from the reordered second compressed stream 1542' has a reverse-pointer to NULL, so the character code "a" is output to the next position of the intermediate decompressed stream 1555. The corresponding address information includes adr[1]=3 (which was previously updated with preceding compressed code 99 from the reordered second compressed stream 1542'), and the corresponding parameters are L=1 and dc[1]=1 (which was previously updated with the preceding compressed code 99 from the reordered second compressed stream 1542'). The address adr[1] is then updated to adr[1]+Lw=5. The decompressed value dc[1] is also updated with its next value as dc[1]+L=2, which is less than 8 so the decompression of the second compressed stream 1542' does not stop.

The compressed code 256 from the reordered first compressed stream 1541' next provides a multi-symbol string "bc," where the compressed code 256 has character code "b" and a reverse-pointer to 99, which has character code "c" and a reverse-pointer to NULL. Therefore, the character codes "b" and "c" are respectively output, and then the positions are reversed when written to the decompressed stream 1560. The corresponding address information includes adr[0]=4, which is then updated to 8. The corresponding parameters are L=2 and dc[0]=2, which is then updated to 4. The length (L) is 2 because the compressed code 256 includes two character codes ("bc") from two symbols in the first input stream 1531. The address (adr[0]) is updated to 8 according to adr[0]+Lw=4+(2*2)=8. The decompressed value (dc[0]) is updated to 4 according to dc[0]+L=2+2=4, meaning that four symbols ("cbcb") from the first input stream 1531 have been decoded. Since 4 is less than 8, the decompression of the reordered first compressed stream 1541' does not stop.

Similarly, the compressed code 256 from the reordered second compressed stream 1542' provides a multi-symbol string "ac," where the compressed code 256 has character code "a" and a reverse-pointer to 99, which has character code "c" and a reverse-pointer to NULL. Therefore, the character codes "a" and "c" are respectively output, and then the positions are reversed when written to the decompressed stream 1560. The corresponding address information includes adr[1]=5, which is updated to 9. The corresponding parameters are L=2 and dc[1]=2, which is updated to 4. The length (L) is 2 because the compressed code 256 includes two character codes ("ac") from two symbols in the second input stream 1532. The address (adr[1]) is updated to 9 according to adr[1]+Lw=5+(2*2)=9. The decompressed value (dc[1]) is updated to 4 according to dc[1]+L=2+2=4, indicating that four symbols ("caca") from the second input stream 1532 have been decoded. Since 4 is less than 8, the decompression of the reordered second compressed stream 1542' does not stop.

Next, the compressed code 258 from the reordered first compressed stream 1541' provides a multi-symbol string "cbc," where the compressed code 258 has character code "c" and a reverse-pointer to 256, which has character code "b" and a reverse-pointer to 99, which has character code "c" and a reverse-pointer to NULL. Therefore, the character codes "c," "b" and "c" are respectively output, and then the positions are reversed when written to the decompressed stream 1560. The corresponding address information includes adr[0]=8, which is then updated to 14, and the corresponding parameters are L=3 and dc[0]=4, which is updated to 7. The length (L) is 3 because the compressed code 258 includes three character codes ("cbc") from three symbols in the first input stream 1531. The address is updated to 14 according to adr[0]+Lw=8+(3*2)=14. The decompressed value (dc[0]) is updated to 7 according to dc[0]+L=4+3=7, indicating that seven symbols ("cbcbcbc") from the first input stream 1531 have been decoded. Since 7 is less than 8, the decompression of the reordered first compressed stream 1541' does not stop.

Next, the compressed code 116 from the reordered second compressed stream 1542' has a reverse-pointer to NULL, so the character code "t" is output to the next position of the intermediate decompressed stream 1555, along with the corresponding address information and parameters. That is, the corresponding address information includes adr[1]=9, which is then updated to 11, and the corresponding parameters are L=1 and dc[1]=4, which is then updated to 5. The address adr[1] is updated to 11 according to adr[1]+Lw=9+(1*2)=11. The decompressed value (dc[1]) is updated to 5 according to dc[1]+L=4+1=5, indicating that five symbols ("cacat") from the second input stream 1532 have been decoded. Since 5 is less than 8, the decompression of the reordered second compressed stream 1542' does not stop.

Next, the compressed code 100 from the reordered first compressed stream 1541' has a reverse-pointer to NULL, so the character code "d" is output to the next position of the intermediate decompressed stream 1555, along with the corresponding address information and parameters. That is, the corresponding address information includes adr[0]=14, and the corresponding parameters are L=1 and dc[0]=7, which is then updated to 8. The decompressed value (dc[0]) is updated to 8 according to dc[0]+L=7+1=8, indicating that all eight symbols ("cbcbcbcd") from the first input stream 1531 have been decoded. Therefore, since dc[0] is equal to 8, the decompression of the reordered first compressed stream 1541' stops. Since the decompression of the reordered first compressed stream 1541' is now complete, the address (adr[0]) is updated to 0 in order to begin decompressing the next reordered first compressed stream.

Lastly, the compressed code 258 from the reordered second compressed stream 1542' provides a multi-symbol string "tac," where the compressed code 258 has character code "t" and a reverse-pointer to 256, which has character code "a" and a reverse-pointer to 99, which has character code "c" and a reverse-pointer to NULL. Therefore, the character codes "t," "a" and "c" are respectively output, and then the positions are reversed when written to the decompressed stream 1560. The corresponding address information includes adr[1]=11, and the corresponding parameters are L=3 and dc[1]=5, which is then updated to 8. The length (L) is 3 because the compressed code 258 includes three character codes ("tac") from three symbols in the second input stream 1532. The decompressed value (dc[1]) is updated to 8, indicating that all eight symbols ("cacatcat") from the second input stream 1532 have been decoded. Therefore, since dc[1] is equal to 8, the decompression of the reordered second compressed stream 1542' stops. Since the decompression of the reordered second compressed stream 1542' is now complete, the address (adr[1]) is updated to 0 in order to begin decompressing the next reordered second compressed stream.

The decompressed stream 1560 is formed from the intermediate decompressed stream 1555 by reversing the order of the character codes order in each of the multi-symbol strings, as discussed above. Reversing the order of the character codes and creating the decompressed stream 1560 may be done during the iterative decompression process or may be done after completion of the intermediate decompressed stream 1555. The end result is that as shown in FIG. 15C, the order of the character codes "bc" from the compressed code 256 of the reordered first compressed stream 1541' are received in the decompressed stream 1560 in reverse order, "c" followed by "b." The order of the character codes "ac" from the compressed code 256 of the reordered second compressed stream 1542' are received in the decompressed stream 1560 in reverse order, "c" followed by "a." The order of the character codes "cbc" from the compressed code 258 of the reordered first compressed stream 1541' are received in the decompressed stream 1560 in reverse order, "c" followed by "b" followed by "c." The order of the character codes "tac" from the compressed code 258 of the reordered second compressed stream 1542' are received in the decompressed stream 1560 in reverse order, "c" followed by "a" followed by "t."

Upon completion, the resulting decompressed stream 1560 is the same as the original serial stream 1520 shown in FIG. 15A. In an alternative embodiment, the compressed codes originating from the reordered first compressed stream 1541' are decompressed as a first temporary output stream (with or without the character codes in multi-symbol strings in reverse order) stored in a first temporary buffer, and the compressed codes originating from the reordered second compressed stream 1542' are decompressed as a second temporary output stream (with or without the character codes in multi-symbol strings in reverse order) stored in a second temporary buffer. Then, the decompressed stream 1560 may be formed by inputting symbols alternately from the first and second temporary output streams in order.

Figure 16:
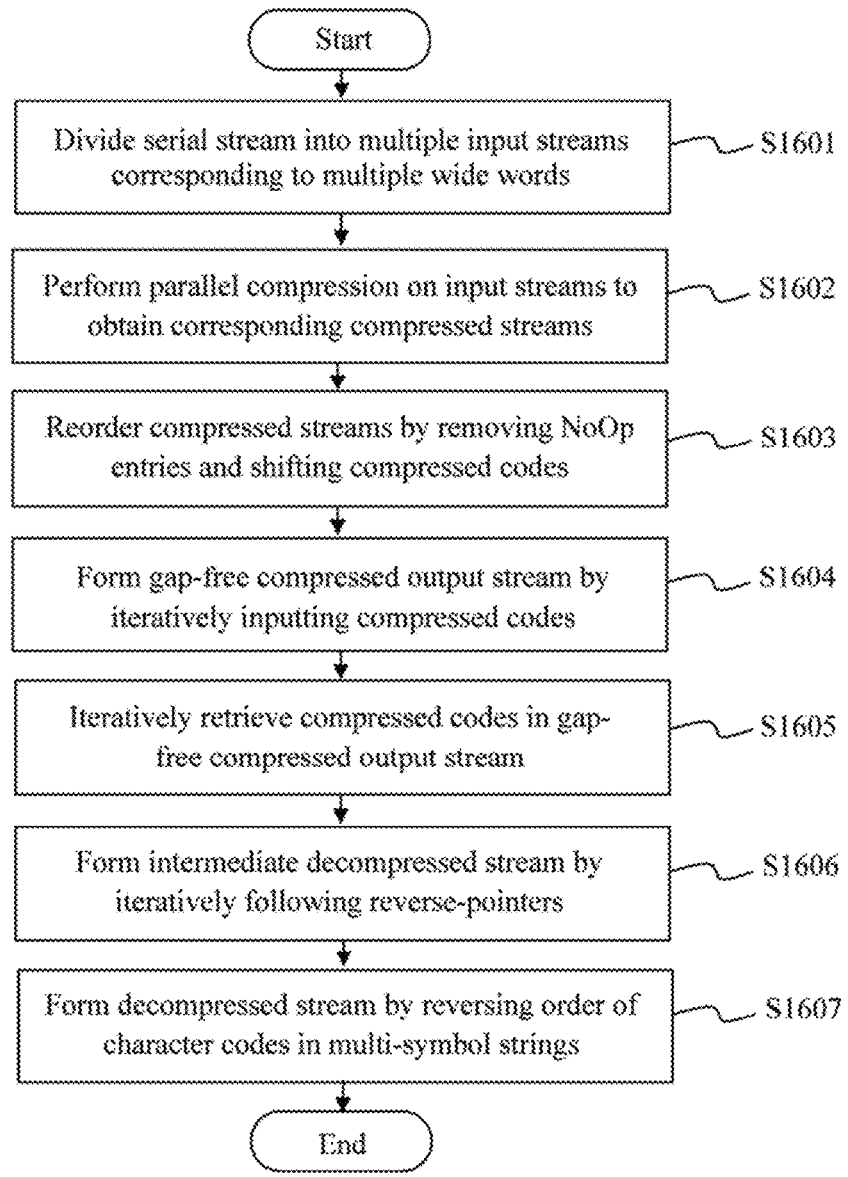
FIG. 16 is a simplified flow diagram illustrating a method of providing decompressed wide word data during communication of the wide word data over a data link, according to a representative embodiment.

FIG. 16 is a simplified flow diagram illustrating a method of providing decompressed wide word data during communication of the wide word data over a data link, according to a representative embodiment. The method reduces an amount of data stored in a capture buffer of an interposer circuit during communication of the data over a data link according to a high-speed, layered packet-based protocol, without loss of functionality and without loss of available information for the analysis. The various steps in FIG. 16 may be performed by the interposer circuit 120 and/or the UI computer 110, discussed above, eliminating complex wiring and signal integrity issues associated with previous solutions, reducing overall costs, and supporting faster upload times using high bandwidth interfaces (and less raw data), for example. FIGS. 13A to 13C discussed above illustrate an example of the method shown in FIG. 16.

Referring to FIG. 16, in block S1601, a serial stream to be compressed is divided into multiple input streams corresponding to multiple wide words in the serial stream. Each input stream includes a predetermined number of symbols.

In block S1602, parallel compression is performed on the multiple input streams to obtain corresponding compressed streams. Each of the compressed streams includes multiple compressed codes, and each compressed code includes at least one character code and at least one reverse-pointer. Some of the compressed streams have at least one compressed code that includes a multi-symbol string having multiple character codes and at least one NoOp entry corresponding to the multi-symbol string. Each multi-symbol string indicates a compressed code that represents two or more original input symbols in the input stream, and the NoOp entry effectively takes the position of the first, or any subsequently compressed, original input symbol in the compressed stream that is included in the corresponding multi-symbol string, as discussed above with reference to FIG. 8. When a multi-symbol string includes compressed codes from more than two input symbols, NoOp entries appear in the positions of all but the last position of the input symbols in the compressed stream.

In block S1603, the compressed streams are reordered using first incoming symbol reordering to form multiple reordered compressed streams, respectively. For each compressed stream having at least one multi-symbol string, each multi-symbol string is moved to a location of a first symbol of that multi-symbol string and the corresponding NoOp entr(ies) is shifted away from the location of the first symbol. That is, the positions of the multi-symbol string and the NoOp entr(ies) are switched so that the position of the multi-symbol string comes before the NoOp entr(ies) in the recorded compressed stream.

In block S1604, a gap-free compressed output stream is formed by inputting the compressed codes from the reordered compressed streams alternately, excluding the NoOp entries. For example, when there are two wide words, the gap-free compressed output stream is formed by alternating between the compressed codes from two reordered compressed streams, respectively. When there are four wide words, for example, the gap-free compressed output stream is formed by iteratively cycling through the compressed codes from four reordered compressed streams, respectively.

In block S1605, decompression of the compressed output stream begins by iteratively receiving the compressed codes in the gap-free compressed output stream from the different reordered compressed streams. Each compressed code includes at least one character code and at least one reverse-pointer. In the compressed streams that include at least one multi-symbol string, each multi-symbol string includes multiple character codes and multiple reverse-pointers, respectively.

In block S1606, an intermediate decompressed stream is formed by iteratively decoding the compressed codes from the different compressed streams by following the reverse-pointers for the compressed codes, respectively. That is, decoding of the compressed code is performed by following at least one reverse-pointer of each compressed code until reaching a NULL entry to obtain at least one character code. When the compressed code includes one reverse-pointer that points to the NULL entry, the compressed code includes one character code. When the compressed code includes multiple reverse-pointers, the last of which points to the NULL entry, the compressed code includes multiple character codes, respectively, and therefore comprises a multi-symbol string.

In block S1607, a decompressed stream is formed from the intermediate decompressed stream by reversing the order of the character codes in each of the multi-symbol strings from each from each of the compressed streams. The order of the remaining character codes stays the same. The decompressed stream is output for additional processing and analysis. For example, the decompressed stream may be output to the UI computer 110, which applies a protocol analyzer to the decompressed stream for analyzing the data in accordance with a high-speed data protocol, as discussed above.

Figure 17A:
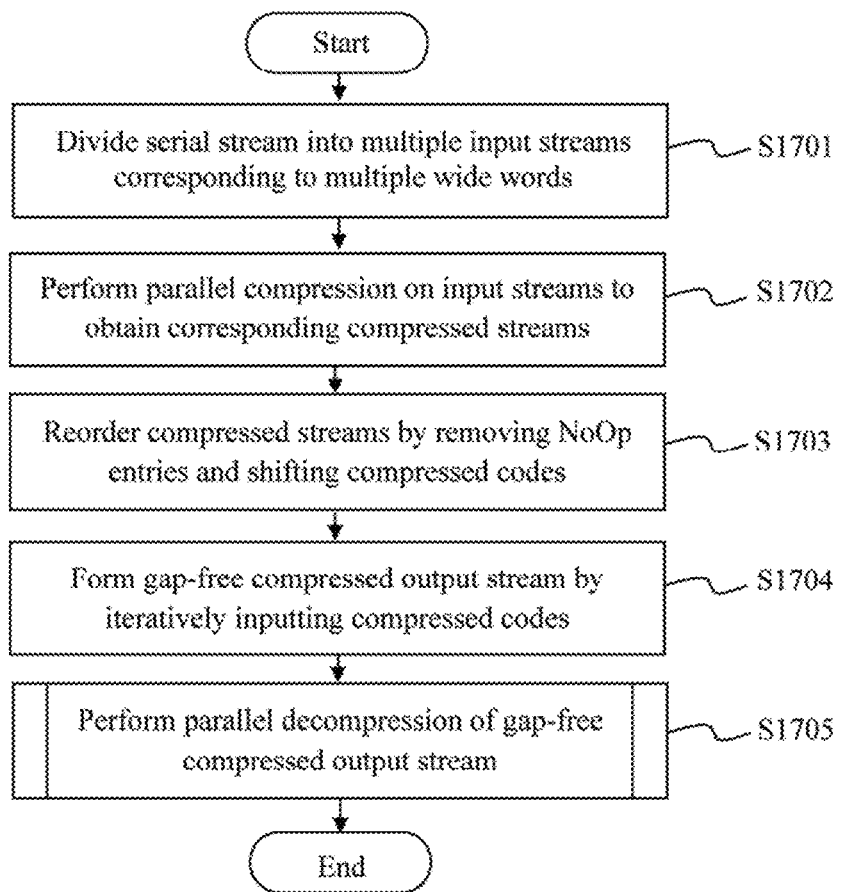
FIG. 17A is a simplified flow diagram illustrating a method of providing decompressed wide word data during communication of the wide word data over a data link, according to a representative embodiment.
Figure 17B:
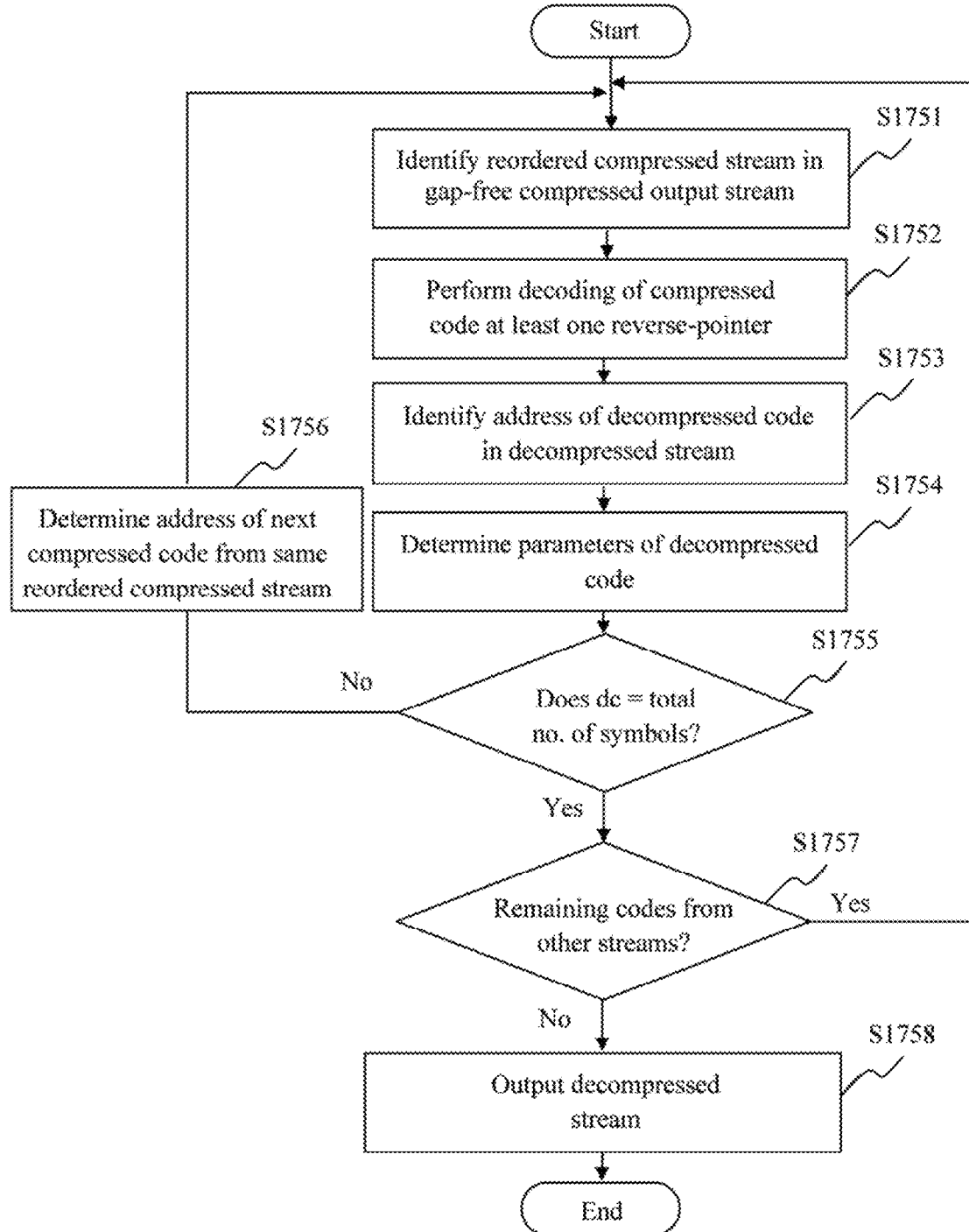
FIG. 17B is a simplified block diagram showing an example of a computational system for reducing an amount of stored data during communication of the data over a high-speed data link, according to a representative embodiment.

FIGS. 17A and 17B are simplified flow diagrams illustrating a method of providing decompressed wide word data during communication of the wide word data over a data link, according to a representative embodiment. The method may reduce the amount of data stored in a capture buffer of an interposer circuit during communication of the data over a data link according to a high-speed, layered packet-based protocol, without loss of functionality and without loss of available information for the analysis. The various steps in FIGS. 17A and 17B may be performed by the interposer circuit 120 and/or the UI computer 110, discussed above, eliminating complex wiring and signal integrity issues associated with previous solutions, reducing overall costs, and supporting faster upload times using high bandwidth interfaces (and less raw data), for example. FIGS. 15A to 15C discussed above illustrate an example of the method shown in FIGS. 17A and 17B.

Referring to FIG. 17A, in block 1701, a serial stream of data to be compressed is divided into multiple input streams corresponding to multiple wide words in the serial stream. Each input stream includes a predetermined number of symbols.

In block S1702, parallel compression is performed on the multiple input streams to obtain corresponding compressed streams. Each of the compressed streams includes multiple compressed codes, and each compressed code includes at least one character code and at least one reverse-pointer. Some of the compressed streams have at least one compressed code that includes a multi-symbol string having multiple character codes and at least one NoOp entry corresponding to the multi-symbol string. Each multi-symbol string indicates a compressed code that represents two or more original input symbols in the input stream, and the NoOp entry effectively takes the position of the first original input symbol in the compressed stream that is included in the corresponding multi-symbol string, as discussed above with reference to FIG. 8. When a multi-symbol string includes compressed code from more than two input symbols, NoOp entries appear in the positions of all but the last position of the input symbols in the compressed stream.

In block S1703, each compressed stream of the multiple compressed streams is reordered by removing each of the NoOp entries in that compressed stream, and shifting any compressed codes of the multiple compressed codes that follow each of the removed NoOp entries toward the position of the removed NoOp entry. For example, when one NoOp entry is removed, all of the compressed codes following the NoOp entry in the in the compressed stream are shifted one position toward the removed NoOp entry to form the corresponding reordered compressed stream. When two adjacent NoOp entries are removed, all of the compressed codes following the NoOp entries in the in the compressed stream are shifted two positions toward the removed NoOp entry to form the corresponding reordered compressed stream, and so on.

In block S1704, a gap-free compressed output stream is formed by iteratively inputting the compressed codes from the multiple reordered compressed streams (without the removed NoOp entries). For example, when there are two wide words, the gap-free compressed output stream is formed by alternating between the compressed codes from two reordered compressed streams, respectively. When there are four wide words, for example, the gap-free compressed output stream is formed by iteratively cycling through the compressed codes from four reordered compressed streams, respectively. When the reordered compressed streams have different numbers of compressed codes, the additional compressed codes at the end of the longer reordered compressed stream will be provided adjacent to one another at the end of the gap-free compressed output stream.

In block S1705, decompression of the gap-free compressed output stream is performed. Generally, the decompression is performed in parallel by iteratively decoding the compressed codes from the gap-free compressed output stream according to the respective reordered compressed streams to retrieve corresponding character codes, reversing the order of the character codes retrieved from the compressed codes having multi-symbols, and building the decompressed stream from the retrieved character codes. The process of performing decompression is discussed in detail with reference to FIG. 17B. The decompressed stream is output for additional processing and analysis. For example, the decompressed stream may be output to the UI computer 110, which applies a protocol analyzer to the decompressed stream for analyzing the data in accordance with a high-speed data protocol, as discussed above.

FIG. 17B is an illustrative implementation of the decompression process indicated by block S1705 in FIG. 17A. Referring to FIG. 17B, blocks S1751-S1756 are performed for each compressed code in the compressed output stream at a current address (adr) in the decompressed stream. In block S1751, a reordered compressed stream within the gap-free compressed output stream is identified in which the compressed code at the current address is included. For example, when the original serial stream includes two wide words, each compressed code in the gap-free compressed output stream is from one of two reordered compressed streams.

In block S1752, decoding of the compressed code is performed following the at least one reverse-pointer until reaching a NULL entry to obtain the at least one character code. When the compressed code includes one reverse-pointer that points to the NULL entry, the compressed code includes one character code. When the compressed code includes multiple reverse-pointers, the last of which points to the NULL entry, the compressed code includes multiple character codes, respectively, and therefore comprises a multi-symbol string.

In block S1753, the address of the decompressed code is identified. The address (adr) is the first address to be occupied by the decompressed character code(s) in the decompressed stream. For example, when the compressed code includes one character code, the one character code will occupy the identified address. When the compressed code includes two character codes, the two character codes will respectively occupy the identified address and the next address provided for the same reordered compressed stream (i.e., separated by addresses of character code(s) from other reordered compressed stream(s)), and so on.

In block S1754, parameters of the compressed code are determined. The parameters include the length (L) and the decompressed value (dc) of the compressed code, for example. The length of the compressed code is determined based on the decoding performed by following the reverse-pointers in block S1752. That is, the length corresponds to the number of character codes of the compressed code. So, a compressed code with one character code has length L=1, a compressed code with two character codes has length L=2, and so on. The decompressed value is determined as the cumulative number of decompressed symbols from the same input stream (and thus the same reordered compressed stream) prior to the current decompressed symbol. When the compressed code is the first one of the particular input stream, the decompressed value is 0 since no symbols have been decompressed yet. For subsequent compressed codes from the same input stream, the decompressed value is the decompressed value of the previous compressed code plus the length of previous compressed code. Generally, when the compressed code includes one character code, the decoded value is incremented by one. When the compressed code includes two character codes, the decoded value is incremented by two, and so on.

In block S1755, it is determined whether the cumulative decompressed value is equal to the number of symbols in the original input stream corresponding to the reordered compressed stream. For example, the original input stream may include eight symbols, as discussed above. When the decompressed value is not equal to the number of symbols (block S1755: No), the process proceeds to block S1756, where a next address in the decompressed stream of a next compressed code from the same reordered compressed stream is determined. The next address may be determined based on the current address, the length, and a number (w) of the wide words in the serial stream. That is, the next address is the product of the length (L) and the number (w) added to the current address (adr), as discussed above. The current address is set to the determined next address in the decompressed stream for a next iteration of the same reordered compressed stream.

The process then returns to block S1751, where the reordered compressed stream within the gap-free compressed output stream is identified in which the next compressed code is included. As discussed above, the reordered compressed stream is different from the previous reordered compressed stream, such that the compressed codes are interleaved for performing decompression. For example, when the original serial stream includes two wide words, the reordered compressed streams alternate between a first reordered compressed stream and a second reordered compressed stream for performing decompression. The process then repeats.

When the decompressed value is equal to the number of symbols (block S1755: Yes), indicating that all the compressed codes from that reordered compressed stream corresponding to symbols in the input stream have been decompressed, and the process proceeds to block S1757. In block S1757, it is determined whether there are any remaining reordered compressed streams that have not yet been fully decompressed. When there no more remaining reordered compressed streams (block S1757: No), the process proceeds to block S1758, discussed below. When there is at least one remaining reordered compressed streams with remaining compressed codes (block S1757: Yes), the process returns to block S1751, where the reordered compressed stream within the gap-free compressed output stream is identified in which the next compressed code is included. At this point, the next compressed code may be from the same reordered compressed stream since the compressed codes from the other reordered compressed stream(s) may have been exhausted. The process then repeats.

In block S1758, the decompressed stream is formed by inputting the character code(s) from each compressed code of each reordered compressed stream to the address in the decompressed stream corresponding to the current address of the compressed code. Inputting the at least one character code includes reversing the order of the character codes in each of the at least one multi-symbol strings from each compressed stream. For each multi-symbol string, the first character code in the reversed order is input to the current address, and the remaining character code(s) are input to the next consecutive address(es) in the decompressed stream available to the same reordered compressed stream. The order and addresses of the remaining character codes stay the same. The end result is the decompressed stream with the character codes in the same order as the original serial stream divided and compressed in blocks S1701 and S1702 of FIG. 17A, discussed above.

Figure 18:
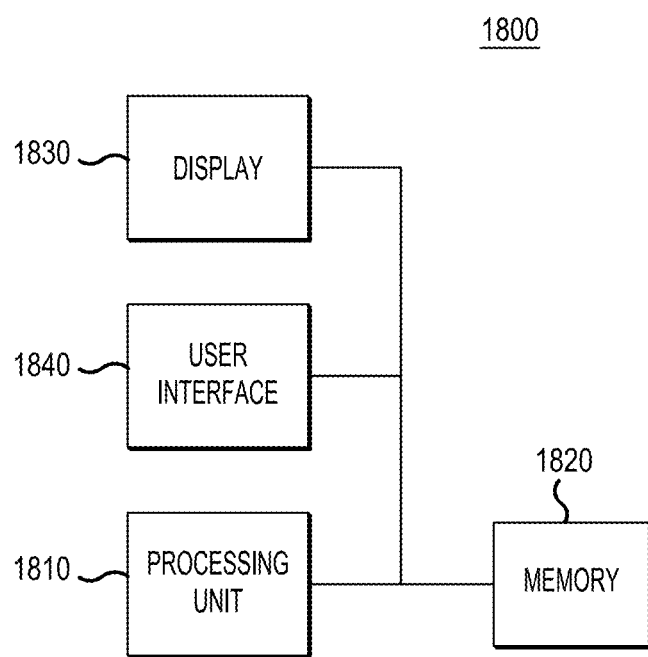
FIG. 18 is a simplified block diagram showing an example of a computational system for reducing an amount of stored data during communication of the data over a high-speed data link, according to a representative embodiment.

FIG. 18 is a simplified block diagram showing an example of a computational system for reducing an amount of stored data during communication of the data over a high-speed data link, according to a representative embodiment.

Referring to FIG. 18, a computational system 1800 includes a processing unit 1810, memory 1820 for storing instructions executable by the processing unit 1810 to implement the processes described herein, as well as a display 1830 and an interface 1840 to enable the user. The processing unit 1810 is representative of one or more processing devices and is configured to execute software instructions to perform functions as described in the various embodiments herein. The processing unit 1810 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term "processor", in particular, encompasses an electronic component able to execute a program or machine executable instructions. References to "a processor" should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 1820 may include a main memory and/or a static memory, where such memories may communicate with each other and the processing unit 1810 via one or more buses. The memory 1820 stores instructions used to implement some, or all aspects of methods and processes described herein. The memory 1820 may be implemented by any number, type and combination of random-access memory (RAM) and read-only memory (ROM), for example, and may store various types of information, such as software algorithms and computer programs, all of which are executable by the processing unit 1810. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art. When the processing unit 1810 includes an FPGA, for example, the memory 1820 may include an UltraRAM, as discussed above, or other RAM with read and write functionality.

The memory 1820 is a tangible storage medium for storing data and executable software instructions and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 1820 may store software instructions and/or computer readable code that enables performance of various functions. The memory 1820 may be secure and/or encrypted, or unsecure and/or unencrypted.

The display 1830 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 1830 may also provide a graphical user interface (GUI) for displaying and receiving information to and from the user.

The interface 1840 may include a user and/or network interface for providing information and data output by the processing unit 1810 and/or the memory 1820 to the user and/or for receiving information and data input by the user. That is, the interface 1840 enables the user to enter data and to control or manipulate aspects of the processes described herein, and enables the processing unit 1810 to indicate the effects of the user's control or manipulation. The interface 1840 may connect one or more user interfaces, such as a mouse, a keyboard, a trackball, a joystick, a haptic device, a microphone, a video camera, a touchpad, a touchscreen, voice or gesture recognition captured by a microphone or video camera, for example, or any other peripheral or control to permit user feedback from and interaction with the computer workstation 1805. The interface 1840 may further include one or more of ports, disk drives, wireless antennas, or other types of receiver circuitry.

The above embodiments depend on performing parallel wide word compression on multiple input streams transmitted through an interposer circuit to obtain corresponding compressed streams, and storing the compressed streams in the capture buffer. When compression is successfully performed on one of the input streams, e.g., according to LZW compression algorithm, one or more NoOp entries appear in the corresponding compressed stream, indicating repetition of bytes, as shown for example in FIGS. 9, 13A and 15A, discussed above.

However, when the input streams include data that does not have many repeated patterns, such as random data, for example, wide word compression on the interposer circuit 120 (e.g., including an FPGA and/or ASIC) may be problematic when writing and reading to binary output storage, such as the capture buffer 125. Generally, random data includes few previously seen repeated sequences of bytes, which makes for a poor compression. When stored, the compressed streams of random data require more bits to represent a given output than the original raw uncompressed bytes (8-bits) in the corresponding input streams. This is because the size of the output must be able to accommodate new compressed multi-symbol outputs that are encoded as numbers greater than 255. The new multi-symbol strings (sequences of bytes) as compressed symbols are initially going to be decimal numbers in the range of 0 to 511, which require nine bits to be written per original uncompressed byte to the storage medium. Therefore, when a byte cannot be compressed, the byte still requires nine bits of storage, which equates to a 12.5 percent increase in storage size with no corresponding benefit (i.e., no actual compression).

The parallel compression described herein relies on the fact that common repeated sequences require only 9-bits to store multiple original uncompressed bytes. In the case of random data or other data that does not have many repeated patterns (collectively referred to as "random data"), though, there simply are not enough of these repeated sequences to realize appreciable reduction in data. Further, the compression dictionary is still growing during the compression process, which means that newer outputs greater than decimal 511 require even greater numbers of bits to be written to the capture buffer 125. This results in a waste of space when uncompressed values, requiring only 8 bits to be written without compression, are now being written with 9, 10, or more bits.

Figure 19:
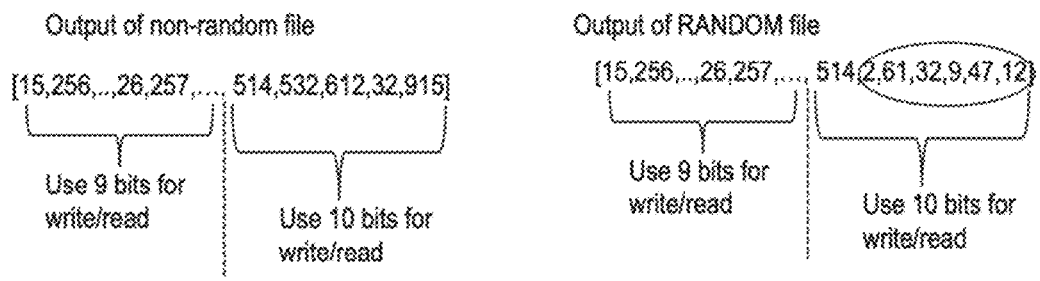
FIG. 19 shows an example of compressed output from non-random data on the left versus compressed output from random data on the right.

FIG. 19 shows an example of compressed output from non-random data on the left versus compressed output from random data on the right. When the input stream comprises non-random data, the compressed output usually includes values that are larger than 8 bits because the values represent sequences of previously seen repeated bytes. Generally, the first 512 values (decimal 0 to 511) require 9 bits, the next 512 values (decimal 512 to 1023) require 10 bits, the next 1024 values (decimal 1024 to 2047) require 11 bits, the next 2048 values (decimal 2048 to 4095) require 12 bits, and so on. The nature of the compression algorithm is useful for decompressing because it shows that the first 512 values can be stored using 9 bits, then next 512 values, can be stored using 10 bits, and so on, until reaching the maximum dictionary entry, after which all values will be read with that number of bits. For example, when the maximum dictionary entry is 4095, the maximum number of values is stored using 12 bits. The algorithm determines when to change from 9 bits to 10 bits (indicated by the dashed lines in FIG. 19), from 10 bits to 11 bits, and so on. An alternative approach would be to store some meta-data with each compressed value, where the meta-data states how many bits are used for each value. Each value can then be represented by the optimal number of bits, plus the meta-data. However, the meta-data increases the required storage. Therefore, since the number of values to read is known a priori, this "wasteful" meta-data is not needed to identify the size of each symbol for writing and reading. The compression algorithm simply begins by writing 9-bits, then when the compression algorithm detects that the value of the next highest dictionary entry reaches 512, it begins writing and so on. Otherwise, without knowing how many bits to write for each symbol, the data could not be successfully read back from the data storage since the algorithm would not know where, in the bit stream, one compressed value started and the previous compressed value ended.

In comparison, when the input stream comprises random data, there are too many values written to storage that are below 256 in an area of data storage where 10 or more bits are needed to write and read. For example, in the depicted representative output on the right of FIG. 19, the bits are used to read values 2, 61, 32, 9, 47, and 12 after the first 511 values are read, all of which are less than 512 and therefore would not require 10 bits to be read. As a result, too many uncompressed bytes consisting of 8-bits in the input stream are written as 10-bits or more in the "compressed" output stream, thereby using more bits than required for the uncompressed values. This is a waste of space and translates to poor compression caused by the random data, which has the knock-on effect by writing too many uncompressed values with many more bits than ideal.

According to various embodiments, it is quickly determined when the data of each of the input streams does not have repeated patterns (e.g., when it is random data) and therefore is not going to compress well. To make this determination, the interposer circuit 120 applies a window of n bytes (e.g., n=500) to the input stream being compressed and counts the number of clock-cycles of a clock in which there is no output in the corresponding compressed stream. There is no output for a clock-cycle when the interposer circuit 120 has observed a previously-observed sequence in the current data of the input stream, which is a multi-symbol sequence, and is building a longer sequence to output as one new value representing the multi-symbol sequence in the output compressed stream. The lack of output during a clock-cycle where compression is active is the NoOp function, discussed above. At the end of the window, the interposer circuit 120 determines the ratio of NoOps in the window relative to the number of bytes/clocks n in the window (NoOps/n). When the NoOp ratio is less than a predetermined ratio threshold, it means that the data in the input stream is not compressing well. The predetermined threshold of the ratio may be in a range between about 0.05 and about 0.20, for example. When the ratio is less than the predetermined ratio threshold, the compression of the input stream is stopped altogether, and transmission of the input stream continues uncompressed. When the ratio is higher than the predetermined ratio threshold, it means that the data is compressing well, and the compression of the input stream continues.

According to a representative embodiment, a method is provided for compressing wide word data in real time. The method includes dividing a serial stream into multiple input streams corresponding to multiple wide words in the serial stream, where each input stream includes a predetermined number of symbols; transmitting the input streams through an interposer circuit including a capture buffer; performing parallel compression on the input streams transmitted through the interposer circuit to obtain corresponding multiple compressed streams and storing the compressed streams in the capture buffer, where one or more compressed streams of the multiple compressed streams include NoOp entries, created as a by-product of the compression, indicating repetition of corresponding bytes; identifying a number of the NoOp entries occurring in a predetermined number of bytes of each input stream of the input streams while performing the parallel compression of the predetermined number of bytes; determining a ratio of the number of the NoOp entries to the predetermined number of bytes; when the ratio exceeds a predetermined ratio threshold, continuing the performing of the parallel compression on the input streams and the storing of the compressed streams; and when the ratio does not exceed the predetermined ratio threshold, which indicates that the number of NoOp entries is too small for the parallel compression to be efficient, stopping the performing of the parallel compression on the multiple input streams and/or the storing of the compressed streams, and continuing to transmit the input streams through the interposer circuit to an output without the performing of the parallel compression so when the data is stored only the original 8-bits are used.

According to another representative embodiment, a non-transitory computer readable medium stores instructions for providing decompressed wide word data compressed in parallel. When executed by at least one processor, the instructions cause the at least one processor to divide a serial stream into multiple input streams corresponding to multiple wide words in the serial stream, where each input stream includes a predetermined number of symbols; control transmission of the input streams through an interposer circuit including a capture buffer; perform parallel compression on the input streams to obtain corresponding multiple compressed streams, and store the compressed streams in the capture buffer, where one or more compressed streams of the multiple compressed streams includes NoOp entries indicating repetition of corresponding bytes; identify a number of the NoOp entries occurring in a predetermined number of bytes of each input stream of the multiple input streams while performing the parallel compression of the predetermined number of bytes; determine a ratio of the number of the NoOp entries to the predetermined number of bytes; when the ratio exceeds a predetermined ratio threshold, continuing to perform the parallel compression on the multiple input streams and to store of the compressed streams; and when the ratio does not exceed the predetermined ratio threshold, stopping the parallel compression performed on the multiple input streams and/or the storing of the compressed streams, and continuing to control the transmission of the multiple input streams through the interposer circuit without the performing of the parallel compression.

According to another representative embodiment, a system provides decompressed wide word data compressed in parallel. The system includes a user interface (UI) computer configured to run analyzer software for analyzing a serial stream of data in a high-speed, layered packet-based protocol from a device under test (DUT) to a host computer via a high-speed data link according to the high-speed, layered packet-based protocol; and an interposer circuit connected to the high-speed data link for monitoring the data transmitted between the DUT and the host computer. The interposer circuit includes a capture buffer for storing the data transmitted between the DUT and the host computer, and accessible by the UI computer for analysis using the analyzer software. The interposer circuit further includes at least one processing unit programmed to divide a serial stream of the transmitted data into multiple input streams corresponding to multiple wide words in the serial stream, where each input stream includes a predetermined number of symbols; perform parallel compression on the multiple input streams to obtain corresponding multiple compressed streams, and store the compressed streams in the capture buffer, where one or more compressed streams of the multiple compressed streams include NoOp entries indicating repetition of corresponding bytes; identify a number of the NoOp entries occurring in a predetermined number of bytes of each input stream of the multiple input streams while performing the parallel compression of the predetermined number of bytes; determine a ratio of the number of the NoOp entries to the predetermined number of bytes; when the ratio exceeds a predetermined ratio threshold, continuing to perform the parallel compression on the multiple input streams and to store of the compressed streams; and when the ratio does not exceed the predetermined ratio threshold, stopping the parallel compression performed on the multiple input streams and/or the storing of the compressed streams, where the data continues to be transmitted between the DUT and the host computer without the parallel compression.

Figure 20:
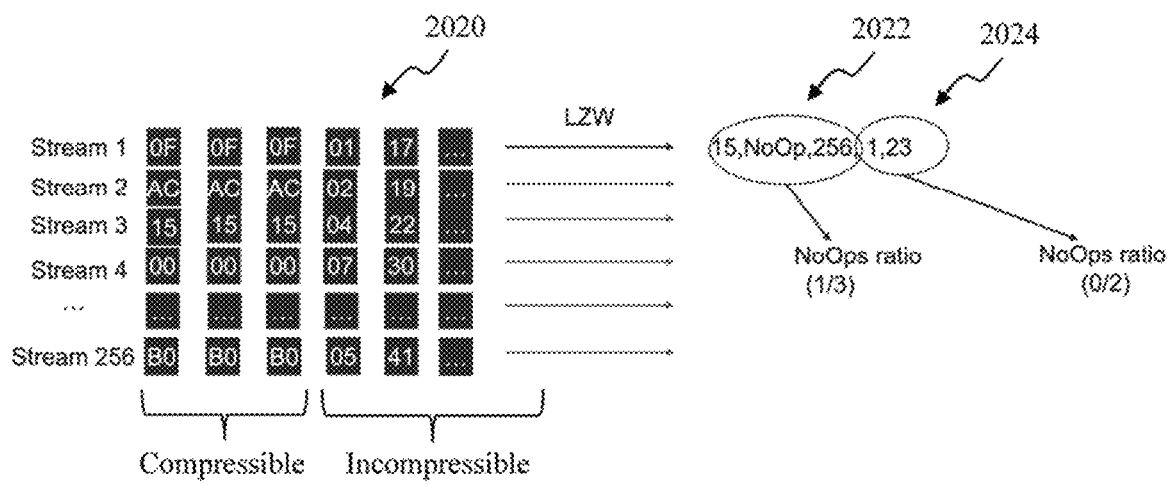
FIG. 20 shows an example of symbols of wide word data organized for parallel data compression with compression efficiency, according to a representative embodiment.

FIG. 20 shows an example of symbols of wide word data organized for parallel data compression with compression efficiency, according to a representative embodiment.

Referring to FIG. 20, wide word 2020 includes 256 input streams arranged in parallel input streams for performing parallel compression, as discussed above with reference to FIGS. 6, 13A and 15A, for example. In the depicted example, the original serial stream is "0FAC1500 . . . B00FAC1500 . . . B00FAC1500 . . . B001020407 . . . 0517192230 . . . ", and the bytes of the original serial stream have been divided into the 256 input streams. It is assumed that the first three bytes of each input stream include compressible data, such as non-random configuration data and headers. It is further assumed that the bytes following the third byte in each input stream include incompressible data, such as random payload data, e.g., in the transaction layer packets (TLP). The compression algorithm may be the LZW compression algorithm, for example, or other compression algorithm derived from the LZ78 compression algorithm, for example.

The point at which the input data becomes incompressible is not known ahead of time. Therefore, to determine where the data becomes incompressible, compression is performed and its performance is analyzed in real time to determine when the input data on each input stream has stopped compressing as a practical matter. More particularly, since successful compression of the input streams results in NoOp entries representing repeated bytes in the corresponding compressed output streams, e.g., using a variant of LZW, the success of the compression may be determined by counting the number of NoOp entries relative to a predetermined number of bytes in the compressed output streams, as discussed below.

FIG. 20 shows the process of determining the success of compression for the illustrative first input stream only. The first three bytes of the first input stream are the same hex value 0F (i.e., decimal 15). The first appearance of hex value 0F is transformed to decimal 15 in a first clock cycle in the first (compressed) output stream, since it is the first time this byte has been seen in the first input stream. In the next clock-cycle, the algorithm finds another hex value 0F, which is a previously seen value, and tries to build the longest possible subsequence, so a NoOp entry is entered in the first output stream. In the next clock-cycle, the algorithm finds another hex value 0F, and outputs the next output value of 256 in the first output stream, which represents the two original bytes 0F0F. This results in a string of 15, NoOp, 256 in the compressed portion 2022 of the first output stream. The next two bytes, 1 and 17, read in the next two clock cycles, however, are seen for the first time, so the output values are simply the uncompressed equivalents of the original input values. This results in a string of decimal 1 (i.e., from hex 1) and decimal 23 (i.e., from hex 17) in the uncompressed portion 2024 of the first output stream.

In this simplified example, the first three output values of the first output stream have a high NoOps ratio of 0.33 since there is one NoOp in the three output entries. The next two output values have a low NoOps ratio of zero when the "random data" of the payload appears and no NoOp entries are generated. Notably, this example is just for explanation purposes. In actuality, having only two values to determine when the data is random and incompressible is too few to be accurate, or useful. Therefore, according to various embodiment, a window of n bytes (e.g., discrete window) is applied to determine the NoOp ratios, where n is a predetermined value. Empirically, n=500 has yielded good results in determining whether the input data will compress well, although other values of n may be incorporated without departing from the scope of the present teachings.

The ratio of the number of NoOp entries over the number n of bytes per window is compared to a predetermined ratio threshold to determine whether or not the data of the input stream is random and therefore will not compress well. The predetermined ratio threshold of the ratio may be in a range between about 0.05 and about 0.20, for example. More particularly, a predetermined ratio threshold of the ratio may be about 0.10, for example, to provide a good indication of when the data is random. Of course, other predetermined ratio thresholds may be applied without departing from the scope of the present teachings.

The size of the window should be small enough with regard to the data to quickly identify when the input stream becomes incompressible, but not so small that its application gives unreliable results. For example, in the depicted example of FIG. 20, a discrete window of n=3 bytes would immediately indicate when the data becomes incompressible, but does not give an accurate reflection of the nature of the data as to whether or not it is random. Too large of a discrete window would result in a delay in identifying when the data becomes incompressible. For example, if n=5, the NoOps ratio would have been 1/5=0.2, which would have passed the compressibility test even though the flow of random data has already started.

In an embodiment, the window may be a discrete window of n bytes. At the end of the discrete window, the discrete window is shifted to cover the next set of n bytes. In an alternative embodiment, the window may be a sliding window of n bytes, which slides by one byte each time the end of the sliding window is reached. In this case, a temporary buffer is used to form the sliding window, where the temporary buffer holds the n bytes of the capture buffer, where the n bytes of compressed content are the sliding window. The number of NoOps is counted across the current window's contents. The temporary buffer may be a first-in first-out (FIFO) buffer, for example, where the current compressed value is stored (pushed at the head) and the n+1th compressed value is backwards removed (popped from the tail). In another embodiment, the ratio is simply checked every n bytes without using a window.

Figure 21:
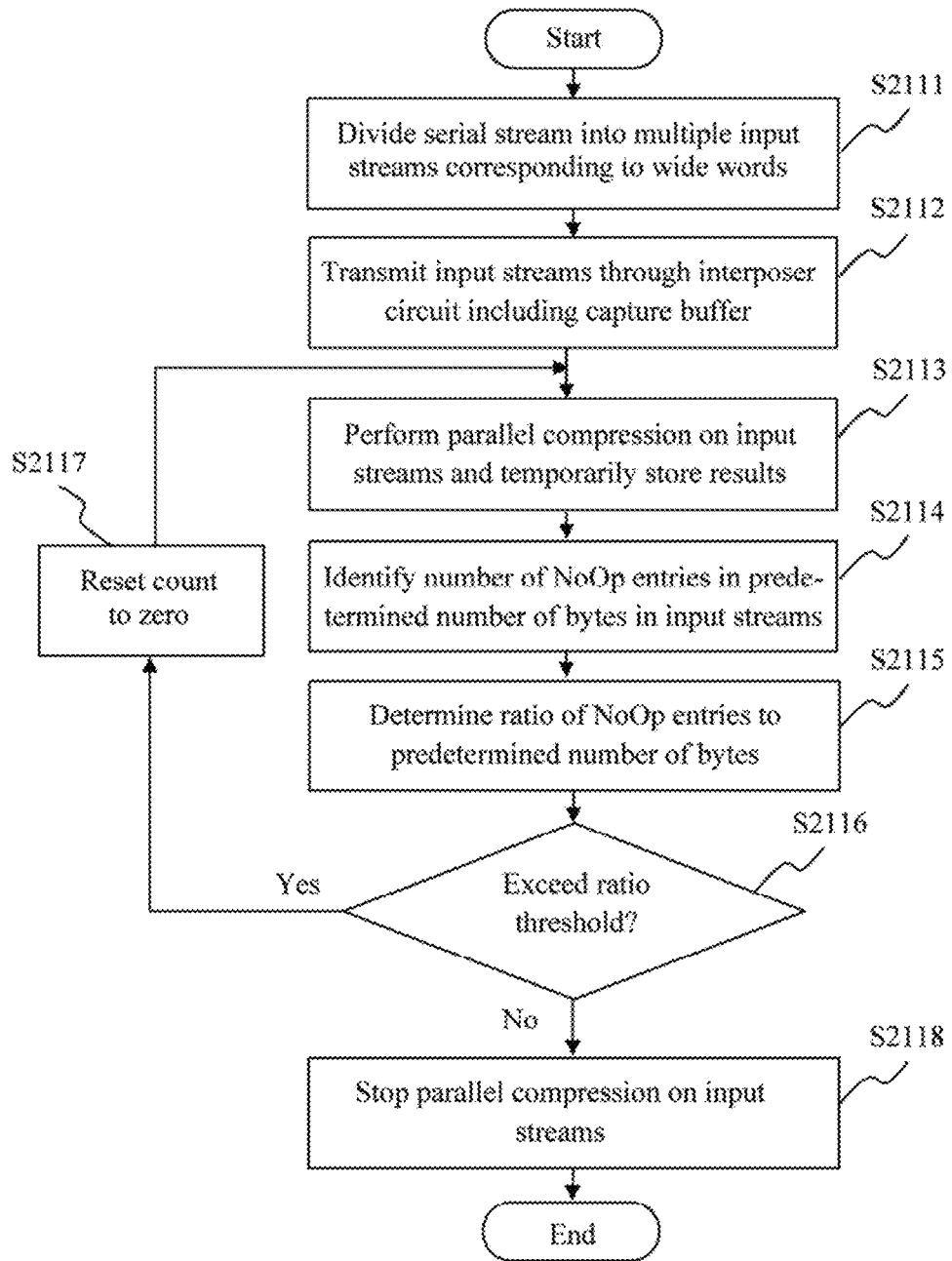
FIG. 21 is a flow diagram of a method for improving compression of wide word data in real time, according to a representative environment.

FIG. 21 is a flow diagram of a method for improving compression of wide word data in real time, according to a representative environment. The method may reduce the amount of data stored in a capture buffer of an interposer circuit during communication of the data over a data link according to a high-speed, layered packet-based protocol, without loss of functionality and without loss of available information for the analysis. The method further may stop compression in real time whenever the compression process is no longer efficient, in terms of storage, continuing the transfer of input streams without compression. The various steps in FIG. 21 may be performed by the interposer circuit 120 and/or the UI computer 110, discussed above.

Referring to FIG. 21, a serial stream of data to be compressed is divided into multiple input streams corresponding to multiple wide words in the serial stream in block S2111. Each input stream includes a predetermined number of symbols. Further, each input stream may include compressible (non-random) data and incompressible (random) data, as discussed above.

In block S2112, the input streams are transmitted through an interposer circuit including a capture buffer. The input streams are being transmitted from the DUT 140 to the UI computer 110 and/or the host computer 150, for example.

In block S2113, parallel compression is performed on the input streams transmitted through the interposer circuit to obtain corresponding compressed streams, and the compressed streams are stored in the capture buffer. Following the parallel compression, one or more compressed output streams corresponding to the input streams generates NoOp entries, which indicate repetition of bytes in the respective input streams. The compression is controlled using a clock having a predetermined clock cycle, where a compression determination is made for each input symbol of the input stream each clock cycle. Notably, when a current byte is a repeat of a previous consecutive byte in the input stream, there is no output with the corresponding clock cycle, indicating no operation (NoOp entry) that clock cycle.

In block S2114, the number of the NoOp entries is identified occurring in a predetermined number of bytes (n) of each input stream of the multiple input streams while performing the parallel compression of the predetermined number of bytes. The number of NoOp entries occurring in the predetermined number of bytes may be identified by counting the number of clock cycles in which compression output is skipped (i.e., a NoOp) while performing the parallel compression. The number clock cycles skipping the compression output is equal to the number of NoOp entries. In an embodiment, the number of clock cycles skipping the compression output may be counted using a counter.

In an embodiment, the number of the NoOp entries is identified by applying a window to the input streams, where the size of the window is equal to the predetermined number of bytes (n). That is, a window of n bytes is applied, the number of NoOp entries within the window is identified, and the window of n bytes is moved to the next set of n bytes.

In block S2115, a ratio of the number of the NoOp entries to the predetermined number of bytes is determined for each input stream. That is, the ratio=NoOp entries/n, where n is the number of bytes in a window in which the ratio is determined. Notably, as discussed above, NoOp entries are temporality generated due to the nature of the compression algorithm to indicate repetition, and are not stored in the capture buffer. Therefore, NoOp entries effectively appear as a by-product of the compression algorithm, but are used to identify the presence of random data according to the representative embodiment.

In block S2116, it is determined whether the ratio exceeds a predetermined ratio threshold. In an embodiment, this determination is made for each input stream. In an alternative embodiment, the determination of whether the ratio exceeds the predetermined ratio threshold is made for all parallel input streams, for example, using one of the input steams as a primary compressor, which informs the compressors of the other input streams. For example, the predetermined ratio threshold may be in a range between about 0.05 and about 0.20, as discussed above. When the ratio exceeds the predetermined ratio threshold (block S2116: Yes), indicating compressible (non-random) data in the input streams, the parallel compression and storage of compressed data continues for the next predetermined number of bytes (n) in the input streams. This is indicated by resetting the count to zero in block S2117, and restarting the count as block S2113 where parallel compression continues on the next predetermined number of bytes (n) in the input streams.

When the ratio does not exceed the predetermined ratio threshold (block S2116: No), indicating incompressible (random) data, the parallel compression and storage of the input streams stops. The transmission of the input streams through the interposer circuit may then continue in block S2118 without the performing of the parallel compression. That is, the data transmission continues in clear code as opposed to compressed code. As discussed above, when the ratio does not exceed the predetermined ratio threshold, it indicates that the number of NoOp entries is too small for the parallel compression to be efficient. When the ratio is determined for each input stream, the compression of the input streams may be stopped individually. When the ratio is determined for all input streams using one input stream as the primary compressor, the primary compressor would flag the data that had become incompressible to the other input streams. In an embodiment, the ratio continues to be determined for the input streams, such that compression, or storage, may be restarted when the ratio once again becomes favorable.

There are a number of advantages to the embodiments discussed above. First, they are easy to implement. Only a counter is needed to count how many times a clock-cycle skips an output (i.e., NoOps). The counter is checked every certain number of clock cycles (e.g., in the discrete window) to determine whether or not the data is random. The rate of NoOps measured against time is a proxy measure for the rate of compression. Furthermore, when the data is not random, the regular LZW algorithm continues without change, still running in real-time.

Second, the embodiments provide an upper limit of unsuccessfully compressed bytes to n x wide words, where n is a number of bytes in a window, e.g., n=500. For example, with a wide word of 256, there are at most 128 Kb of unsuccessfully compressed bytes written to the capture buffer, which usually represents much less than 1 percent of the total data in the input data stream. Once random data is encountered, the compressing is stopped as soon as possible before the output files of the corresponding compressed data stream grow larger than the corresponding input files, thereby preventing the output of the compression process from being larger than the input to the compression process.

Third, an input data stream may start off with non-random data that can be successfully compressed before transitioning to random data. This happens, for example, when a link is initially in start-up mode before transitioning to data transfer, in which any random data of the payload is transmitted. The window ensures that even in these circumstances, the random data payload is recognized, even when it appears later in a data stream, when it eventually becomes the dominant traffic type in an operational link.

All of the foregoing embodiments improve the functioning of a computer, and otherwise improve technology with regard to the functioning of a computer and/or other processing devices, such as UI computer 110 and interposer circuit 120. The parallel compression and decompression techniques described herein, in particular, provide data from the interposer circuit 120 to the UI computer 110 at high bandwidths very quickly, enabling real time processing and analysis of all data by the UI computer 110 and/or the protocol analyzer hosted by the UI computer 110. Also, the parallel compression and decompression techniques described herein require very little memory to execute since the locations of data are tracked primarily based on the reordering of compressed codes in the compressed streams. In addition, the parallel compression and decompression techniques see the code and perform the compression and/or decompression in real time, i.e., without having to go back. The compression also may be monitored and discontinued when it does not provide efficient results due to the nature of the data being compressed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The invention claimed is:

1. A method of providing decompressed wide word data, comprising:
    dividing a serial stream to be compressed into a plurality of input streams corresponding to a plurality of wide words in the serial stream, wherein each input stream comprises a predetermined number of symbols;
    performing parallel compression on the plurality of input streams to obtain a corresponding plurality of compressed streams, wherein each compressed stream of the plurality of compressed streams comprises a plurality of compressed codes having a least one character code, and wherein at least one compressed stream of the plurality of compressed streams comprises at least one multi-symbol string having multiple character codes and at least one NoOp entry corresponding to the at least one multi-symbol string;
    reordering the at least one compressed stream of the plurality of compressed streams having the at least one multi-symbol string and the at least one NoOp entry by removing the at least one NoOp entry and shifting any compressed codes of the plurality of compressed codes that follow the removed at least one NoOp entry toward a location of the removed at least one NoOp entry;
    forming a gap-free compressed output stream by iteratively inputting the plurality of compressed codes from the plurality of reordered compressed streams;
    performing decompression of the compressed output stream by iteratively decoding the plurality of compressed codes from the compressed output stream to retrieve corresponding character codes, reversing an order of the character codes retrieved from the at least one multi-symbol string, and forming a decompressed stream from the retrieved character codes; and outputting the decompressed stream.

2. The method of claim 1, wherein each compressed code of the plurality of compressed codes comprises the at least one character code and at least one reverse-pointer.

3. The method of claim 2, wherein the at least one reverse-pointer of each compressed code points to a NULL entry or to another compressed code of the plurality of compressed codes.

4. The method of claim 3, wherein in the multi-symbol string, a reverse-pointer that points to the NULL entry indicates a start of the multi-symbol string.

5. The method of claim 2, wherein performing decompression of the compressed output stream comprises:
(a) for each compressed code at a current address (adr) in the compressed output stream:
(i) identifying a corresponding reordered compressed stream in which the compressed code was included,
(ii) performing decoding of the compressed code following the at least one reverse-pointer until reaching a NULL entry to obtain the at least one character code,
(iii) determining a length (L) based on the decoding,
(iv) determining a decompressed value (dc) based on the length (L) indicating a cumulative number of decompressed symbols from a same input stream of the plurality of input streams,
(v) determining the address of a next compressed code in the corresponding reordered compressed stream based on the current address, the length (L), and a number (w) of the wide words in the serial stream, and
(vi) setting the current address to the determined next address in the compressed output stream for a next iteration; and
(b) forming the decompressed stream by inputting the at least one character code from each compressed code to an address in the decompressed stream corresponding to the current address of the compressed code, wherein inputting the at least one character code includes reversing the order of the character codes in the at least one multi-symbol string from the at least one compressed stream.

6. The method of claim 5, wherein performing decompression of the compressed output stream further comprises:
for each compressed code at the current address (adr) in the compressed output stream, determining when the decompressed value (dc) equals a total number of decompressed symbols from the same input stream, and
stopping the decompression for that same input stream.

7. The method of claim 1, wherein the parallel compression is performed on the plurality of input streams using an ASCII table.

8. The method of claim 1, further comprising storing the plurality of compressed streams and the reordered at least one compressed stream in a buffer, wherein the gap-free compressed output stream is formed using the buffer.

9. A non-transitory computer readable medium storing instructions for providing decompressed wide word data compressed in parallel, wherein when executed by at least one processor, the instructions cause the at least one processor to:
divide a serial stream to be compressed into a plurality of input streams corresponding to a plurality of wide words in the serial stream, wherein each input stream comprises a predetermined number of symbols;
perform parallel compression on the plurality of input streams to obtain a corresponding plurality of compressed streams, wherein each compressed stream of the plurality of compressed streams comprises a plurality of compressed codes having a least one character code, and wherein at least one compressed stream of the plurality of compressed streams comprises at least one multi-symbol string having multiple character codes and at least one NoOp entry corresponding to the at least one multi-symbol string;
reorder the at least one compressed stream of the plurality of compressed streams having the at least one multi-symbol string and the at least one NoOp entry by removing the at least one NoOp entry and shifting any compressed codes of the plurality of compressed codes that follow the removed at least one NoOp entry toward a location of the removed at least one NoOp entry;
form a gap-free compressed output stream by iteratively inputting the plurality of compressed codes from the plurality of reordered compressed streams;
perform decompression of the compressed output stream by iteratively decoding the plurality of compressed codes from the compressed output stream to retrieve corresponding character codes, reversing an order of the character codes retrieved from the at least one multi-symbol string, and forming a decompressed stream from the retrieved character codes; and
output the decompressed stream.

10. The non-transitory computer readable medium of claim 9, wherein each compressed code of the plurality of compressed codes comprises the at least one character code and at least one reverse-pointer.

11. The non-transitory computer readable medium of claim 10, wherein the at least one reverse-pointer of each compressed code points to a NULL entry or to another compressed code of the plurality of compressed codes.

12. The non-transitory computer readable medium of claim 11, wherein in the multi-symbol string, a reverse-pointer that points to the NULL entry indicates a start of the multi-symbol string.

13. The non-transitory computer readable medium of claim 10, wherein the instructions cause the at least one processor to perform decompression of the compressed output stream by:
(a) for each compressed code at a current address (adr) in the compressed output stream:
(i) identify a corresponding reordered compressed stream in which the compressed code was included,
(ii) perform decoding of the compressed code following the at least one reverse-pointer until reaching a NULL entry to obtain the at least one character code,
(iii) determine a length (L) based on the decoding,
(iv) determine the address of a next compressed code in the corresponding reordered compressed stream based on the current address, the length (L), and a number (w) of the wide words in the serial stream, and
(v) set the current address to the determined next address in the compressed output stream for a next iteration; and
(b) form the decompressed stream by inputting the at least one character code from each compressed code to an address in the decompressed stream corresponding to the current address of the compressed code, wherein inputting the at least one character code includes reversing the order of the character codes in the at least one multi-symbol string from the at least one compressed stream.

14. The non-transitory computer readable medium of claim 13, wherein the instructions further cause the at least one processor to perform decompression of the compressed output stream by:
for each compressed code at the current address (adr) in the compressed output stream:
determine a decompressed value (dc) based on the length (L) indicating a cumulative number of decompressed symbols from a same input stream of the plurality of input streams,
determine when the decompressed value (dc) equals a total number of decompressed symbols from the same input stream, and
stop the decompression for same input stream.

15. A system for providing decompressed wide word data compressed in parallel, the system comprising:
a user interface (UI) computer configured to run analyzer software for analyzing a serial stream of data in a high-speed, layered packet-based protocol from a device under test (DUT) to a host computer via a high-speed data link according to the high-speed, layered packet-based protocol; and
an interposer circuit connected to the high-speed data link for monitoring the data transmitted between the DUT and the host computer, the interposer circuit comprising a capture buffer for storing the data transmitted between the DUT and the host computer, and accessible by the UI computer for analysis using the analyzer software, wherein the interposer circuit comprises at least one processing unit programmed to:
divide the serial stream of data to be compressed into a plurality of input streams corresponding to a plurality of wide words in the serial stream, wherein each input stream comprises a predetermined number of symbols;
perform parallel compression on the plurality of input streams to obtain a corresponding plurality of compressed streams, wherein each compressed stream of the plurality of compressed streams comprises a plurality of compressed codes having a least one character code, and wherein at least one compressed stream of the plurality of compressed streams comprises at least one multi-symbol string having multiple character codes and at least one NoOp entry corresponding to the at least one multi-symbol string;
reorder the at least one compressed stream of the plurality of compressed streams having the at least one multi-symbol string and the at least one NoOp entry by removing the at least one NoOp entry and shifting any compressed codes of the plurality of compressed codes that follow the removed at least one NoOp entry toward a location of the removed at least one NoOp entry;
form a gap-free compressed output stream by iteratively inputting the plurality of compressed codes from the plurality of reordered compressed streams;
perform decompression of the compressed output stream by iteratively decoding the plurality of compressed codes from the compressed output stream to retrieve corresponding character codes, reversing an order of the character codes retrieved from the at least one multi-symbol string, and forming a decompressed stream from the retrieved character codes; and
output the decompressed stream.

16. The system of claim 15, wherein each compressed code of the plurality of compressed codes comprises the at least one character code and at least one reverse-pointer.

17. The system of claim 16, wherein the at least one reverse-pointer of each compressed code points to a NULL entry or to another compressed code of the plurality of compressed codes.

18. The system of claim 16, wherein the at least one processing unit is programmed to perform decompression of the compressed output stream by:
(a) for each compressed code at a current address (adr) in the compressed output stream:
(i) identify a corresponding reordered compressed stream in which the compressed code was included,
(ii) perform decoding of the compressed code following the at least one reverse-pointer until reaching a NULL entry to obtain the at least one character code,
(iii) determine a length (L) based on the decoding,
(iv) determine the address of a next compressed code in the corresponding reordered compressed stream based on the current address, the length (L), and a number (w) of the wide words in the serial stream, and
(v) set the current address to the determined next address in the compressed output stream for a next iteration; and
(b) form the decompressed stream by inputting the at least one character code from each compressed code to an address in the decompressed stream corresponding to the current address of the compressed code, wherein inputting the at least one character code includes reversing the order of the character codes in the at least one multi-symbol string from the at least one compressed stream.

19. The system of claim 18, wherein the at least one processing unit is further programmed to perform decompression of the compressed output stream by:
for each compressed code at the current address (adr) in the compressed output stream:
determine a decompressed value (dc) based on the length (L) indicating a cumulative number of decompressed symbols from a same input stream of the plurality of input streams,
determine when the decompressed value (dc) equals a total number of decompressed symbols from the same input stream, and
stop the decompression for same input stream.

20. The system of claim 15, further comprising storing the plurality of compressed streams and the reordered at least one compressed stream in a buffer, wherein the gap-free compressed output stream is formed using the buffer.

* * * * *